United States Patent
Xu et al.

(10) Patent No.: US 12,178,102 B2
(45) Date of Patent: Dec. 24, 2024

(54) DISPLAY PANEL AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Chen Xu, Beijing (CN); Yong Qiao, Beijing (CN); Xinyin Wu, Beijing (CN); Yongda Ma, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 655 days.

(21) Appl. No.: 17/437,142

(22) PCT Filed: May 18, 2021

(86) PCT No.: PCT/CN2021/094326
§ 371 (c)(1),
(2) Date: Sep. 8, 2021

(87) PCT Pub. No.: WO2021/233280
PCT Pub. Date: Nov. 25, 2021

(65) Prior Publication Data
US 2023/0180563 A1  Jun. 8, 2023

(30) Foreign Application Priority Data
May 21, 2020 (CN) .......................... 202010435328.1

(51) Int. Cl.
*H10K 59/179* (2023.01)
*H10K 102/00* (2023.01)

(52) U.S. Cl.
CPC ... *H10K 59/1795* (2023.02); *H10K 2102/311* (2023.02)

(58) Field of Classification Search
CPC .................................................. H10K 59/1795
See application file for complete search history.

(56) References Cited

U.S. PATENT DOCUMENTS

| 10,394,098 B2 | 8/2019 | Wang |
| 2005/0056837 A1 | 3/2005 | Ohtani et al. |

(Continued)

FOREIGN PATENT DOCUMENTS

| CN | 106887424 A | 6/2017 |
| CN | 109742121 A | 5/2019 |

(Continued)

OTHER PUBLICATIONS

Extended European Search Report from European Patent Application No. 21798254.5 dated Feb. 13, 2023.

*Primary Examiner* — Douglas M Menz
(74) *Attorney, Agent, or Firm* — Dilworth & Barrese, LLP.; Michael J. Musella, Esq.

(57) ABSTRACT

A display panel and a display device are provided. The display panel includes a base substrate and a conductive member, wherein the conductive member is located on the base substrate and includes a first conductive sub-layer, a second conductive sub-layer and a third conductive sub-layer stacked in sequence; the first conductive sub-layer is closer to the base substrate than the third conductive sub-layer; a conductivity of the first conductive sub-layer is smaller than that of the second conductive sub-layer, and a melting point of the third conductive sub-layer is larger than that of the second conductive sub-layer; the second conductive sub-layer includes a first surface close to the first conductive sub-layer and a second surface close to the third conductive sub-layer, the first surface and the second surface are oppositely arranged; the third conductive sub-layer protrudes from the second surface along a width direction of the conductive member.

20 Claims, 27 Drawing Sheets

(56) References Cited

U.S. PATENT DOCUMENTS

| | | | |
|---|---|---|---|
| 2009/0173743 A1 | 7/2009 | Yu et al. | |
| 2013/0207111 A1 | 8/2013 | Yamazaki | |
| 2017/0317156 A1* | 11/2017 | Kim | G09G 3/3233 |
| 2017/0345365 A1 | 11/2017 | Li | |
| 2018/0120997 A1 | 5/2018 | Moon et al. | |
| 2019/0171318 A1 | 6/2019 | Ryu et al. | |
| 2021/0066559 A1 | 3/2021 | Zhang | |
| 2021/0266154 A1 | 7/2021 | Ban et al. | |
| 2021/0288282 A1* | 9/2021 | Kim | G06F 1/1643 |

FOREIGN PATENT DOCUMENTS

| | | |
|---|---|---|
| CN | 110462830 A | 11/2019 |
| CN | 110518020 A | 11/2019 |
| CN | 111341826 A | 6/2020 |
| EP | 3480853 A1 | 5/2019 |
| JP | 2015-50374 A | 3/2015 |

\* cited by examiner

DISPLAY PANEL AND DISPLAY DEVICE

CROSS-REFERENCE OF RELATED APPLICATIONS

This patent application claims priority of Chinese patent application No. 202010435328.1 filed on May 21, 2020, and the contents disclosed in the above Chinese patent application are incorporated herein by reference as a part of the present application.

TECHNICAL FIELD

At least one embodiment of the present disclosure relates to a display panel and a display device.

BACKGROUND

The growing development of display devices such as Liquid Crystal Display (LCD) devices, Active Matrix Organic Light-Emitting Diode (AMOLED) devices and Micro-LED devices has greatly enriched people's lives, and consumers are pursuing higher and higher display quality. For example, display panels with higher resolution (8K), higher refresh frequency (90 HZ, 120 HZ) and more product forms (folding form and curling form) have been developed. With the improvement of the display quality, the manufacturing process of display panels has also brought new challenges.

SUMMARY

At least one embodiment of the present disclosure relates to a display panel and a display device.

At least one embodiment of the present disclosure provides a display panel, including: a display area having a plurality of pixel units; a peripheral area located at at least one side of the display area; a barrier layer located on a base substrate; a conductive member arranged at one side of the barrier layer facing away from the base substrate; a length of the conductive member in an extending direction of the conductive member being larger than a width of the conductive member in a direction intersecting with the extending direction; the conductive member including a first conductive sub-layer, a second conductive sub-layer and a third conductive sub-layer stacked in sequence; the first conductive sub-layer being closer to the base substrate than the third conductive sub-layer; and a first conductive part located in the display area, the first conductive part and the conductive member being arranged in a same layer and made of a same material, wherein a conductivity of the first conductive sub-layer is smaller than that of the second conductive sub-layer, a thickness of the first conductive sub-layer is smaller than that of the second conductive sub-layer, and a melting point of the third conductive sub-layer is larger than that of the second conductive sub-layer, and wherein the second conductive sub-layer includes a first surface close to the first conductive sub-layer and a second surface close to the third conductive sub-layer; the first surface and the second surface are arranged opposite to each other; the third conductive sub-layer protrudes from the second surface along a width direction of the conductive member; and the width direction intersects with the extending direction of the conductive member.

According to the display panel provided by one or more embodiment of the present disclosure, the third conductive sub-layer is not in contact with the first conductive sub-layer.

According to the display panel provided by one or more embodiment of the present disclosure, the second conductive sub-layer further includes a side surface connecting a side edge of the first surface and a side edge of the second surface located at a same side of the second conductive sub-layer; in a cross section taken along a direction perpendicular to the extending direction of the conductive member, an intersection point between the side surface and the first conductive sub-layer is a first intersection point, an intersection point between the side surface and the third conductive sub-layer is a second intersection point, and at least part of the side surface is located at one side of a connecting line between the first intersection point and the second intersection point close to the second conductive sub-layer.

According to the display panel provided by one or more embodiment of the present disclosure, the side surface includes at least two side sub-surfaces, which include a first side sub-surface close to the first conductive sub-layer and a second side sub-surface close to the third conductive sub-layer, and an angle formed by the first side sub-surface and the first conductive sub-layer is smaller than an angle formed by the second side sub-surface and the first conductive sub-layer.

According to the display panel provided by one or more embodiment of the present disclosure, in the cross section taken along the direction perpendicular to the extending direction of the conductive member, a distance from, an intersection point between an extension line of the second side sub-surface and the first conductive sub-layer, to, an intersection point between the first side sub-surface and the first conductive sub-layer, is d1; and a distance of the first conductive sub-layer extending beyond the first surface is $\Delta w1$, wherein $d1 < \Delta w1$.

According to the display panel provided by one or more embodiment of the present disclosure, a distance of the third conductive sub-layer extending beyond the second surface is $\Delta w2$, wherein $d1 < \Delta w2$.

According to the display panel provided by one or more embodiment of the present disclosure, the angle formed by the second side sub-surface and the first conductive sub-layer is larger than 90 degrees.

According to the display panel provided by one or more embodiment of the present disclosure, the side surface includes three side sub-surfaces arranged in sequence, including a first side sub-surface, a second side sub-surface and a third side sub-surface; the first side sub-surface is closer to the first conductive sub-layer than the third side sub-surface; an angle formed by the first side sub-surface and the first conductive sub-layer is a first angle; an angle formed by the second side sub-surface and the first conductive sub-layer is a second angle; an angle formed by the third side sub-surface and the first conductive sub-layer is a third angle; the third angle is larger than the second angle, and the second angle is larger than the first angle.

According to the display panel provided by one or more embodiment of the present disclosure, the second conductive sub-layer includes two side surfaces, which are arranged opposite to each other and are symmetrically arranged along a thickness direction of the conductive member.

According to the display panel provided by one or more embodiment of the present disclosure, at least one of the first surface, the second surface and the side surface of the second conductive sub-layer contains at least one of N element, S element, P element and Cl element.

According to the display panel provided by one or more embodiment of the present disclosure, the barrier layer has at least one of F element and Cl element.

According to the display panel provided by one or more embodiment of the present disclosure, a content of the at least one of the F element and the Cl element in the barrier layer is $1 \times 10^{18}$ atoms to $5 \times 10^{20}$ atoms per cubic centimeter.

According to the display panel provided by one or more embodiment of the present disclosure, the first surface is in contact with the first conductive sub-layer, and the second surface is in contact with the third conductive sub-layer.

According to the display panel provided by one or more embodiment of the present disclosure, the third conductive sub-layer covers the second conductive sub-layer and is in contact with the first conductive sub-layer.

According to the display panel provided by one or more embodiment of the present disclosure, a width of the first surface is smaller than that of the first conductive sub-layer, a width of the second surface is smaller than that of the third conductive sub-layer, and a width difference between the third conductive sub-layer and the second surface is larger than a thickness of the third conductive sub-layer.

According to the display panel provided by one or more embodiment of the present disclosure, two adjacent conductive members are provided, the two adjacent conductive members are insulated from each other and located in a same layer; the two adjacent conductive members include a first conductive member and a second conductive member; and a distance between the third conductive sub-layer of the first conductive member and the third conductive sub-layer of the second conductive member is smaller than a distance between the second surface of the second conductive sub-layer of the first conductive member and the second surface of the second conductive sub-layer of the second conductive member.

According to the display panel provided by one or more embodiment of the present disclosure, the second surface of the first conductive member and the second surface of the second conductive member have different distances at different positions.

According to the display panel provided by one or more embodiment of the present disclosure, w1 is a maximum width of the first conductive member in a cross section thereof along a width direction thereof, w2 is a maximum width of the second conductive member in a cross section thereof along a width direction thereof, $\Delta w11$ is a distance of the third conductive sub-layer in the first conductive member extending beyond the second surface, $\Delta w12$ is a distance of the third conductive sub-layer extending beyond the second surface in the second conductive member, dmin is a minimum distance between the first conductive member and the second conductive member; and a relational expression as below is satisfied:

$$\frac{\Delta w11}{w1} + \frac{\Delta w12}{w2} < \frac{\Delta w11 + \Delta w12}{d\min}.$$

According to the display panel provided by one or more embodiment of the present disclosure, two conductive members are provided, the two conductive members are insulated from each other and have different distances from the base substrate; the two conductive members include a first conductive member with a thickness of T3 and a second conductive member with a thickness of T4, wherein T4 is larger than T3; a distance of the third conductive sub-layer extending beyond the second surface in the first conductive member is $\Delta w3$, a distance of the third conductive sub-layer extending beyond the second surface in the second conductive member is $\Delta w4$; and a relational expression as below is satisfied:

$$\frac{\Delta w3}{T3} > \frac{\Delta w4}{T4}.$$

According to the display panel provided by one or more embodiment of the present disclosure, two conductive members are provided and are insulated from each other; the two conductive members include a first conductive member and a second conductive member, the first conductive member is closer to the display area than the second conductive member, and the third conductive sub-layer in the first conductive member protrudes from the second surface by a size larger than that of the third conductive sub-layer in the second conductive member.

According to the display panel provided by one or more embodiment of the present disclosure, the display panel further includes a second conductive part, wherein the second conductive part and the conductive member are arranged in different layers, the conductive member has a first end, the second conductive part has a second end, an insulating layer is arranged between the first end and the second end, the insulating layer has a first via hole exposing the first end or the second end, and the conductive member is connected with the second conductive part through the first via hole.

According to the display panel provided by one or more embodiment of the present disclosure, the display panel further includes a second conductive part, wherein the second conductive part and the conductive member are located in a same layer.

According to the display panel provided by one or more embodiment of the present disclosure, the display panel further includes a third conductive part, wherein the first conductive part is electrically connected to the third conductive part, the third conductive part has a third end, the first conductive part has a fourth end, an insulating layer is arranged between the third end and the fourth end, the insulating layer has a second via hole exposing the third end or the fourth end, and the first conductive part is connected with the third conductive part through the second via hole.

According to the display panel provided by one or more embodiment of the present disclosure, the conductive member includes a first part and a second part, a width of the first part is larger than that of the second part, the third conductive sub-layer of the first part protrudes from the second surface along a width direction of the conductive member, the third conductive sub-layer of the second part is flush with the second surface along the width direction of the conductive member, or the third conductive sub-layers of the first part and of the second part both protrude from the second surface along the width direction of the conductive member, and a protruded portion of the first part has a width larger than that of the second part.

According to the display panel provided by one or more embodiment of the present disclosure, the conductive member is electrically connected with the first conductive part, a plurality of first conductive parts is provided, a first interval is provided between adjacent conductive members and a second interval is provided between adjacent first conductive parts, the first interval is different from the second interval.

According to the display panel provided by one or more embodiment of the present disclosure, the first interval is smaller than the second interval.

According to the display panel provided by one or more embodiment of the present disclosure, a length of the conductive member is smaller than a length of the first conductive part, and the first conductive part includes a data line that supplies a data voltage to a pixel unit connected thereto.

According to the display panel provided by one or more embodiment of the present disclosure, each pixel unit includes a pixel circuit layer arranged on the barrier layer, an organic electroluminescent element electrically connected with the pixel circuit layer, and a touch electrode arranged at a light exiting side of the organic electroluminescent element; and the first conductive part is any one of the pixel circuit layer, the organic electroluminescent element and the touch electrode.

At least one embodiment of the present disclosure further provides a display panel, including: a display area having a plurality of pixel units, including a foldable area as well as a first display area and a second display area located at opposite sides of the foldable area; a peripheral area located at at least one side of the display area; a barrier layer located on a base substrate; a conductive member arranged at one side of the barrier layer facing away from the base substrate, a length of the conductive member in an extending direction of the conductive member being larger than a width of the conductive member in a direction intersecting with the extending direction; the conductive member including a first conductive sub-layer, a second conductive sub-layer and a third conductive sub-layer stacked in sequence; the first conductive sub-layer being closer to the base substrate than the third conductive sub-layer; and a first conductive part located in the display area, the first conductive part and the conductive member being arranged in a same layer and made of a same material, wherein a conductivity of the first conductive sub-layer is smaller than that of the second conductive sub-layer, a thickness of the first conductive sub-layer is smaller than that of the second conductive sub-layer, and a melting point of the third conductive sub-layer is larger than that of the second conductive sub-layer, wherein the second conductive sub-layer includes a first surface close to the first conductive sub-layer and a second surface close to the third conductive sub-layer, the first surface and the second surface are arranged opposite to each other, the third conductive sub-layer protrudes from the second surface along a width direction of the conductive member, and the width direction intersects with the extending direction of the conductive member.

According to the display panel provided by one or more embodiment of the present disclosure, two conductive members are provided and insulated from each other, the two conductive members include a first conductive member and a second conductive member, the first conductive member is closer to the foldable area than the second conductive member, and the third conductive sub-layer in the first conductive member protrudes from the second surface by a size larger than that of the third conductive sub-layer in the second conductive member.

At least one embodiment of the present disclosure further provides a display panel, including: a display area having a plurality of pixel units; a peripheral area located at at least one side of the display area; a transparent area, located at one side of the peripheral area away from the display area or surrounded by the display area; a barrier layer located on a base substrate; a conductive member arranged at one side of the barrier layer facing away from the base substrate, the length of the conductive member in its extending direction is larger than the width of the conductive member in the direction intersecting with the extending direction, and the conductive member includes a first conductive sub-layer, a second conductive sub-layer and a third conductive sub-layer stacked in sequence, wherein the first conductive sub-layer is closer to the base substrate than the third conductive sub-layer; and a first conductive part located in the display area, the first conductive part and the conductive member being arranged in a same layer and made of a same material, wherein a conductivity of the first conductive sub-layer is smaller than that of the second conductive sub-layer, a thickness of the first conductive sub-layer is smaller than that of the second conductive sub-layer, and a melting point of the third conductive sub-layer is larger than that of the second conductive sub-layer, and wherein the second conductive sub-layer includes a first surface close to the first conductive sub-layer and a second surface close to the third conductive sub-layer; the first surface and the second surface are arranged opposite to each other; the third conductive sub-layer protrudes from the second surface along a width direction of the conductive member; and the width direction intersects with the extending direction of the conductive member.

According to the display panel provided by one or more embodiment of the present disclosure, two conductive members are provided and insulated from each other, the two conductive members include a first conductive member and a second conductive member, the first conductive member is closer to the foldable area than the second conductive member, and the third conductive sub-layer in the first conductive member protrudes from the second surface by a size larger than that of the third conductive sub-layer in the second conductive member.

At least one embodiment of the present disclosure further provides a display device, including any of the display panels described above.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure without construing any limitation thereto.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With the improvement of display resolution of display devices, the load is increased and the signal delay is aggravated. Introducing low-resistance conductive structures is one of the solutions to solve the problem of signal delay, but the distance between low-resistance conductive structures decreases with the increase of the resolution, which is easy to result in defects such as electrostatic discharge and electrostatic breakdown caused by process craft and other reasons or by subsequent usage process.

Figure 1:
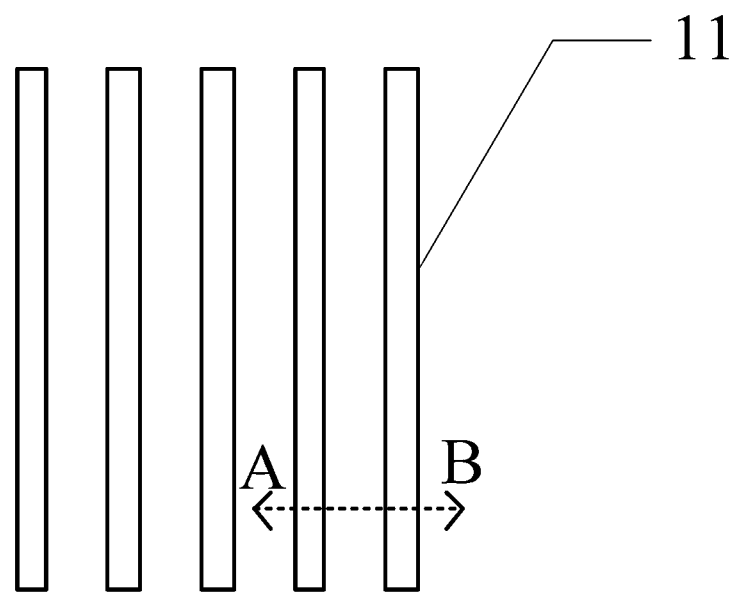
FIG. 1 is a schematic diagram of a plurality of conductive members in a display panel.

FIG. 1 is a schematic diagram of a plurality of conductive members in a display panel. As shown in FIG. 1, the distance between adjacent conductive members 11 is small, which is easy to cause electrostatic discharge and electrostatic breakdown. FIG. 1 only schematically shows four conductive members, and the number and arrangement of the conductive members are not limited to those shown in the figure. The conductive member 11 is located on a base substrate which is not shown in FIG. 1 but can be seen in FIG. 2.

Figure 2:
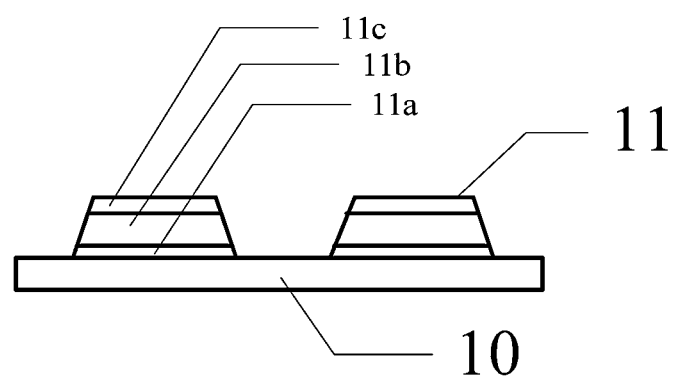
FIG. 2 is a sectional view taken along line A-B of FIG. 1.

FIG. 2 is a sectional view taken along line A-B of FIG. 1. As shown in FIG. 2, conductive members 11 are located on the base substrate 10, and each conductive member 11 includes a first conductive sub-layer 11a, a second conductive sub-layer 11b, and a third conductive sub-layer 11c. The cross section of each conductive member 11 may be a regular trapezoid, but is not limited thereto. When forming the conductive member 11, a first conductive film, a second conductive film and a third conductive film may be sequentially formed on the base substrate 10; and then the first conductive film, the second conductive film and the third conductive film are etched to form the conductive member 11 shown in FIG. 2. The conductive member 11 may be formed by dry etching or wet etching. As shown in FIG. 2, the distance between adjacent third conductive sub-layers 11c is larger than the distance between adjacent second conductive sub-layers 11b.

As shown in FIG. 2, the distance between two adjacent conductive members 11 is small, which is liable to cause defects such as electrostatic breakdown in the two adjacent conductive members 11 shown in FIG. 2.

Figure 3:
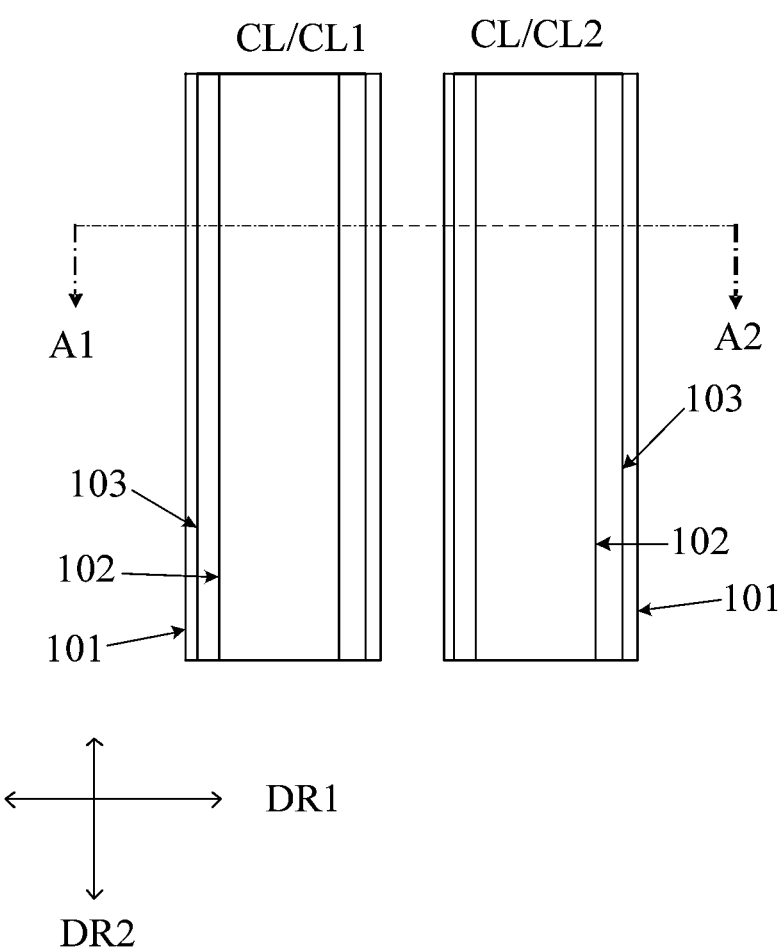
FIG. 3 is a plan view of a display panel according to an embodiment of the present disclosure.

FIG. 3 is a plan view of a display panel according to an embodiment of the present disclosure. As shown in FIG. 3, the display panel includes a base substrate 100 (not shown in FIG. 3, referring to FIG. 4) and a conductive member CL.

Figure 4:
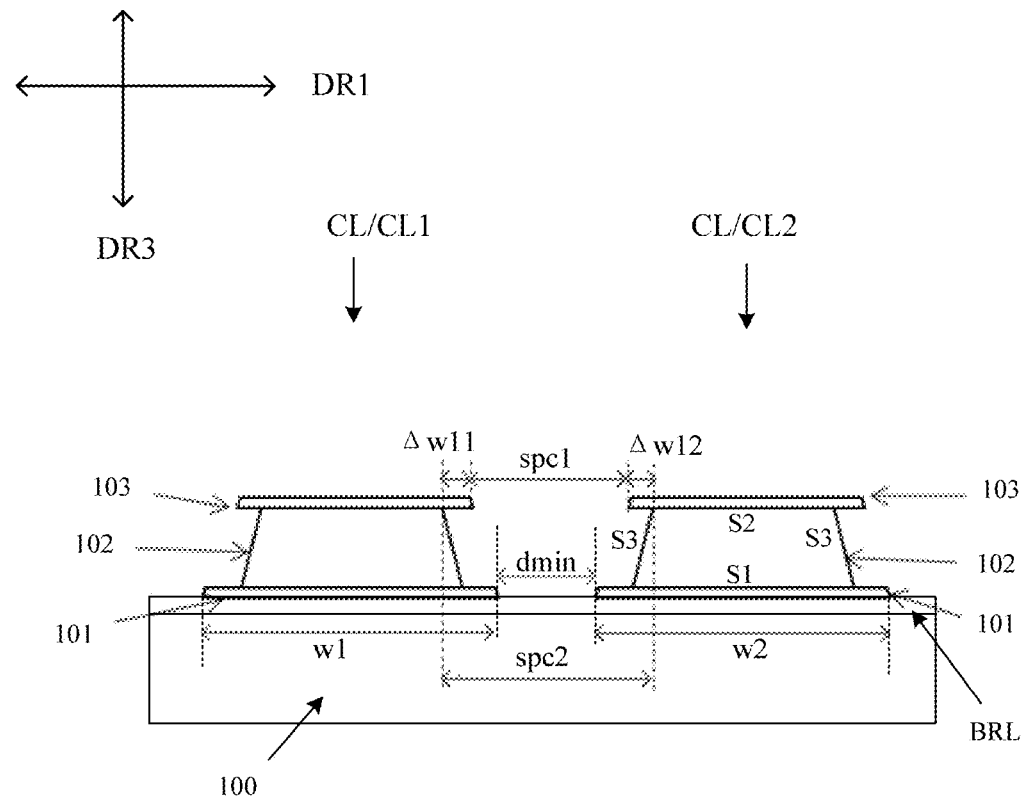
FIG. 4 is a sectional view taken along the line A1-A2 of FIG. 3.

FIG. 4 is a sectional view taken along the line A1-A2 of FIG. 3. Referring to FIGS. 3 and 4, a length of the conductive member CL in its extending direction is greater than a width of the conductive member CL in a direction intersecting with the extending direction. The direction intersecting with the extending direction may be the width direction of the conductive member CL. Referring to FIGS. 3 and 4, the conductive member CL includes a first conductive sub-layer 101, a second conductive sub-layer 102, and a third conductive sub-layer 103 which are stacked in sequence, and the first conductive sub-layer 101 is closer to the base substrate 100 than the third conductive sub-layer 103. For example, a conductivity of the first conductive sub-layer 101 is smaller than that of the second conductive sub-layer 102, and a melting point of the third conductive sub-layer 103 is larger than that of the second conductive sub-layer 102. For example, a conductivity of the third conductive sub-layer 103 is smaller than that of the second conductive sub-layer 102, and a melting point of the first conductive sub-layer 101 is larger than that of the second conductive sub-layer 102. FIG. 3 shows two adjacent conductive members CL. The base substrate 100 may be a rigid base substrate or a flexible base substrate. The rigid substrate includes a glass substrate, and a material of the flexible substrate includes polyimide, but is not limited thereto.

For example, the base substrate can be a flexible substrate or a glass substrate, and the flexible substrate can be a stacked layer made of one or more selected from the group consisting of polyimide (PI), polysilane, polysiloxane, polysilazane, polycarbosilane and polyacrylate.

For example, the first conductive sub-layer 101, the second conductive sub-layer 102 and the third conductive sub-layer 103 can all be made of metal materials or alloys. For example, at least one selected from the group consisting of molybdenum (Mo), titanium (Ti), neodymium (Nd), chromium (Cr) and nickel (Ni) can be used as the material of the first conductive sub-layer 101, at least one selected from the group consisting of aluminum (Al), copper (Cu) and silver (Ag) can be used as the material of the second conductive sub-layer 102, and at least one selected from the group consisting of Mo, Ti, Nd, Cr, Ni and tungsten (W) can be used as the material of the third conductive sub-layer 103, without limited thereto. For example, the first conductive sub-layer 101 and the third conductive sub-layer 10 may be made of the same material, but are not limited thereto. For example, the conductive member CL may adopt a structure in which three conductive sub-layers such as Mo/Al/Mo, Ti/Al/Ti, Mo/Cu/Mo and Ti/Cu/Ti are stacked.

For example, as shown in FIG. 4, the display panel further includes a barrier layer BRL located on the base substrate. The barrier layer BRL is provided between the conductive member CL and the base substrate 100. The barrier layer BRL may be formed of an inorganic insulating film, for example, a single layer of silicon nitride (SiNx), a single layer of silicon oxide (SiOx) or a plurality of layers including silicon nitride (SiNx) and silicon oxide (SiOx) stacked one on another. The barrier layer BRL can effectively cover impurities or particles on the base substrate and protect the conductive members. For example, the barrier layer BRL may adopt silicon oxide, but is not limited thereto.

Figure 14:
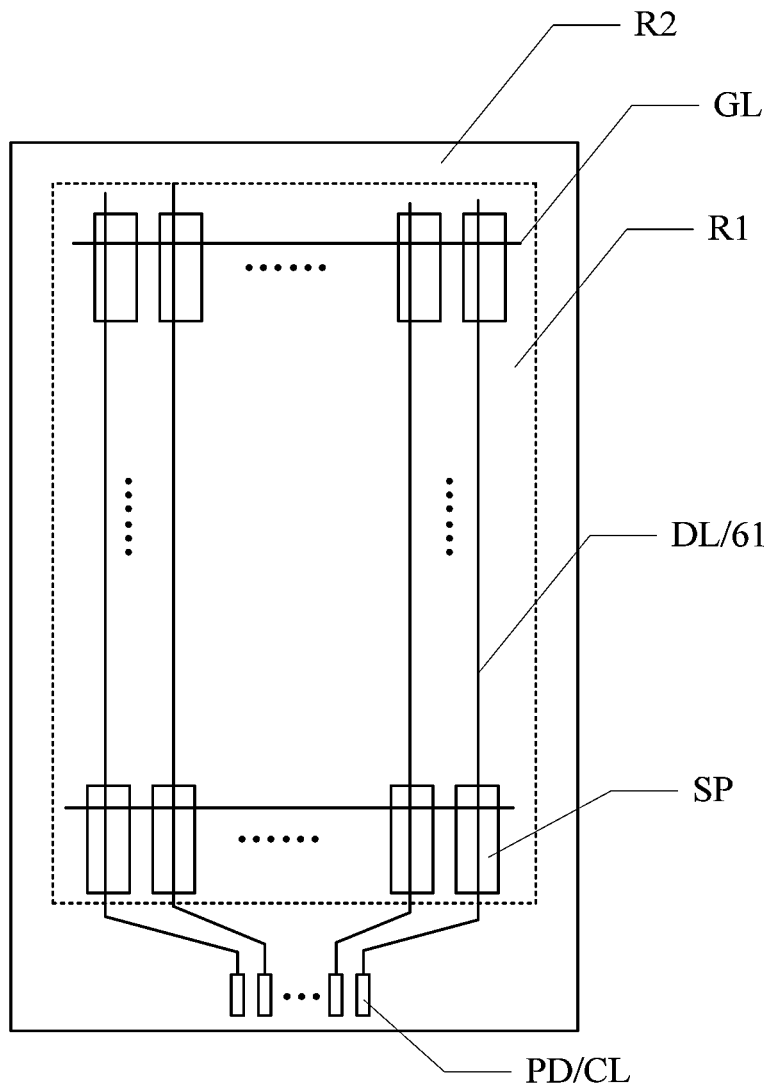
FIG. 14 is a plan view of a display panel according to an embodiment of the present disclosure.
Figure 32:
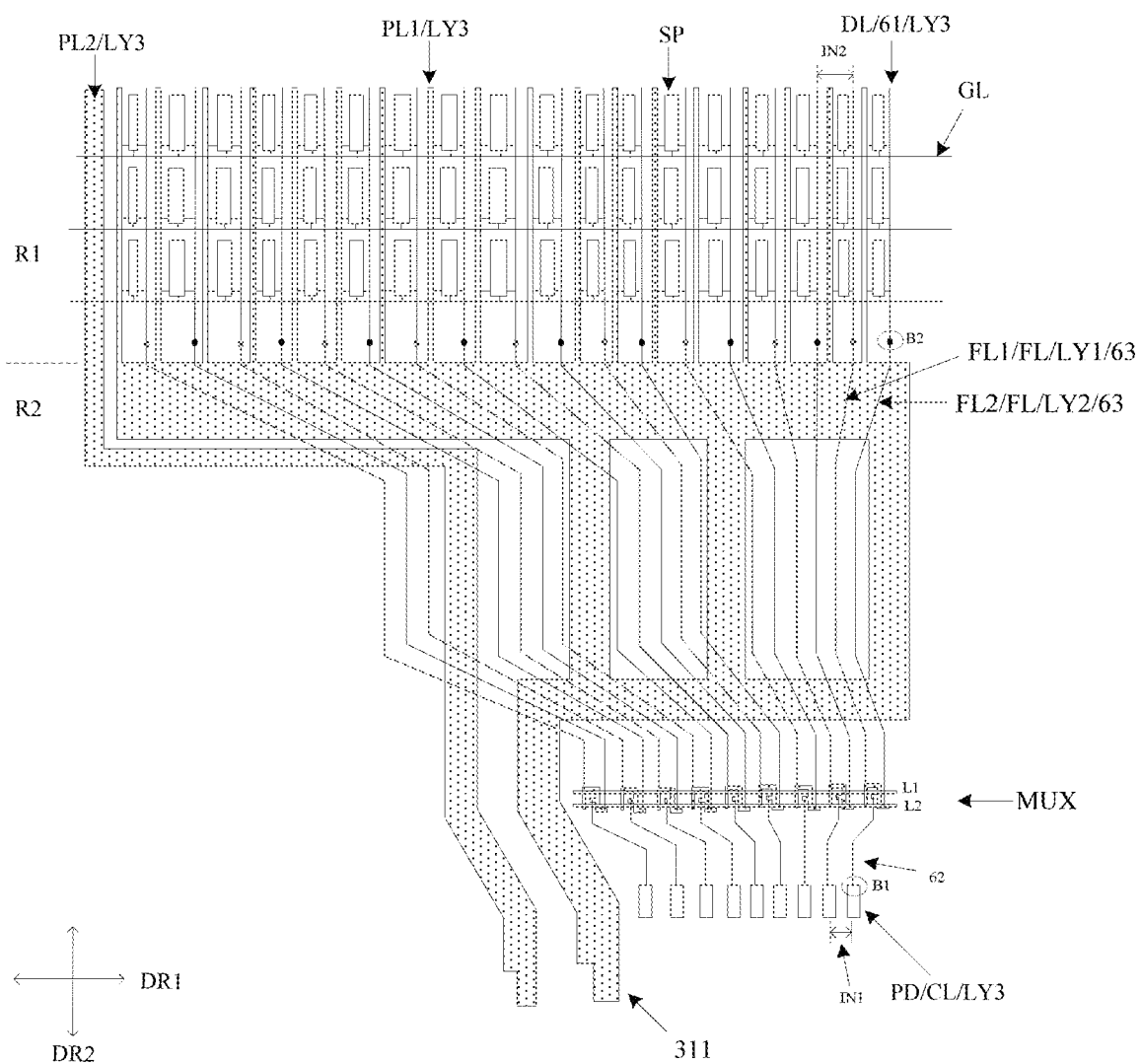
FIG. 32 is a partial plan view of a display panel provided by an embodiment of the present disclosure.

For example, referring to FIG. 14 and FIG. 32, the display panel provided by the embodiment of the present disclosure includes a display area R1 and a peripheral area R2; the display area R1 has a plurality of pixel units SP; the peripheral area R2 is located on at least one side of the display area R1. The display panel also includes a first conductive part 61 on the base substrate; the first conductive part is located in the display area R1; the first conductive part 61 and the conductive member CL are arranged in the same layer and made of the same material.

As shown in FIG. 4, the conductive member CL is located on the base substrate 100; the second conductive sub-layer 102 includes a first surface S1 close to the first conductive sub-layer 101 and a second surface S2 close to the third conductive sub-layer 103; the first surface S1 and the second surface S2 are arranged opposite to each other. Referring to FIGS. 3 and 4, the third conductive sub-layer 103 protrudes from the second surface S2 along the width direction (first direction) DR1 of the conductive member CL, and the width direction DR1 intersects with the extending direction (second direction) DR2 of the conductive member CL. In FIG. 3, the boundary of the second conductive sub-layer 102 is shown by the second surface S2. As shown in FIG. 4, the third conductive sub-layer 103 covers the edge of the second conductive sub-layer 102.

For example, as shown in FIG. 4, the thickness of the second conductive sub-layer 102 is greater than that of the first conductive sub-layer 101. Due to the larger thickness and conductivity of the second conductive sub-layer 102, the risk of poor process such as etching residue in the second conductive sub-layer 102 is high. If etching residue occurs, the risk of lateral conduction or electrostatic breakdown will be increased. The second conductive sub-layer 102 and the third conductive sub-layer 103 can be adjusted so that the third conductive sub-layer protrudes from the second surface in the width direction of the conductive member to reduce the risk of lateral conduction and electrostatic breakdown. The sources of static electricity usually include static electricity generated during the manufacturing process of the display panel and static electricity generated during the use of the device including the display panel.

For example, the thickness of the second conductive sub-layer 102 ranges from 3000 Å to 12000 Å, the thickness of the first conductive sub-layer 101 ranges from 50 Å to 2000 Å, and the thickness of the third conductive sub-layer 103 ranges from 50 Å to 2000 Å, without limiting the embodiments of the present disclosure thereto. For example, the thickness of the second conductive sub-layer 102 is greater than that of the first conductive sub-layer 101, and the thickness of the second conductive sub-layer 102 is greater than that of the third conductive sub-layer 103.

For example, as shown in FIG. 4, the area of the orthographic projection of the third conductive sub-layer 103 on the base substrate 100 is larger than that of the first surface S1 of the second conductive sub-layer 102 on the base substrate 100, without limiting the embodiments of the present disclosure thereto. In other embodiments, the area of the orthographic projection of the third conductive sub-layer 103 on the base substrate 100 may be equal to or smaller than the area of the orthographic projection of the first surface S1 of the second conductive sub-layer 102 on the base substrate 100.

For example, as shown in FIG. 4, the second conductive sub-layer 102 further includes a side surface S3 which connects the first surface S1 and the second surface S2 and is located on the same side as the second conductive sub-layer 102. As shown in FIG. 4, in the second conductive member CL2, the left, side surface S3 connects the left side of the first surface S1 with the left side of the second surface S2; and the right, side surface S3 connects the right side of the first surface S1 with the right side of the second surface S2. As shown in FIG. 4, the side surface S3 is an inclined surface. The second conductive sub-layer 102 may have a trapezoidal structure, but is not limited thereto. The side surface S3 is inclined with respect to the first conductive sub-layer 101.

With reference to FIGS. 3 and 4, the width direction DR1 of the conductive member CL is the horizontal direction, as shown in FIG. 3, the extending direction DR2 of the conductive member CL is the vertical direction, and the thickness direction (third direction) DR3 of the conductive member CL is perpendicular to the width direction DR1 of the conductive member CL and is perpendicular to the extending direction DR2 of the conductive member CL. In FIG. 3, the conductive member CL is illustrated as a straight line by way of example; in other embodiments, the conductive member CL may not be a straight line, for example, the conductive member CL may be in other forms such as a broken line or a curved line.

For example, the extending direction DR2 of the conductive member CL may be an extending direction of a connecting line between two end points of the conductive member CL; and the width direction DR1 of the conductive member CL may be a direction perpendicular to the extending direction DR2 of the conductive member CL.

For example, in the embodiment of the present disclosure, the distance between the conductive sub-layers and the width of the conductive sub-layers can be determined based on the geometric dimensions between the substantially same positions of different conductive sub-layers; and for the second conductive sub-layer, it can be determined based on the top position (for example, the second surface S2), the bottom position (for example, the first surface S1), or the middle position of the second conductive sub-layer.

For example, referring to FIGS. 3 and 4, two adjacent conductive members CL are insulated from each other, are located in the same layer, and include a first conductive member CL1 and a second conductive member CL2. A distance spc1 between the third conductive sub-layers 103 of the first conductive member CL1 and of the second conductive member CL2 is smaller than a distance spc2 between the second surfaces S2 of the second conductive sub-layers 102 of the first conductive member CL1 and of the second conductive member CL2, so as to reduce the risk of electrostatic breakdown of adjacent conductive members. The first conductive member CL1 and the second conductive member CL2 may have the same structure, but are not limited thereto. For example, in the embodiment of the present disclosure, the fact that two elements are located in the same layer means that, the two elements are formed by the same film layer through the same patterning process. Or, the fact that the two elements are located in the same layer means that, the base materials of the two elements in direct contact with each other are the same. For example, elements formed by the same film layer have the same material. For example, as shown in FIG. 4, the third conductive sub-layer 103 is not in contact with the first conductive sub-layer 101. The width of the third conductive sub-layer 103 is larger than the width of the second surface S2. For example, referring to FIG. 3 and FIG. 4, the area of the orthographic projection of the third conductive sub-layer 103 on the base substrate 100 is larger than that of the second surface S2 on the base substrate 100. Referring to FIG. 3 and FIG. 4, because the width of the third conductive sub-layer 103 is larger than the width of the second surface S2, if the distance between adjacent second conductive sub-layers 102 is increased, the risk of electrostatic breakdown between adjacent second conductive sub-layers is reduced, which is beneficial to improving the stability and yield of the device including the display panel.

The inventor(s) of the present application found that, if a width of a portion of the third conductive sub-layer extending beyond the second conductive sub-layer is too large, the width of the second conductive sub-layer becomes even smaller, resulting in an increase in the resistance of the conductive member, which goes against the high-resolution display; if the width of the portion of the third conductive sub-layer extending beyond the second conductive sub-layer is too small, the risk of electrostatic discharge between adjacent second conductive sub-layers will be increased. Correspondingly, when the width of the portion of the third conductive sub-layer extending beyond the second conductive sub-layer satisfies certain conditions, a conductive member structure with both resistance and stability can be obtained.

For example, as shown in FIG. 4, a display panel satisfying the following relational expression gives consideration to both resistance and stability:

$$\frac{\Delta w11}{w1} + \frac{\Delta w12}{w2} < \frac{\Delta w11 + \Delta w12}{d\min},$$

wherein w1 is the maximum width of the first conductive member CL1 in its cross section in its width direction, w2 is the maximum width of the second conductive member CL2 in its cross section in its width direction, $\Delta w11$ is the distance that the third conductive sub-layer 103 extends beyond the second surface S2 in the first conductive member CL1, $\Delta w12$ is the distance that the third conductive sub-layer 103 extends beyond the second surface S2 in the second conductive member CL2, and dmin is the minimum distance between the first conductive member CL1 and the second conductive member CL2. According to the display panel satisfying the above relational expression, the influence on the resistance resulted by the width of the portion of the third conductive sub-layer extending beyond the second conductive sub-layer is minimized, and the risk of electrostatic breakdown is reduced at the same time.

For example, the method of manufacturing the display panel shown in FIG. 4 may include: forming a first conductive film, patterning the first conductive film to form a first conductive sub-layer 101; forming a second conductive film, and patterning the second conductive film to form a second conductive sub-layer 102; forming an insulating layer between adjacent second conductive sub-layers 102; forming a third conductive film on the insulating layer and the second conductive sub-layer 102 to be in contact with the second conductive sub-layer 102, and patterning the third conductive film to form a third conductive sub-layer 103. It should be noted that, the manufacturing method of the display panel shown in FIG. 4 is not limited to the above-mentioned methods, and a person skilled in the art can choose a suitable method to manufacture the display panel according to the description of the structure in the embodiment of the present disclosure.

Figure 5A:
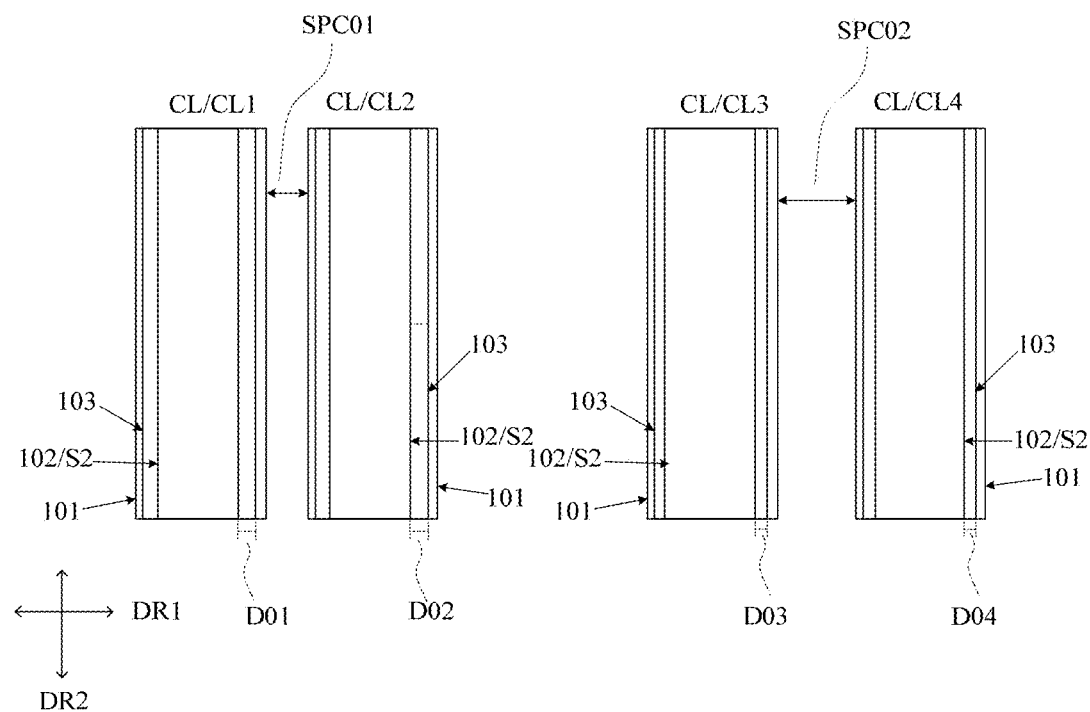
FIG. 5A is another sectional view taken along the line A1-A2 of FIG. 3.

FIG. 5A is a schematic diagram of a plurality of conductive members provided by an embodiment of the present disclosure. As shown in FIG. 5A, the display panel includes a plurality of conductive members CL located in the same layer, including a first conductive member CL1, a second conductive member CL2, a third conductive member CL3 and a fourth conductive member CL4; an interval SPC01 between the first and second conductive members CL1 and CL2 is different from an interval SPC02 between the third and fourth conductive members CL3 and CL4. A size of the second surfaces S2 of the third conductive sub-layers 103 in the left two conductive members CL protruding from the second conductive sub-layers 102 is different from a size of the second surfaces S2 of the third conductive sub-layers 103 in the right two conductive members CL protruding from the second conductive sub-layers 102.

As shown in FIG. 5A, the interval SPC01 between the first conductive member CL1 and the second conductive member CL2 is smaller than the interval SPC02 between the third conductive member CL3 and the fourth conductive member CL4.

As shown in FIG. 5A, the third conductive sub-layer 103 in the first conductive member CL1 protrudes from the second surface S2 of the second conductive sub-layer 102 along the width direction of the first conductive member CL1 by a size D01; the third conductive sub-layer 103 in the second conductive member CL2 protrudes from the second surface S2 of the second conductive sub-layer 102 along the width direction of the second conductive member CL2 by a size D02; the third conductive sub-layer 103 in the third conductive member CL3 protrudes from the second surface S2 of the second conductive sub-layer 102 along the width direction of the third conductive member CL3 by a size D03; and the third conductive sub-layer 103 in the fourth conductive member CL4 protrudes from the second surface S2 of the second conductive sub-layer 102 along the width direction of the fourth conductive member CL4 by a size D04. D01 is greater than D03 and is greater than D04; D02 is greater than D03 and is greater than D04. For example, in some embodiments, D01 is equal to D02, and D03 is equal to D04, without limiting the embodiments of the present disclosure thereto.

As shown in FIG. 5A, the first conductive member CL1, the second conductive member CL2, the third conductive member CL3, and the fourth conductive member CL4 are parallel to each other; in other embodiments, adjacent conductive members may not be parallel to each other.

Figure 5B:
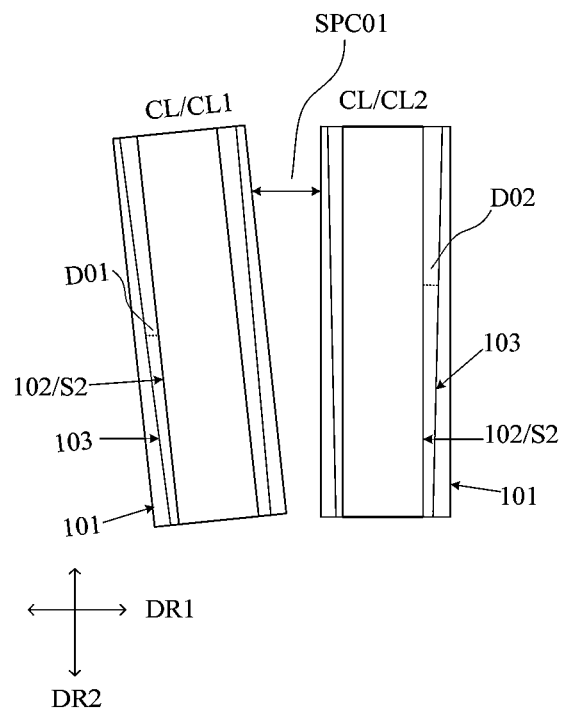
FIG. 5B is another sectional view taken along the line A1-A2 of FIG. 3.

FIG. 5B is a schematic diagram of a plurality of conductive members provided in an embodiment of the present disclosure. The first conductive member CL1 is not parallel to the second conductive member CL2, and the distance SPC01 between the first conductive member CL1 and the second conductive member CL2 gradually increases from the first end to the second end, so that for the same conductive member CL, the size of the third conductive sub-layer 103 protruding from the second surface S2 of the second conductive sub-layer 102 is different at different positions.

For example, as shown in FIG. 5B, for the same conductive member, the size of the third conductive sub-layer 103 protruding from the second surface S2 of the second conductive sub-layer 102 at a position where the interval SPC01 is small, is smaller than that at a position where the interval SPC01 is large, without limiting the embodiments of the present disclosure thereto.

Figure 6A:
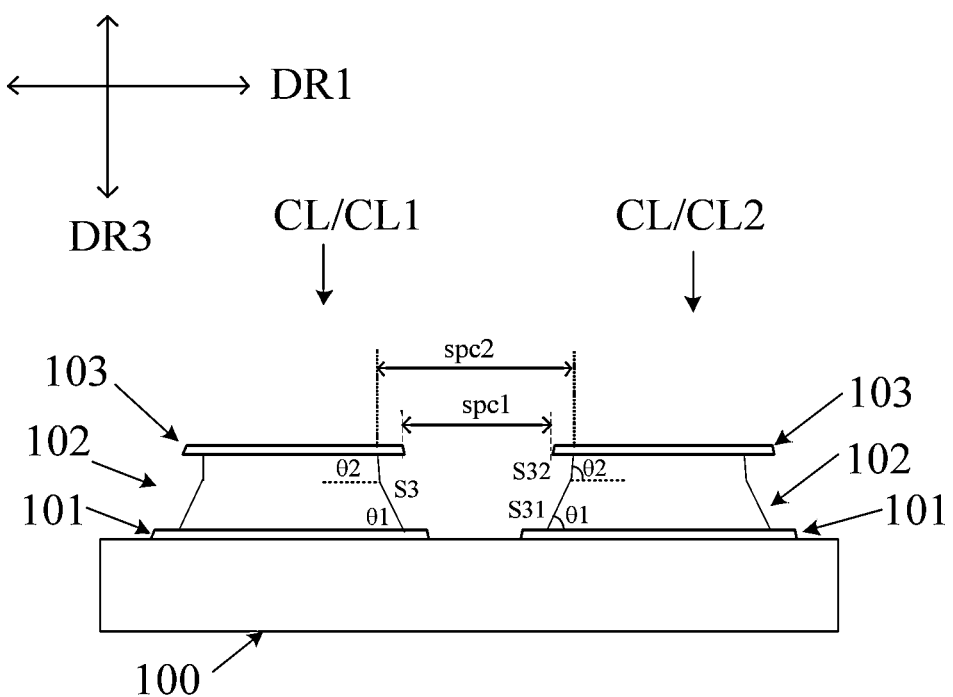
FIG. 6A is another sectional view taken along the line A1-A2 of FIG. 3.

FIG. 6A is another sectional view taken along the line A1-A2 in FIG. 3. For example, as shown in FIG. 6A, the side surface S3 includes at least two side sub-surfaces S3 including a first side sub-surface S31 close to the first conductive sub-layer 101 and a second side sub-surface S32 close to the third conductive sub-layer 103, and an angle θ1 formed by the first side sub-surface S31 and the first conductive sub-layer 101 is smaller than an angle θ2 formed by the second side sub-surface S32 and the first conductive sub-layer 101.

Generally, the second conductive sub-layers 102 is formed with a side surface having a certain inclined angle, exhibiting the tendency of size increasing from the bottom to the top, resulting in the interval between adjacent second conductive sub-layers naturally increasing from the bottom to the top. The embodiment of the present disclosure mainly focuses on reducing the risk of electrostatic discharge by decreasing the width of the second conductive sub-layer, based on which the interval between adjacent second conductive sub-layers may not always increase and the angle θ2 slows down the tendency of size increasing, so that a gentle slope with smaller angle can be formed and the width of the second conductive sub-layer at the bottom is structurally increased, thereby reducing the resistance of the conductive member.

Figure 6B:
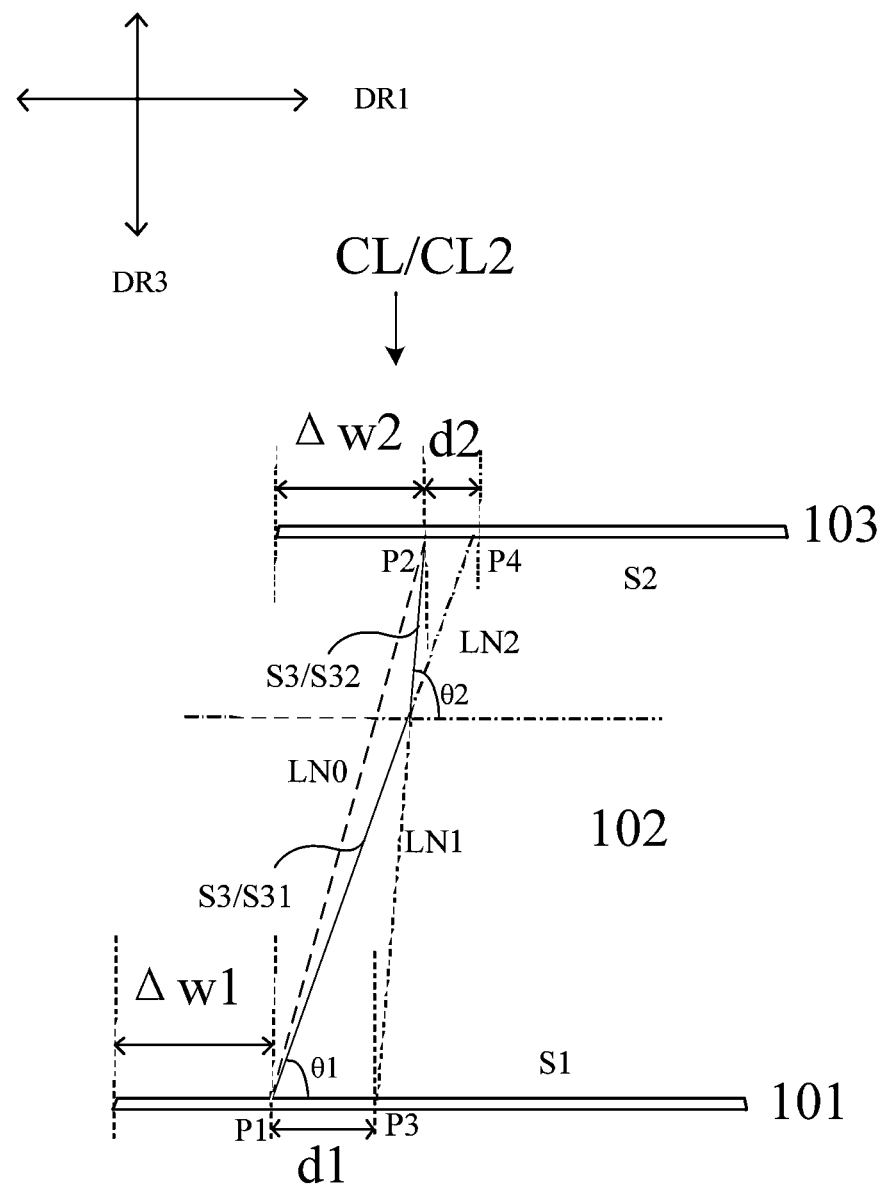
FIG. 6B is a partial cross-sectional view of a conductive member on a display panel according to an embodiment of the present disclosure.

FIG. 6B is a partial cross-sectional view of a conductive member on a display panel according to an embodiment of the present disclosure. As shown in FIG. 6B, in a cross section taken along a direction perpendicular to the extending direction DR2 of the conductive member CL, an intersection point between the side surface S3 and the first conductive sub-layer 101 is a first intersection point P1, and an intersection point between the side surface S3 and the third conductive sub-layer 103 is a second intersection point P2, and at least a part of the side surface S3 is located at one side of a connecting line LN0 between the first intersection point P1 and the second intersection point P2 that is close to the second conductive sub-layer 102. The cross section taken along the direction perpendicular to the extending direction DR2 of the conductive member CL is a plane formed by the thickness direction DR3 of the conductive member CL and the width direction DR1 of the conductive member CL.

For example, as shown in FIG. 6B, in the cross section taken along the direction perpendicular to the extending direction DR2 of the conductive member CL, a distance between the intersection point P1 of the first side sub-surface S31 and the first conductive sub-layer 101 and an intersection point P3 is d1, and a distance of the first conductive sub-layer 101 extending beyond the first surface S1 is Δw1, wherein the intersection point P3 is an intersection point between the first conductive sub-layer 101 and an extension line of the second side sub-surface S32.

For example, as shown in FIG. 6B, in the cross section taken along the direction perpendicular to the extending direction DR2 of the conductive member CL, the distance between the intersection point P2 of the second side sub-surface S32 and the third conductive sub-layer 103 and an intersection point P4 is d2, and a distance of the third conductive sub-layer 103 extending beyond the second surface S2 is Δw2, wherein the intersection point P4 is an intersection point between the third conductive sub-layer 103 and an extension line LN2 of the first side sub-surface S31. For example, in the embodiment of the present disclosure, the distance of the third conductive sub-layer 103 extending beyond the second surface S2 refers to a size of a portion of the third conductive sub-layer 103 extending beyond the second surface S2 in the width direction of the conductive member. The width direction of the conductive member intersects with the length direction of the conductive member. For example, the width direction of the conductive member is perpendicular to the length direction of the conductive member.

For example, as shown in FIG. 6B, in order to reduce the risk of electrostatic breakdown and also reduce the resistance of the conductive member at the same time, d1<Δw1; further, for example, d1<Δw2.

For example, as shown in FIG. 6B, in order to reduce the risk of electrostatic breakdown and also reduce the resistance of the conductive member at the same time, d2<Δw1; further, for example, d2<Δw2.

For example, as shown in FIG. 6B, in order to reduce the risk of electrostatic breakdown and also reduce the resistance of the conductive member at the same time, Δw2<Δw1.

For example, as shown in FIG. 6B, both the first side sub-surface S31 and the second side sub-surface S32 are inclined surfaces. Referring to FIGS. 6A and 6B, the first side sub-surface S31 and the second side sub-surface S32 may be inclined surfaces with respect to the base substrate 100, respectively.

Figure 7:
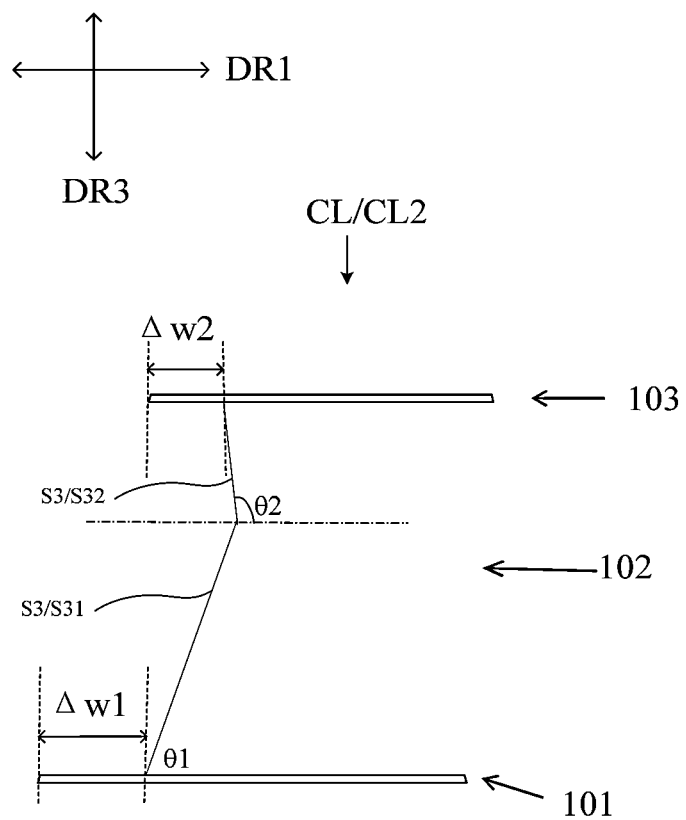
FIG. 7 is a partial cross-sectional view of a conductive member on a display panel according to an embodiment of the present disclosure.

FIG. 7 is a partial cross-sectional view of a conductive member on a display panel according to an embodiment of the present disclosure. For example, as shown in FIG. 7, in order to reduce the risk of electrostatic breakdown and also reduce the resistance of the conductive member at the same time, the angle θ2 formed by the second side sub-surface S32 and the first conductive sub-layer 101 is greater than 90 degrees.

Figure 8:
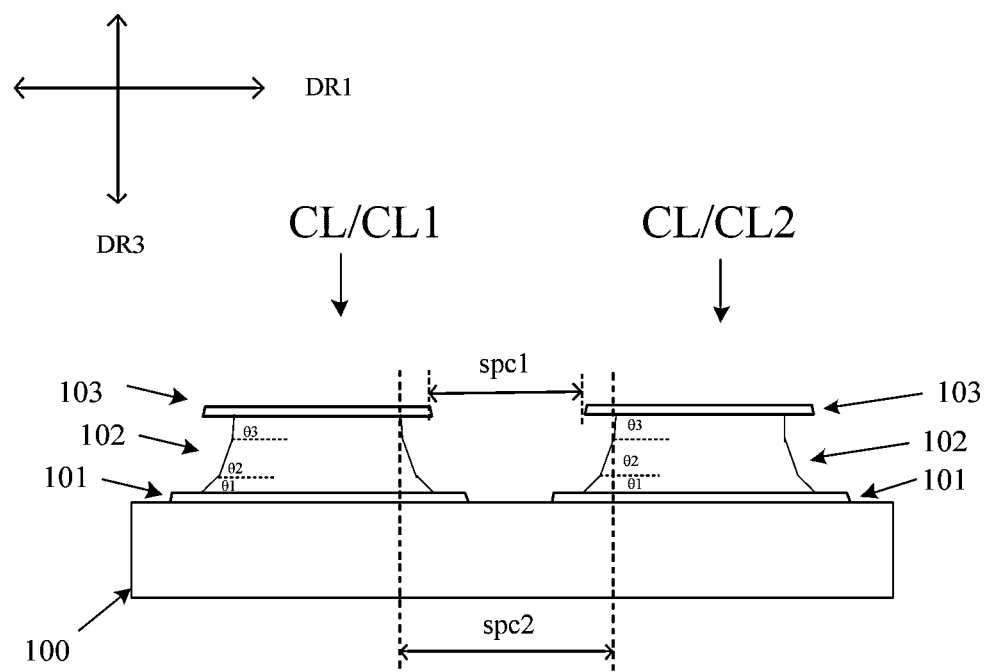
FIG. 8 is another sectional view taken along the line A1-A2 of FIG. 3.

FIG. 8 is another sectional view taken along the line A1-A2 of FIG. 3. For example, as shown in FIG. 8, the side surface S3 includes three sub-surfaces S3 arranged in sequence, including a first sub-surface S31, a second sub-surface S32 and a third sub-surface S33; the first sub-surface S31 is closer to the first conductive sub-layer 101 than the third sub-surface S33; an angle formed by the first sub-surface S31 and the first conductive sub-layer 101 is a first angle θ1, an angle formed by the second side sub-surface S32 and the first conductive sub-layer 101 is a second angle θ2, and an angle formed by the third side sub-surface S33 and the first conductive sub-layer 101 is a third angle θ3. In order to reduce the risk of electrostatic breakdown and also reduce the resistance of conductive members at the same time, the third angle θ3 is greater than the second angle θ2, and the second angle θ2 is greater than the first angle θ1.

For example, referring to FIG. 4, FIG. 6A and FIG. 8, the second conductive sub-layer 102 includes two side faces S3 which are arranged opposite to each other and are symmetrically arranged along the thickness direction of the conductive member CL. Only one side surface S3 of the conductive member CL is shown in FIG. 6B and FIG. 7, and the other side surface S3 of the conductive member CL may also be symmetrically arranged with respect to the side surface S3 as shown along the thickness direction of the conductive member CL. It should be noted that two opposite side surfaces of the same conductive member can also be arranged asymmetrically, which is not limited by the embodiments of the present disclosure.

With reference to FIGS. 6A and 8, two adjacent conductive members CL are insulated from each other, and are located in the same layer and have the same structure; the two adjacent conductive members CL include a first conductive member CL1 and a second conductive member CL2; an interval spc1 between the third conductive sub-layer 103 of the first conductive member CL1 and the third conductive sub-layer 103 of the second conductive member CL2 is smaller than an interval spc2 between the second surface S2 of the second conductive sub-layer 102 of the first conductive member CL1 and the second surface S2 of the second conductive sub-layer 102 of the second conductive member CL2.

Referring to FIGS. 3 to 6A and FIG. 8, the interval between the first conductive member CL1 and the second conductive member CL2 is small. For example, the interval between the first conductive member CL1 and the second conductive member CL2 may be 5 μm-19 μm, but it is not limited to this. The embodiment of the present disclosure does not specifically limit the value of the interval between the first conductive member CL1 and the second conductive member CL2.

Referring to FIGS. 4, 6A and 8, a distance from the first conductive member CL1 to the base substrate 100 may be as same as a distance from the second conductive member CL2 to the base substrate 100, without limiting the embodiments of the present disclosure thereto.

Figure 9:
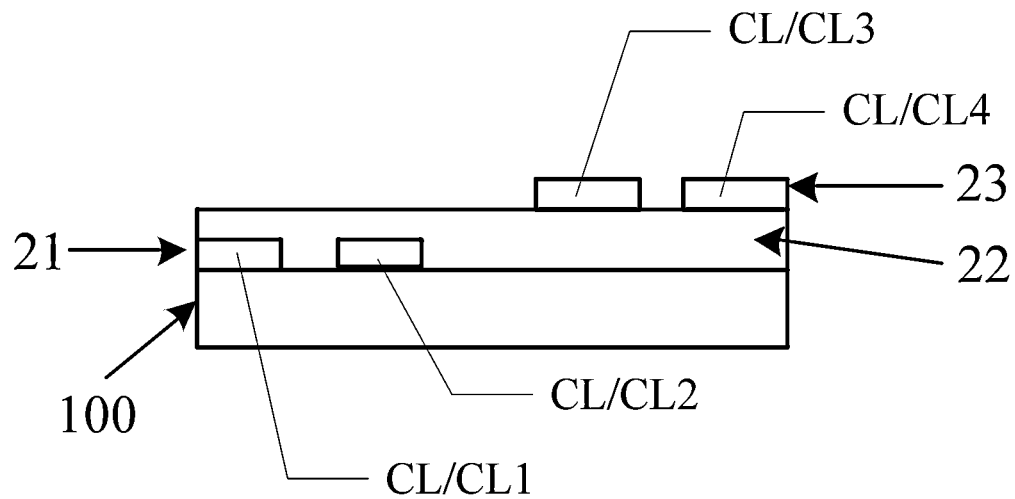
FIG. 9 is a sectional view of a display panel according to an embodiment of the present disclosure.

FIG. 9 is a sectional view of a display panel according to an embodiment of the present disclosure. As shown in FIG. 9, the display panel includes a base substrate 100, and a first conductive member layer 21, an insulating layer 22 and a second conductive member layer 23 which are located on the base substrate 100; the first conductive member layer 21 includes a first conductive member CL1 and a second conductive member CL2; the second conductive member layer 23 includes a third conductive member CL3 and a fourth conductive member CL4; the first and second conductive members CL1 and CL2 may adopt the first and second conductive members CL1 and CL2 as described above, and the third and fourth conductive members CL3 and CL4 may adopt the first and second conductive members CL1 and CL2 as described above, respectively.

For example, the first conductive member layer 21 and the second conductive member layer 23 are located in different layers; a distance from the first conductive member layer 21 to the base substrate 100 is different from a distance from the second conductive member layer 23 to the base substrate 100; and the distances from the first conductive member CL1 and the third conductive member CL3 to the base substrate 100 are different.

Figure 10:
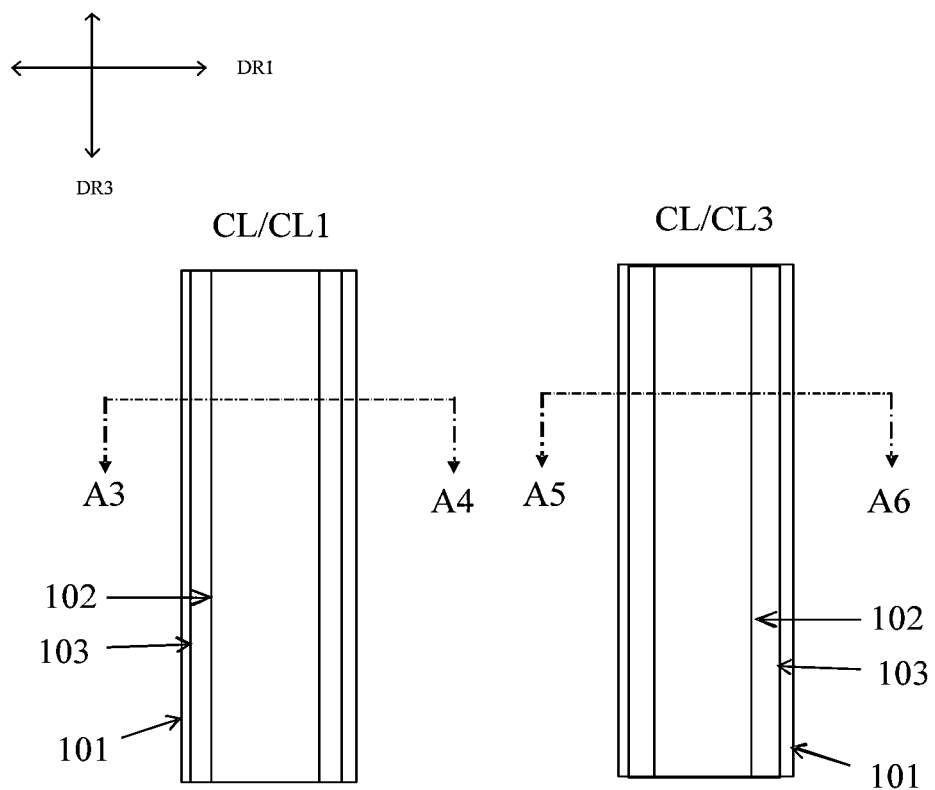
FIG. 10 is a plan view of a first conductive member and a third conductive member in the display panel shown in FIG. 9.

FIG. 10 is a plan view of a first conductive member and a third conductive member in the display panel shown in FIG. 9. The first conductive member CL1 and the third conductive member CL3 each adopt a structure in which the third conductive sub-layer protrudes from the second surface in the width direction of the conductive member.

Figure 11:
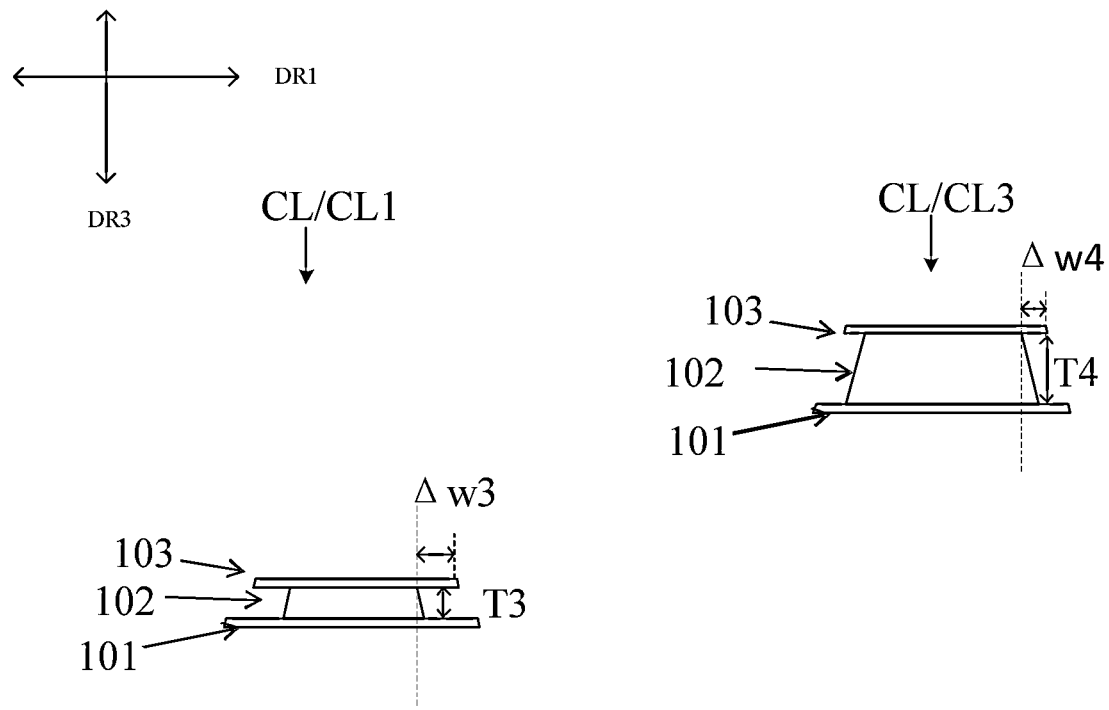
FIG. 11 is a sectional view of a first conductive member and a third conductive member in the display panel shown in FIG. 9.

FIG. 11 is a sectional view of the first conductive member and the third conductive member in the display panel shown in FIG. 9. A thickness of the second conductive sub-layer 102 of the first conductive member CL1 is T3, a thickness of the second conductive sub-layer 102 of the third conductive member CL3 is T4, and T4 is larger than T3; a distance of the third conductive sub-layer 103 extending beyond the second surface S2 in the first conductive member CL1 is Δw3, and a distance of the third conductive sub-layer 103 extending beyond the second surface S2 in the third conductive member CL3 is Δw4, which satisfies the following relational expression:

$$\frac{\Delta w3}{T3} > \frac{\Delta w4}{T4}.$$

Therefore, in the case where the display panel is provided with a plurality of conductive members and each conductive member is required to have such a structure that the third conductive sub-layer protrudes from the second surface in the width direction of the conductive member, the distance of the third conductive sub-layer 103 extending beyond the second surface S2 among the conductive members having different distances from the base substrate can be determined according to the thickness of the second conductive sub-layer.

It should be noted that the embodiment of the present disclosure is described with reference to the case where the conductive member closer to the base substrate has a small thickness and the conductive member farther from the base substrate has a large thickness, by way of example. In other embodiments, the conductive member closer to the base substrate may have a large thickness, while the conductive member farther from the base substrate may have a small thickness.

Figure 12:
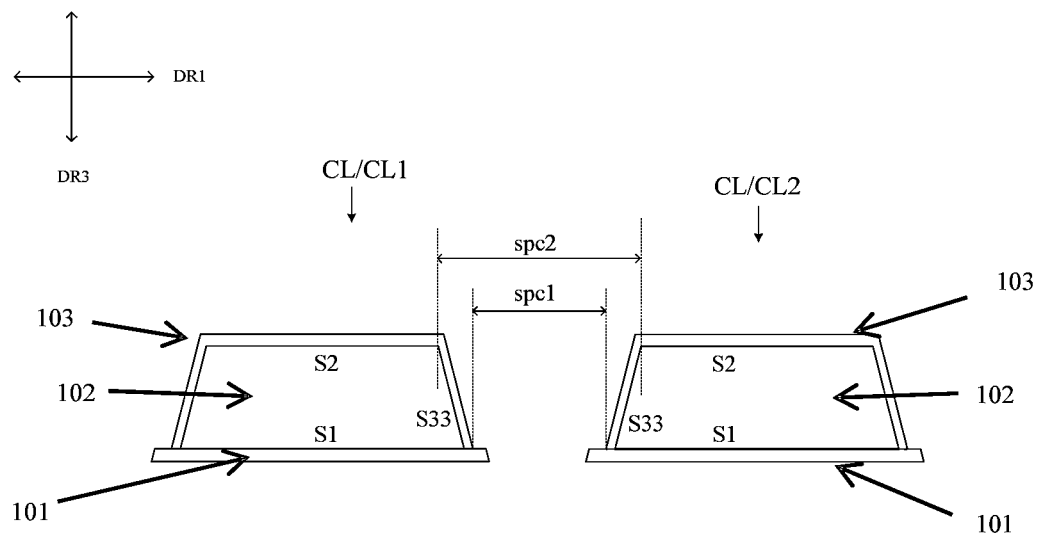
FIG. 12 is a sectional view of adjacent conductive members in a display panel provided by an embodiment of the present disclosure.

FIG. 12 is a sectional view of adjacent conductive members in a display panel provided by an embodiment of the present disclosure. As shown in FIG. 12, the interval spc1 between the third conductive sub-layer 103 of the first conductive member CL1 and the third conductive sub-layer 103 of the second conductive member CL2 is smaller than the interval spc2 between the second surface S2 of the second conductive sub-layer 102 of the first conductive member CL1 and the second surface S2 of the second conductive sub-layer 102 of the second conductive member CL2, so as to reduce the risk of electrostatic breakdown.

For example, as shown in FIG. 12, the third conductive sub-layer 103 covers the second conductive sub-layer 102 and is in contact with the first conductive sub-layer 101. Because the side surface S33 of the third conductive sub-layer 103 covers the second conductive sub-layer 102, the risk of electrostatic breakdown of the second conductive sub-layer 102 is reduced.

For example, in order to further reduce the influence of electrostatic discharge and significantly reduce the occurrence frequency of risks, at least one of N, S, P and Cl elements is doped into at least one of the first surface S1, the second surface S2 and the side surface S3 of the second conductive sub-layer 102. For example, the above-mentioned doping step may be performed on the second conductive sub-layer 102 of the conductive member CL in the display panel shown in FIGS. 3 to 12 according to the embodiment of the present disclosure.

Figure 13:
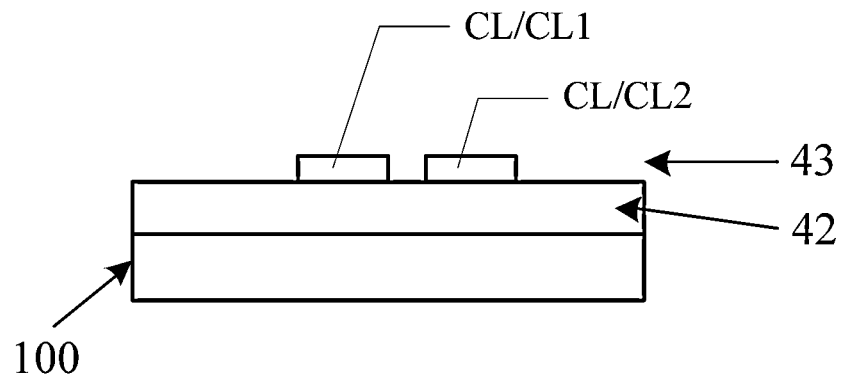
FIG. 13 is a sectional view of a display panel according to an embodiment of the present disclosure.

FIG. 13 is a sectional view of a display panel according to an embodiment of the present disclosure. As shown in FIG. 13, the display panel includes a base substrate 100, a barrier layer 42, and a conductive member layer 43 including a conductive member CL located on an inorganic insulating film 42. For example, the conductive member CL is in contact with the barrier layer 42, but is not limited thereto. For example, the conductive member layer 43 includes the first conductive member CL1 and the second conductive member CL2 as described above.

For example, the barrier layer 42 includes an inorganic insulating film having at least one of F element and Cl element. The barrier layer 42 has at least one of F element and Cl element, which can effectively absorb metal ions in the conductive member and reduce the risk of electrostatic discharge.

For example, in order to significantly reduce the occurrence frequency of electrostatic discharge, the content of at least one of F element and Cl element in the barrier layer 42 is $1 \times 10^{18}$ to $5 \times 10^{20}$ atoms per cubic centimeter.

For example, referring to FIG. 4, FIG. 6A-FIG. 8, FIG. 11 and FIG. 12, the first surface S1 is in contact with the first conductive sub-layer 101, and the second surface S2 is in contact with the third conductive sub-layer 103.

For example, referring to FIG. 4, FIG. 6A-FIG. 8, FIG. 11 and FIG. 12, the width of the first surface S1 is smaller than that of the first conductive sub-layer 101, and the width of the second surface S2 is smaller than that of the third conductive sub-layer 103. In order to give consideration to both resistance and stability, a width difference between the third conductive sub-layer 103 and the second surface S2 is greater than the thickness of the third conductive sub-layer 103.

In the embodiment of the present disclosure, whether the third conductive sub-layer 103 extends beyond the first surface S1 is not limited. For example, the third conductive sub-layer 103 may extend beyond the first surface S1, that is, the area of the orthographic projection of the third conductive sub-layer 103 on the base substrate is larger than the area of the orthographic projection of the first surface S1 on the base substrate. Of course, in other embodiments, the third conductive sub-layer 103 may not extend beyond the first surface S1, that is, the orthographic projection of the third conductive sub-layer 103 on the base substrate falls into the orthographic projection of the first surface S1 on the base substrate. In some embodiments, the orthographic projection of the third conductive sub-layer 103 on the base substrate may also coincide with the orthographic projection of the first surface S1 on the base substrate.

The application of the conductive members in the display panel shown in FIGS. 3 to 13 provided by the embodiments of the present disclosure will be described below. It should be noted that the application of the conductive members in the display panel provided by the embodiments of the present disclosure is not limited to the following description.

FIG. 14 is a plan view of a display panel according to an embodiment of the present disclosure. As shown in FIG. 14, the display panel includes a display area R1 and a peripheral area R2 located on at least one side of the display area R1. A plurality of sub-pixels SP are located in the display area R1. A plurality of gate lines GL and a plurality of data lines DL are located in the display area R1. The plurality of gate lines GL intersect with and are insulated from the plurality of data lines DL. As shown in FIG. 14, each data line DL is connected to a pad PD located in the peripheral area R2. As shown in FIG. 14, a plurality of pads PD is located in the peripheral area R2, and the plurality of pads PD can be configured to be connected with other elements or external circuits such as flexible printed circuit board. The two adjacent pads PD in FIG. 14 may be the first conductive member CL1 and the second conductive member CL2 as described above. FIG. 14 also shows a plurality of pixel units SP. A plurality of pixel units SP may be arranged in an array, but are not limited to this. FIG. 14 illustrates a plurality of pixel units SP arranged in a matrix as an example, but is not limited to this. In FIG. 14, each data line DL is connected to one pad PD as an example, in other embodiments, a plurality of data lines DL may be connected to one pad PD, for example, two or more data lines DL are connected to one pad PD. For example, two or more data lines DL may be connected to one pad PD by providing a data selection unit such as a mux unit.

Figure 15A:
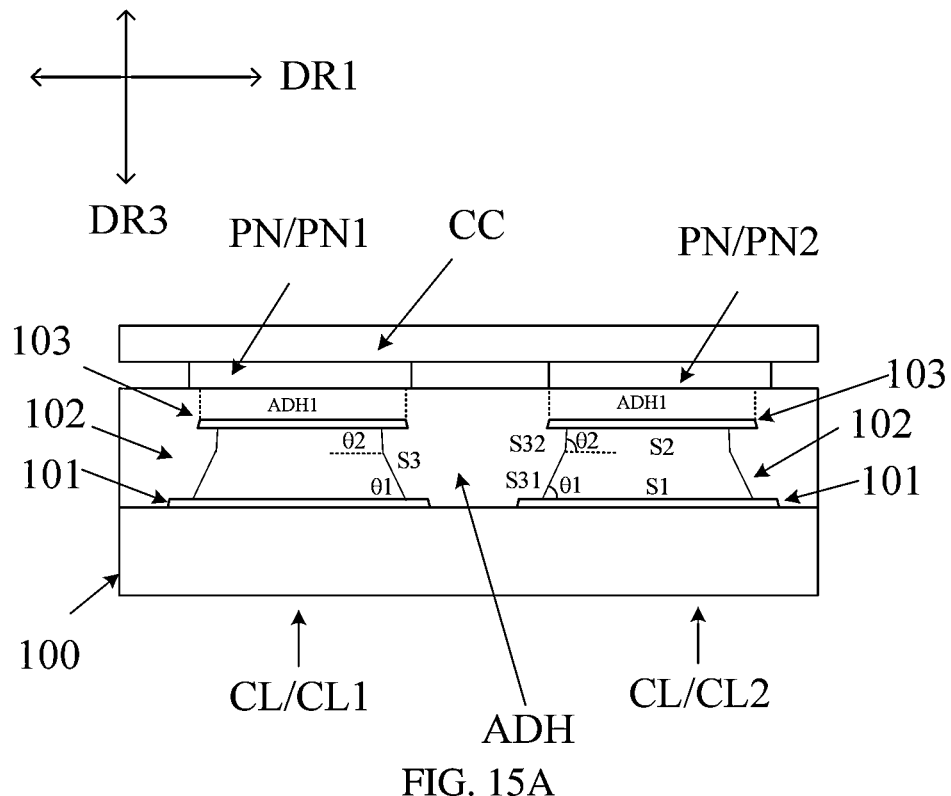
FIG. 15A is a plan view of a display panel according to an embodiment of the present disclosure.

FIG. 15A is a plan view of a display panel according to an embodiment of the present disclosure. As shown in FIG. 15A, the first conductive member CL1 and the second conductive member CL2 are respectively connected to a pin PN of an external circuit CC through an anisotropic conductive adhesive ADH which conducts electricity in a third direction DR3 (vertical direction), so as to electrically connect a first pin PN1 of the external circuit CC and the first conductive member CL1 and to electrically connect a second pin PN2 of the external circuit CC and the second conductive member CL2. The third conductive sub-layer 103 in the conductive member CL protrudes from the second surface S2, which facilitates bonding the conductive member CL with external circuits. FIG. 15A schematically illustrates that the second conductive sub-layer 102 has two inclined planes, but is not limited to this. The conductive member CL in FIG. 15A may adopt any of the conductive members CL described in the embodiments of the present disclosure.

FIG. 15A shows a conductive part ADH1 of the anisotropic conductive adhesive ADH. A part of the anisotropic conductive adhesive ADH except the conductive part ADH1 is an insulating part. That is, the part of anisotropic conductive adhesive ADH located between two adjacent conductive parts ADH1 is an insulating part to realize vertical connection and lateral insulation of conductive elements.

Figure 15B:
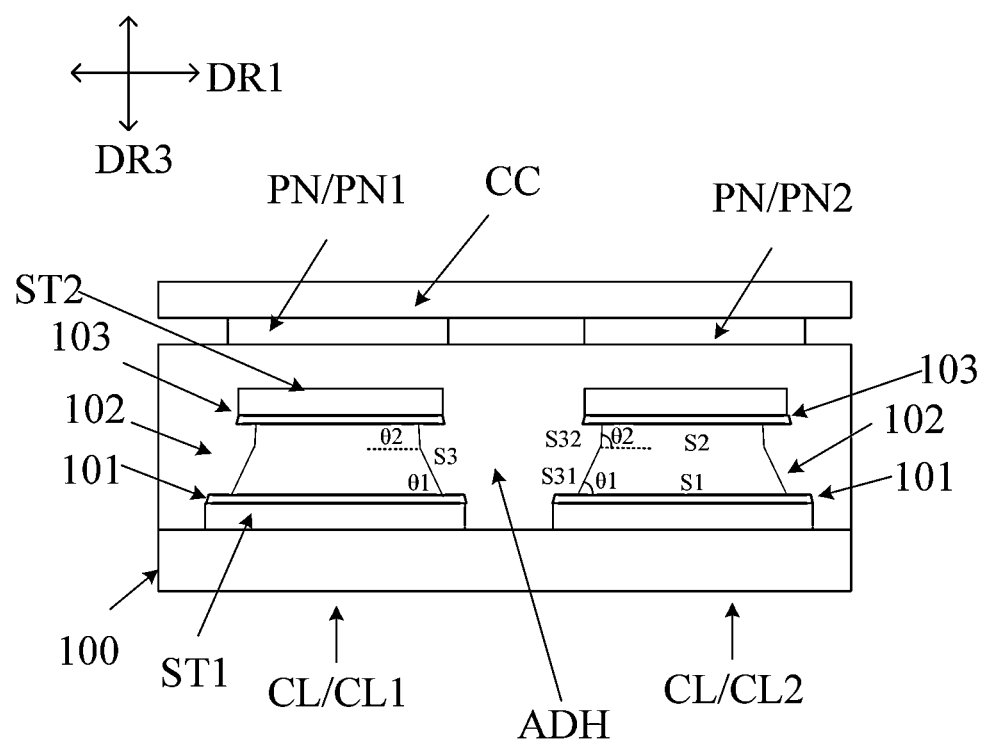
FIG. 15B is a plan view of a display panel according to another embodiment of the present disclosure.

FIG. 15B is a plan view of a display panel according to another embodiment of the present disclosure. Compared with the display panel shown in FIG. 15A, the conductive member CL of the display panel shown in FIG. 15A is stacked with a first stacked element ST1 and a second stacked element ST2, the first and second stacked elements ST1 and ST2 are respectively arranged on both sides of the conductive member CL, and the first stacked element ST1 is closer to the base substrate than the second stacked element ST2. The second stacked element ST2 is connected to the pin PN through the conductive part of the anisotropic conductive adhesive ADH. FIG. 15B illustrates that the conductive member CL is in contact with the first stacked element ST1 and is in contact with the second stacked element ST2, as an example, without limited thereto; in other embodiments, the conductive member CL and the first stacked element ST1 can be connected through a via hole penetrating the insulating layer, and the conductive member CL and the second stacked element ST2 can also be connected through a via hole penetrating the insulating layer. In FIGS. 15A and 15B, the barrier layer between the base substrate 100 and the conductive member CL is omitted.

Figure 16A:
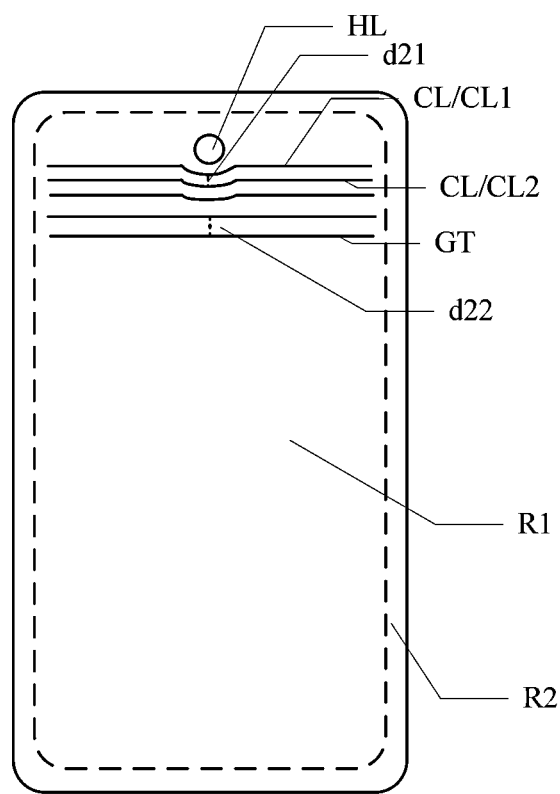
FIG. 16A is a plan view of a display panel according to an embodiment of the present disclosure.

FIG. 16A is a plan view of a display panel according to an embodiment of the present disclosure. As shown in FIG. 16A, the display panel has a transparent area HL. As the base substrate is hollowed out at the transparent area HL, a distance d21 between two adjacent gate lines GT close to the transparent area HL is smaller than a distance d22 between two adjacent gate lines GT far away from the transparent area HL. In FIG. 16A, the gate line GT that is close to the transparent area HL and has a conformable curved/bent portion can be a conductive member CL with a third conductive sub-layer protruding from the second surface structure in the width direction of the conductive member provided by the embodiment of the present disclosure. As shown in FIG. 16A, the first conductive member CL1 is closer to the transparent area HL than the second conductive member CL2. To reduce the risk of electrostatic breakdown, the distance of the third conductive sub-layer 103 extending beyond the second surface S2 in the first conductive member CL1 is larger than the distance of the third conductive sub-layer 103 extending beyond the second surface S2 in the second conductive member CL2. Of course, the conductive member CL can also be other signal lines in the display panel.

Figure 16B:
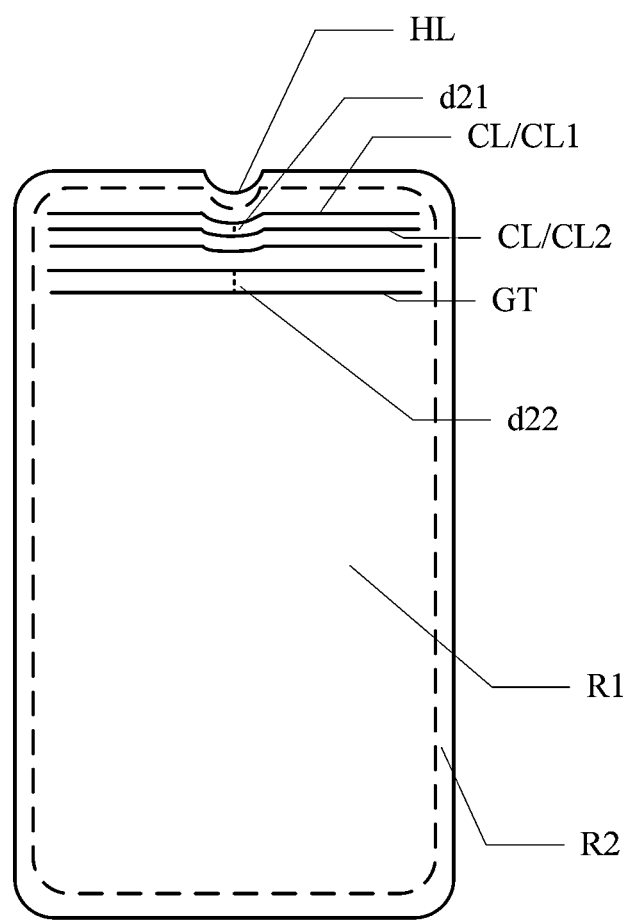
FIG. 16B is a plan view of a display panel according to another embodiment of the present disclosure.

FIG. 16B is a plan view of a display panel according to another embodiment of the present disclosure. Compared with the display panel shown in FIG. 16A, the display panel shown in FIG. 16B has a transparent area HL located at the edge of the base substrate to form a gap. The transparent area HL can be used for placing cameras and other components to facilitate the realization of multiple functions of the display device. The shape of the transparent area HL is not limited to that shown in FIGS. 16A and 16B, but may be determined as required.

Figure 17A:
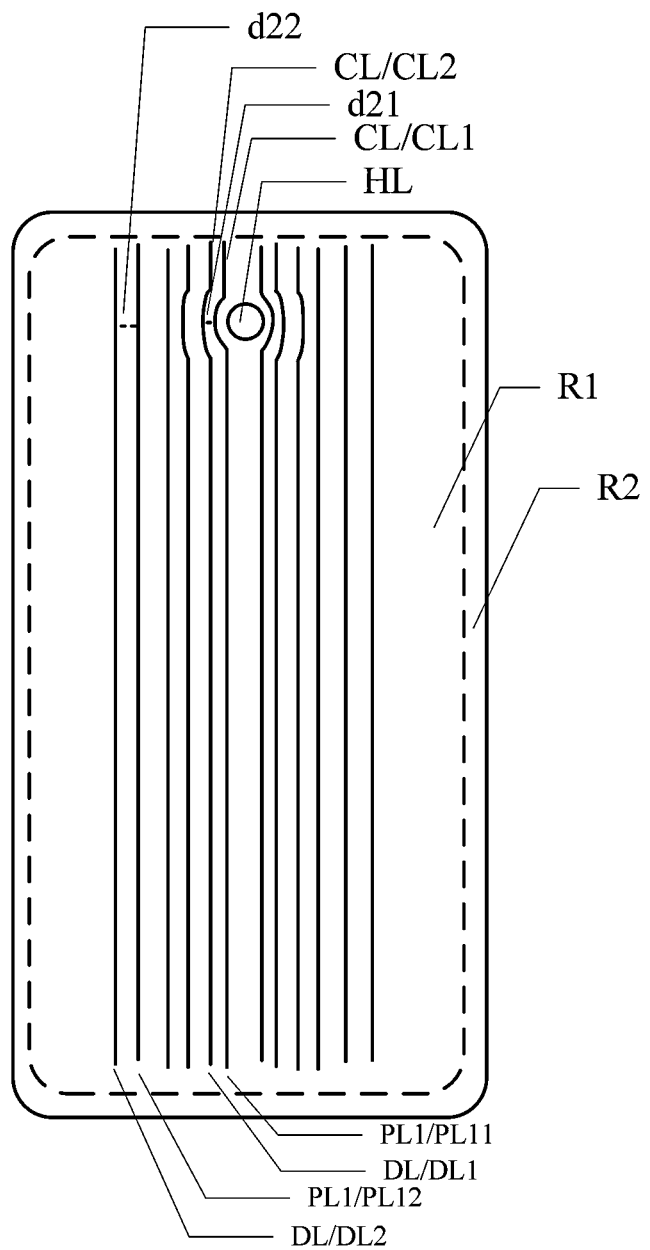
FIG. 17A is a plan view of a display panel according to an embodiment of the present disclosure.

FIG. 17A is a plan view of a display panel according to an embodiment of the present disclosure. FIG. 17A shows a plurality of data lines DL and a plurality of first power lines PL1; the data line DL and the first power line PL1 are adjacent to each other, and portions of the data line DL and the first power line PL1 close to the transparent area HL may be the first conductive member CL1 and the second conductive member CL2 as described above, respectively. In an area close to the transparent area HL, a distance d21 between the data line DL and the first power line PL1 that are adjacent to each other and close to the transparent area HL is smaller than a distance d22 between the data line DL and the first power line PL1 that are adjacent to each other and away from the transparent area HL. As shown in FIG. 17A, in the area close to the transparent area HL, a distance d21 between the data line DL1 and the first power line PL11 that are adjacent to each other and close to the transparent area HL is smaller than a distance d22 between the data line DL2 and the first power line PL12 that are adjacent to each other and away from the transparent area HL.

Figure 17B:
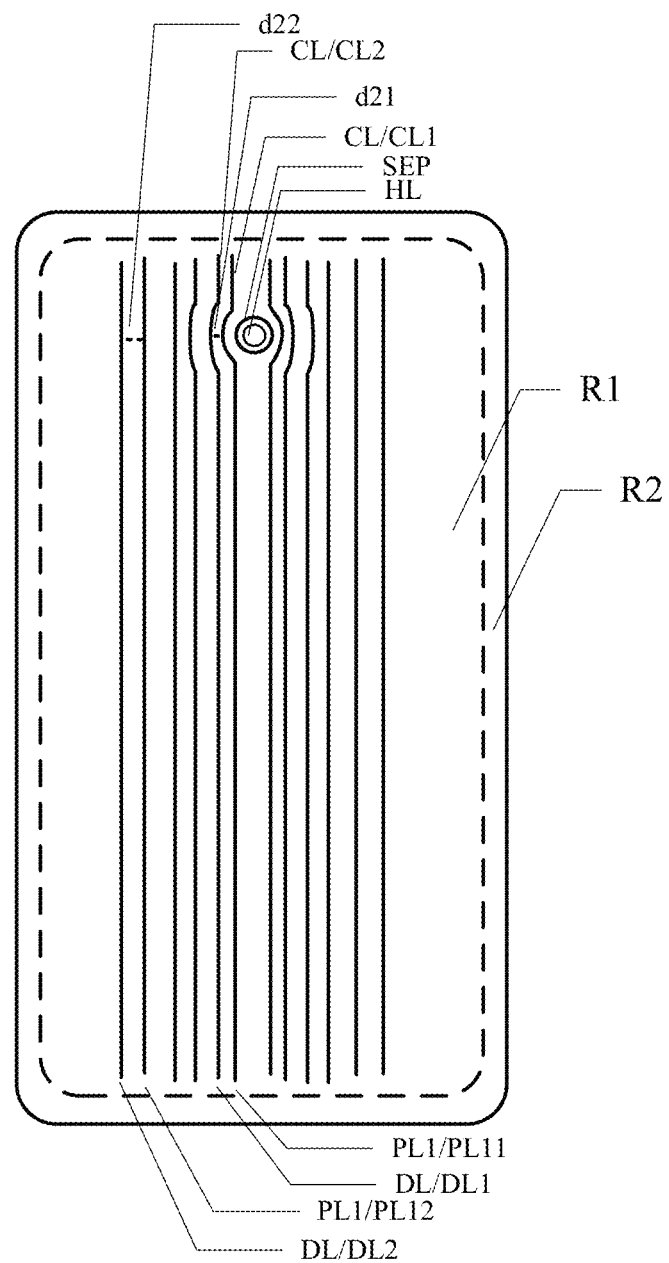
FIG. 17B is a plan view of a display panel according to an embodiment of the present disclosure.

FIG. 17B is a plan view of a display panel according to an embodiment of the present disclosure. Compared with the display panel shown in FIG. 17A, the display panel shown in FIG. 17B includes a spacer post SEP. The arrangement of the spacer post SEP is beneficial to blocking the invasion of water and oxygen into the light-emitting layer of the light-emitting diode. The spacer post SEP may adopt the structure of the conductive member CL as described above. The spacer post SEP is disposed around the transparent area HL; and the spacer post SEP and the first power line PL1 adjacent thereto may be the first conductive member CL1 and the second conductive member CL2 as described above, respectively. Of course, in other embodiments, the data line DL may be adjacent to the spacer post SEP, that is, the spacer post SEP and the data line DL adjacent thereto may be the first conductive member CL1 and the second conductive member CL2 as described above, respectively. For example, the data line DL and the first power line PL1 are arranged in the same layer. It should be noted that, there is no data line between the spacer post SEP and the first power line PL1 adjacent thereto, and there is no first power line PL1 between the spacer post SEP and the data line DL adjacent thereto.

Figure 17C:
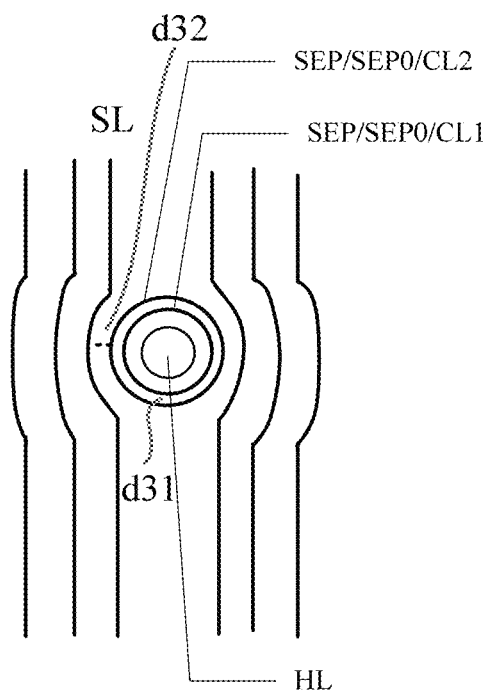
FIG. 17C is a partial plan view of a display panel according to an embodiment of the present disclosure.

FIG. 17C is a partial plan view of a display panel according to an embodiment of the present disclosure. As shown in FIG. 17, the spacer post SEP includes a plurality of sub-spacer posts SEP0, and a distance d32 between a sub-spacer post SEP0 close to the signal line SL and an adjacent sub-spacer post SEP0 is larger than a distance d31 between adjacent sub-spacer posts SEP0. The signal line SL may be the data line DL or the first power line PL1 shown in FIG. 17B. There is an interval between adjacent sub-spacer posts SEP0. The adjacent sub-spacer posts SEP0 may be the first conductive member CL1 and the second conductive member CL2 as described above.

Figure 18:
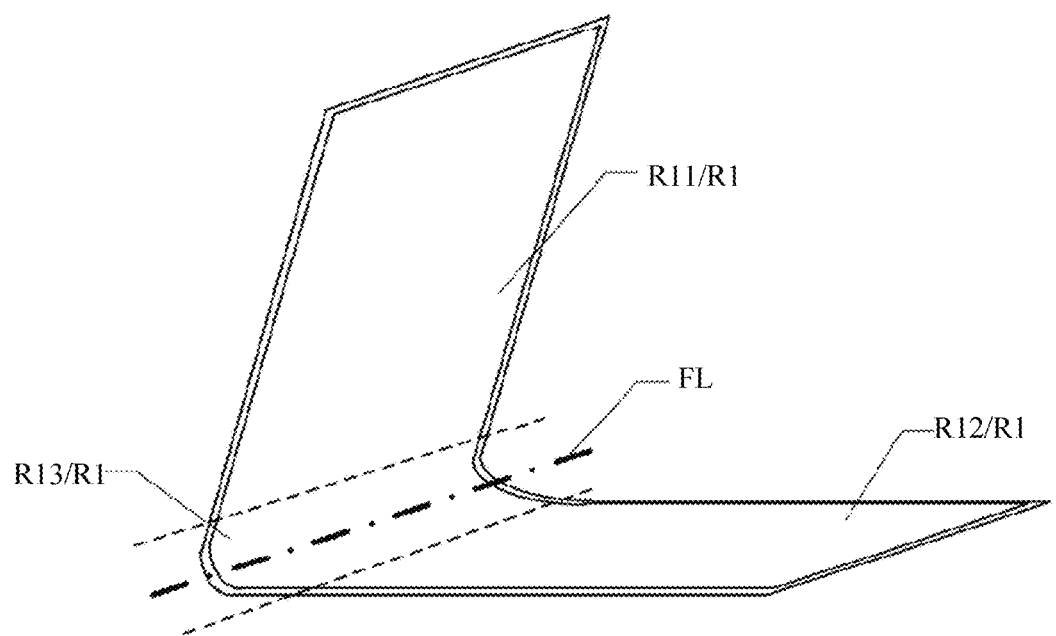
FIG. 18 is a perspective view of a display device including a display panel provided by an embodiment of the present disclosure.

FIG. 18 is a perspective view of a display device including a display panel provided by an embodiment of the present disclosure. As shown in FIG. 18, the display device is a foldable display device. The display device may be an OLED display device. The display device includes a foldable area R13, and a first display area R11 and a second display area R12 respectively arranged on both sides of the foldable area R13. FIG. 18 shows a foldable line FL. The foldable area R13, the first display area R11 and the second display area R12 constitute a display area R1.

Figure 19:
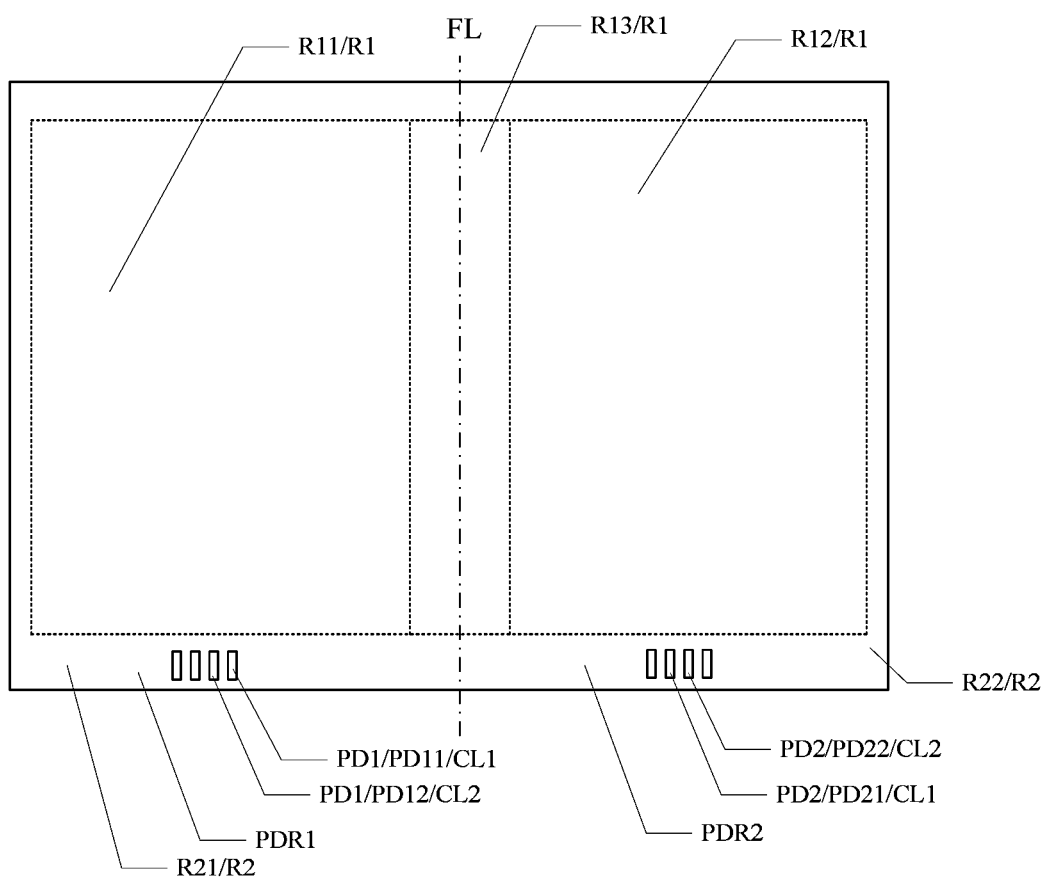
FIG. 19 is a plan view of the display device shown in FIG. 18.

FIG. 19 is a plan view of the display device shown in FIG. 18. As shown in FIG. 19, a first peripheral area R21 is arranged on one side of the first display area R11; a first pad area PDR1 is arranged in the first peripheral area R21; a plurality of first pads PD1 is located in the first pad area PDR1, and the plurality of first pads PD1 include two adjacent first pads PD1, which are a first pad PD11 close to the foldable line FL and a first pad PD12 away from the foldable line FL. The first pad PD11 and the first pad PD12 may be the first conductive member CL1 and the second conductive member CL2 as described above, respectively. To reduce the risk of electrostatic breakdown, the distance of the third conductive sub-layer 103 extending beyond the second surface S2 in the first conductive member CL1 is larger than the distance of the third conductive sub-layer 103 extending beyond the second surface S2 in the second conductive member CL2. That is, the first conductive member CL1 is closer to the foldable line FL than the second conductive member CL2, and the distance of the third conductive sub-layer 103 extending beyond the second surface S2 in the first conductive member CL1 is greater than that in the second conductive member CL2. FIG. 19 describes the case where the first pad PD11 is the first pad closest to the foldable line FL, by way of example, without limiting the embodiments of the present disclosure thereto. The first pad PD11 may not be the first pad closest to the foldable line FL.

For example, a distance between adjacent second conductive sub-layers of two adjacent conductive members close to the foldable line FL is greater than a distance between adjacent second conductive sub-layers of two adjacent conductive members away from the foldable line FL.

As shown in FIG. 19, a second peripheral area R22 is arranged on one side of the second display area R12, and a second pad area PDR2 is arranged in the second peripheral area R22; a plurality of second pads PD2 is located in the second pad area PDR2 and includes two adjacent second pads PD2 which are a second pad PD21 close to the foldable line FL and a second pad PD22 away from the foldable line FL. The second pad PD21 and the second pad PD22 may be the first conductive member CL1 and the second conductive member CL2 as described above, respectively. To reduce the risk of electrostatic breakdown, the distance of the third conductive sub-layer 103 extending beyond the second surface S2 in the first conductive member CL1 is larger than the distance of the third conductive sub-layer 103 extending beyond the second surface S2 in the second conductive member CL2. That is, the closer to the foldable line FL, the larger the size of the third conductive sub-layer in the conductive member protruding from the second surface in the width direction of the conductive member.

Only four first pads PD1 and four second pads PD2 are shown in FIG. 19, and the numbers of the first pads PD1 and the second pads PD2 can be determined as required and are not limited to that shown in the figure.

FIG. 19 illustrates the case where the interval between adjacent conductive members CL is equal everywhere by way of example, but the embodiment of the present disclosure is not limited to this. In other embodiments, the interval between adjacent conductive members CL may also be gradually changed. For example, in a direction from near to far with respect to the display area R1, the distance between adjacent conductive members CL gradually increases. FIG. 19 illustrates the case where the adjacent conductive members CL are parallel to each other by way of example, but in other embodiments, the adjacent conductive members CL may not be parallel to each other.

Figure 20:
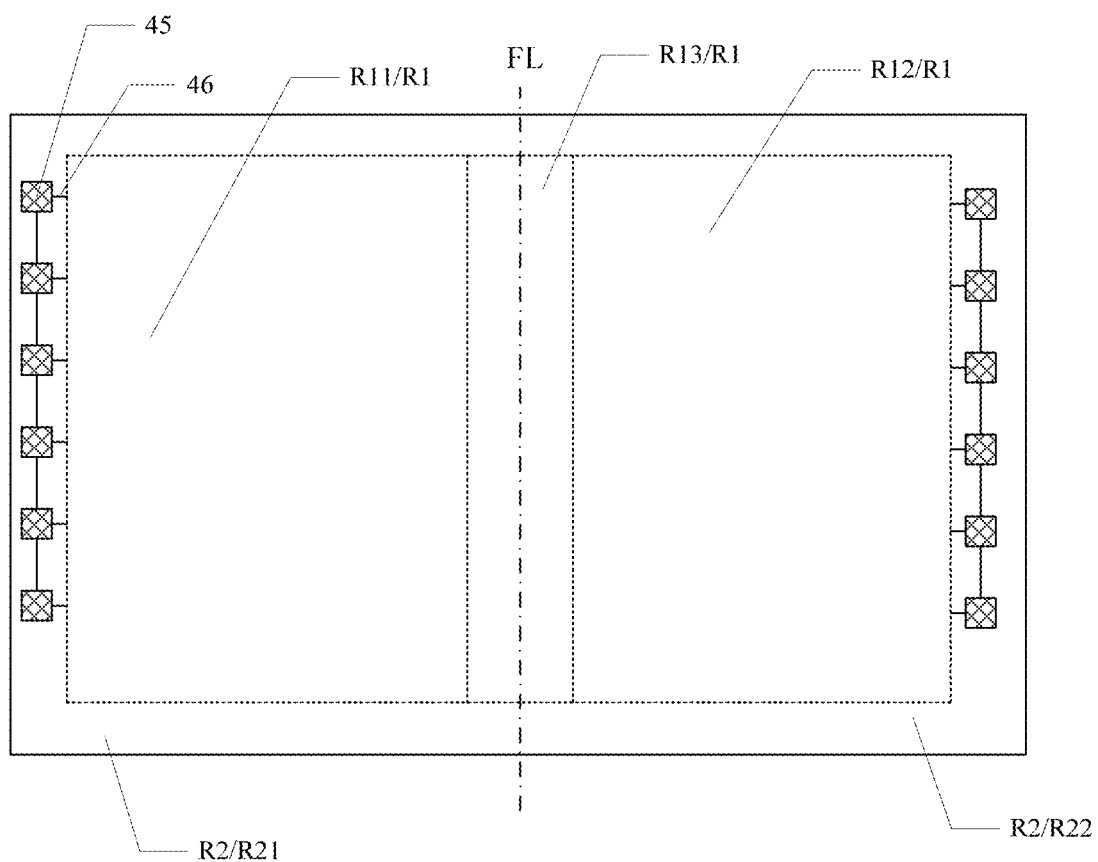
FIG. 20 is a plan view of a foldable display device including a display panel provided by an embodiment of the present disclosure.

FIG. 20 is a plan view of a foldable display device including a display panel provided by an embodiment of the present disclosure. As shown in FIG. 20, the foldable display device is an OLED display device. For example, the foldable display device includes a foldable area R13, and a first and a second display areas R11 and R12 located on two sides of the foldable area R13, respectively; the foldable area R13, the first and second display areas R11 and R12 constitute a display area R1, and a peripheral area R2 is located outside the display area R1; the peripheral area R2 includes a first peripheral area R21 located on at least one side of the first display area R11 and a second peripheral area R21 located on at least one side of the second display area R21. The display area includes a plurality of rows of pixel units. The first display area R11 and the second display area R12 are unfolded areas.

Figure 21:
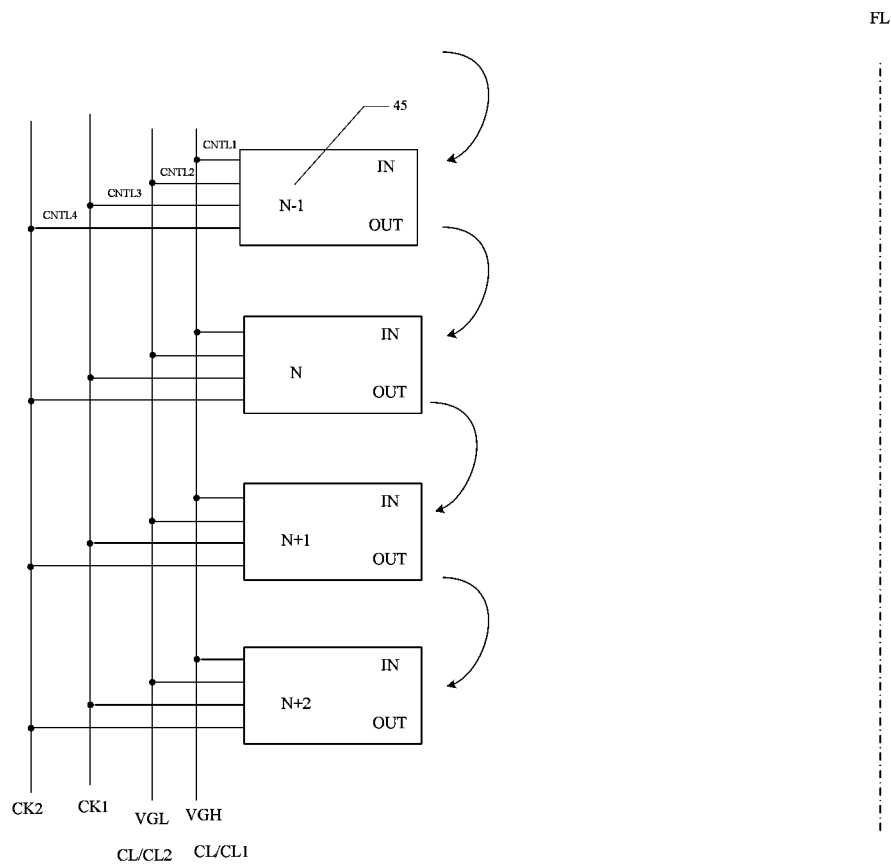
FIG. 21 is a schematic diagram of some GOA circuits in the foldable display device shown in FIG. 20.

FIG. 21 is a schematic diagram of some GOA circuits in the foldable display device shown in FIG. 20.

Referring to FIGS. 20 and 21, the first peripheral area R21 includes a plurality of signal lines 46 and multi-stages of GOA unit circuits 45, the GOA unit circuit 45 of each stage is electrically connected to the pixel units of a corresponding row through the signal lines 46, and the GOA unit circuit 45 of each stage is used for driving the pixel units of the corresponding row.

As shown in FIGS. 20 and 21, the GOA unit circuit 45 of each stage is connected to signal lines 46 including a GOA signal line, a pixel unit signal line and a power signal line through a scanning data line (not shown). The GOA signal lines include a first clock signal line CK1, a second clock signal line CK2, a low-level signal line VGL, and a high-level signal line VGH for normal operation of the GOA unit circuit 45.

For example, as shown in FIG. 21, an input signal IN in the $N_{th}$ stage of GOA unit circuit 45 is provided by an output signal OUT of the $N-1_{th}$ stage of GOA unit circuit, and an output signal OUT of the $N_{th}$ stage of GOA unit circuit provides a switching signal of the $N_{th}$ row of pixel units and an input signal of the $N+1_{th}$ stage of GOA unit circuit.

For example, the first clock signal line CK1 is configured to provide a first clock signal, the second clock signal line CK2 is configured to provide a second clock signal, the low-level signal line VGL is configured to provide a low-level signal, and the high-level signal line VGH is configured to provide a high-level signal.

For example, the conductive members CL in the display panel provided by the embodiment of the present disclosure may be any adjacent two of the first clock signal line CK1, the second clock signal line CK2, the low-level signal line VGL and the high-level signal line VGH shown in FIG. 21. That is, the first conductive member CL1 and the second conductive member CL2 may be any adjacent two of the first clock signal line CK1, the second clock signal line CK2, the low-level signal line VGL, and the high-level signal line VGH shown in FIG. 21. Under the circumstance that the first conductive member CL1 is closer to the foldable line FL than the second conductive member CL2, in order to reduce the risk of electrostatic breakdown, the distance of the third conductive sub-layer 103 extending beyond the second surface S2 in the first conductive member CL1 is larger than the distance of the third conductive sub-layer 103 extending beyond the second surface S2 in the second conductive member CL2. FIG. 21 illustrates the case where the first conductive member CL1 is a high-level signal line VGH, and the second conductive member CL2 is a low-level signal line VGL, by way of example.

FIG. 21 also shows a first connecting line CNL1, a second connecting line CNL2, a third connecting line CNL3 and a fourth connecting line CNL4. The high-level signal line VGH, the low-level signal line VGL, the first clock signal line CK1, and the second clock signal line CK2 are respectively connected to the $N_{th}$ stage of GOA unit circuit 45 through a first connecting line CNL1, a second connecting line CNL2, a third connecting line CNL3, and a fourth connecting line CNL4. In the display panel shown in FIG. 21, the first connecting line CNL1, the second connecting line CNL2, the third connecting line CNL3 and the fourth connecting line CNL4 are horizontally arranged, while the high-level signal line VGH, the low-level signal line VGL, the first clock signal line CK1 and the second clock signal line CK2 are vertically arranged, by way of example.

For example, the first conductive member CL1 and the second conductive member CL2 may be any adjacent two of the first connecting line CNL1, the second connecting line CNL2, the third connecting line CNL3 and the fourth connecting line CNL4 shown in FIG. 21.

Figure 22A:
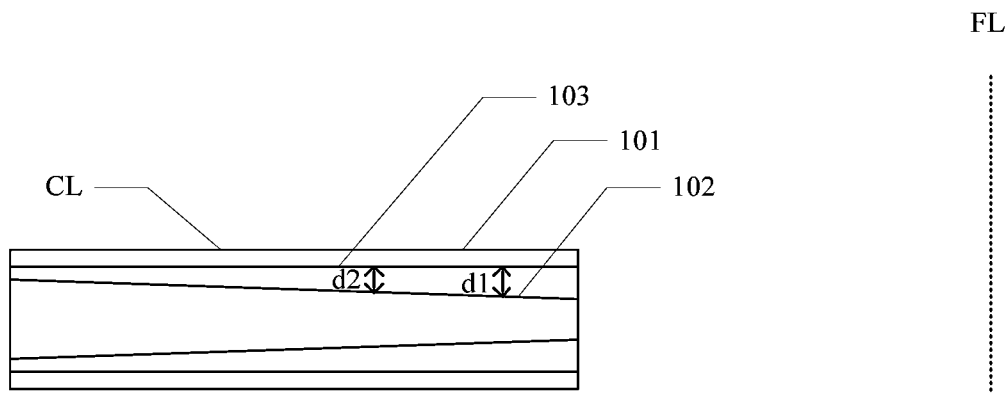
FIG. 22A is a top view of a horizontally arranged connecting line in FIG. 21.

FIG. 22A is a top view of the horizontally arranged connecting line in FIG. 21. The conductive member shown in FIG. 22A may be any one of the first connecting line CNL1, the second connecting line CNL2, the third connecting line CNL3 and the fourth connecting line CNL4 shown in FIG. 21. For example, in order to reduce the risk of electrostatic breakdown, a distance d1 of a portion of the third conductive sub-layer 103 of the conductive member CL close to the foldable line FL that is beyond the second surface S2 is greater than a distance d2 of a portion of the third conductive sub-layer 103 of the conductive member CL away from the foldable line FL that is beyond the second surface S2. That is, the third conductive sub-layer 103 at different positions of the same conductive member extends beyond the second surface S2 by different distances.

Figure 22B:
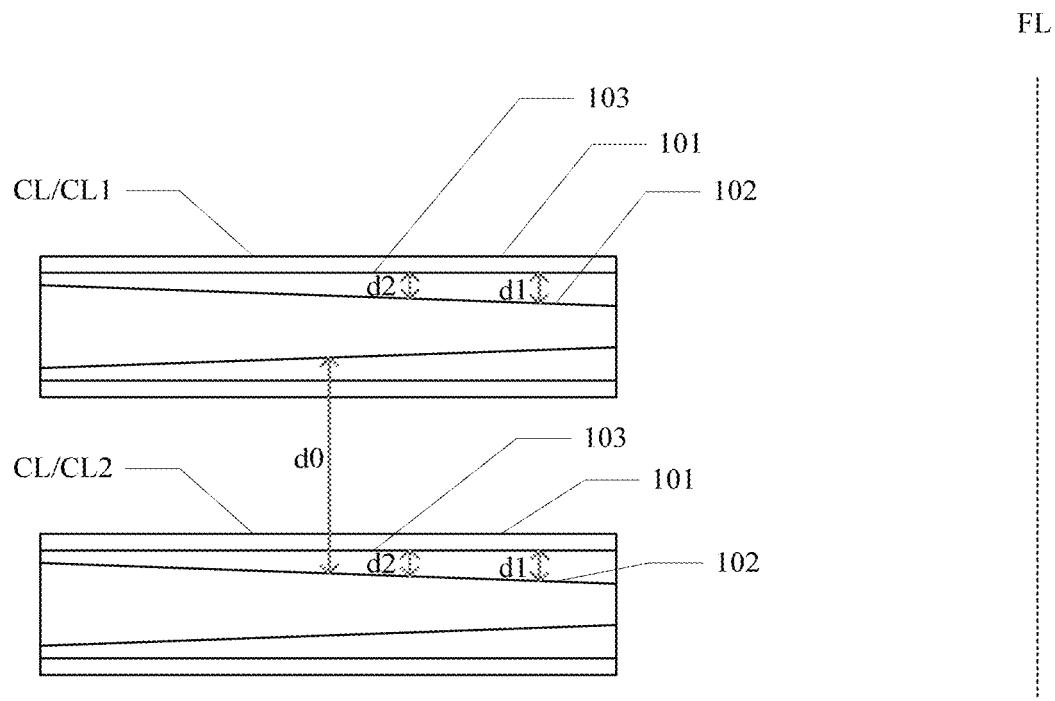
FIG. 22B is a top view of two adjacent connecting lines horizontally arranged in FIG. 21.

FIG. 22B is a top view of two adjacent connecting lines horizontally arranged in FIG. 21. As shown in FIG. 22B, a distance d0 between second surfaces S2 of the first conductive member CL1 and of the second conductive member CL2 gradually decreases in a direction from a position close to the foldable line FL to a position away from the foldable line FL.

Figure 23:
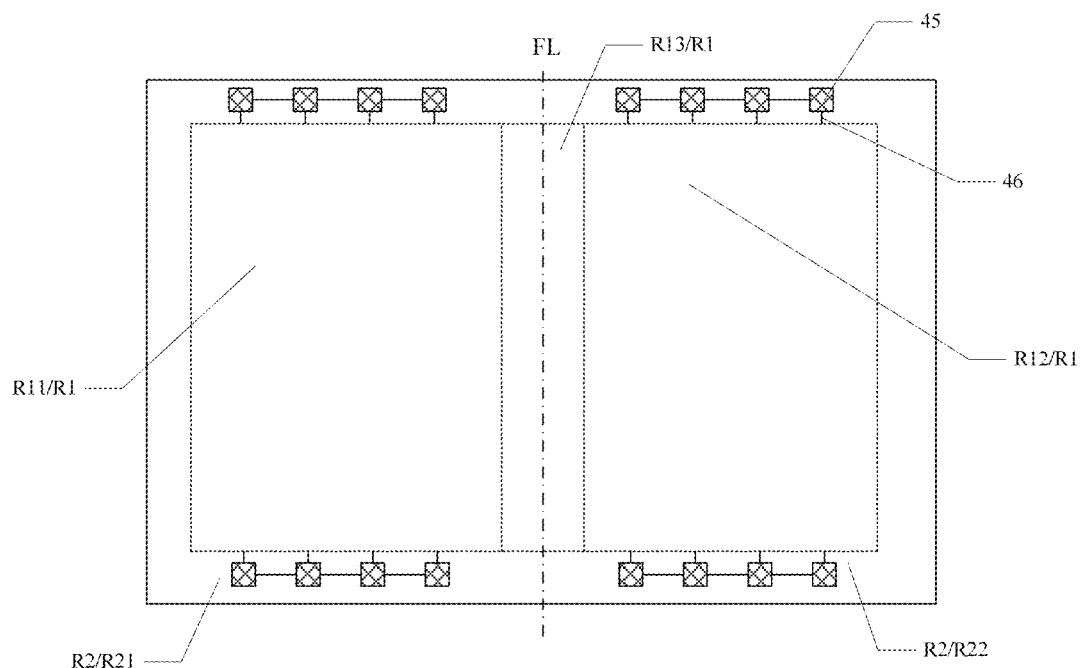
FIG. 23 is a plan view of a foldable display device including a display panel provided by another embodiment of the present disclosure.

FIG. 23 is a plan view of a foldable display device including a display panel provided by another embodiment of the present disclosure. In the foldable display device shown in FIG. 20, signal lines 46 and GOA unit circuits 45 are located at the left side and the right side of the display device, respectively. As compared with the foldable display device shown in FIG. 20, the signal lines 46 and the GOA unit circuits 45 in FIG. 23 are located at the upper side and the lower side of the display device, respectively.

Figure 24:
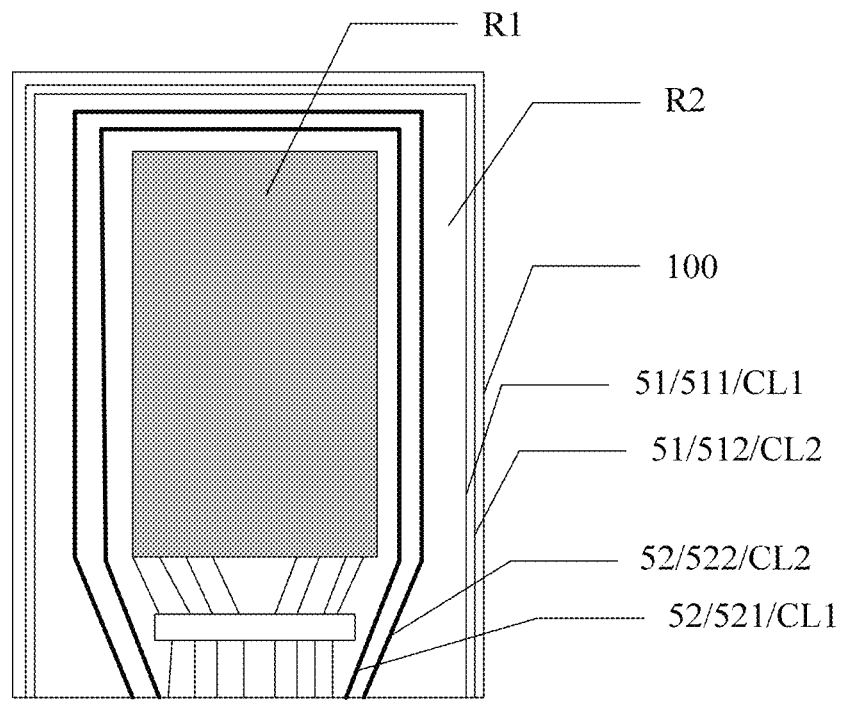
FIG. 24 is a schematic plan view of a display panel according to an embodiment of the present disclosure.

FIG. 24 is a schematic plan view of a display panel according to an embodiment of the present disclosure. As shown in FIG. 24, the display panel includes a base substrate 100 which is divided into two areas. For example, the base substrate 100 includes a display area R1 and a peripheral area R2 located on at least one side of the display area R1. For example, the peripheral area R2 may be located at least one of the upper side, the lower side, the left side and the right side of the display area R1. FIG. 24 shows that the peripheral area R2 is located at the upper side, lower side, left side and right side of the display area R1, that is, the peripheral area R2 surrounds the display area R1. For example, the peripheral area R2 may be located only at one side of the display area R1, for example, only at the upper side, lower side, left side or right side of the display area R1. In FIG. 24, the area filled with gray color is the display area R1, and the rest of the base substrate 100 is the peripheral area R2. For example, in the embodiment of the present disclosure, the display area R1 is an image display area, i.e., a light-emitting area. For example, the peripheral area R2 is an area where no image is displayed, i.e., a non-light-emitting area.

As shown in FIG. 24, in the peripheral area R2, a crack blocking line 51 is provided to block an edge crack from spreading to the display area R1. The crack blocking line 51 includes a first crack blocking line 511 and a second crack blocking line 512. In the peripheral area R2, a crack detecting line 52 configured to detect a crack is also provided. The crack detecting line 52 includes a first crack detecting line 521 and a second crack detecting line 522. The crack detecting line 52 is closer to the display area R1 than the crack blocking line 51. If a crack is detected by the crack detecting line 52, it can prevent products with edge cracks from flowing into the market. For example, during the process of cutting a display panel mother board into a plurality of individual display panels, during transportation, or when the display panels are subjected to mechanical shock or thermal shock, cracks may be occurred at edges of layers such as inorganic layers on the base substrate 100.

The first conductive member CL1 and the second conductive member CL2 in the display panel provided by the embodiment of the present disclosure may be the first crack blocking line 511 and the second crack blocking line 512, respectively; or, the first conductive member CL1 and the second conductive member CL2 may be the first crack detecting line 521 and the second crack detecting line 522, respectively.

As shown in FIG. 24, in order to reduce the risk of electrostatic breakdown, the distance of the third conductive sub-layer 103 extending beyond the second surface S2 in the first conductive member CL1 close to the display area R1 is smaller than the distance of the third conductive sub-layer 103 extending beyond the second surface S2 in the second conductive member CL2 away from the display area R1.

For example, the display panel has a characterized area, and two conductive members CL insulated from each other are provided. The two conductive members CL include a first conductive member CL1 and a second conductive member CL2. The first conductive member CL1 is closer to the characterized area than the second conductive member CL2. The size of the third conductive sub-layer 103 protruding from the second surface S2 in the first conductive member CL1 is larger than the size of the third conductive sub-layer 103 protruding from the second surface S2 in the second conductive member CL2. For example, the characterized area includes at least one of a transparent area, a foldable area and a display area.

Hereinafter, description will be given with reference to the case where the first conductive member CL1 and the second conductive member CL2 are the first power line (power supply voltage line) ELVDD and the data line, respectively, by way of example, in conjunction with FIGS. 25 to 28.

Figure 25:
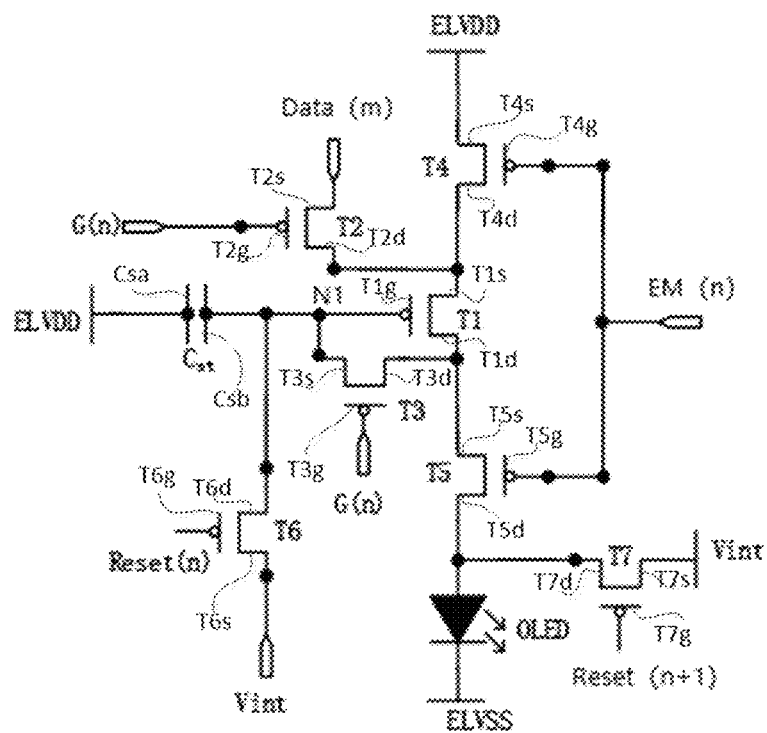
FIG. 25 is a circuit diagram of a pixel driving circuit in a pixel of a display panel according to an embodiment of the present disclosure.
Figure 28:
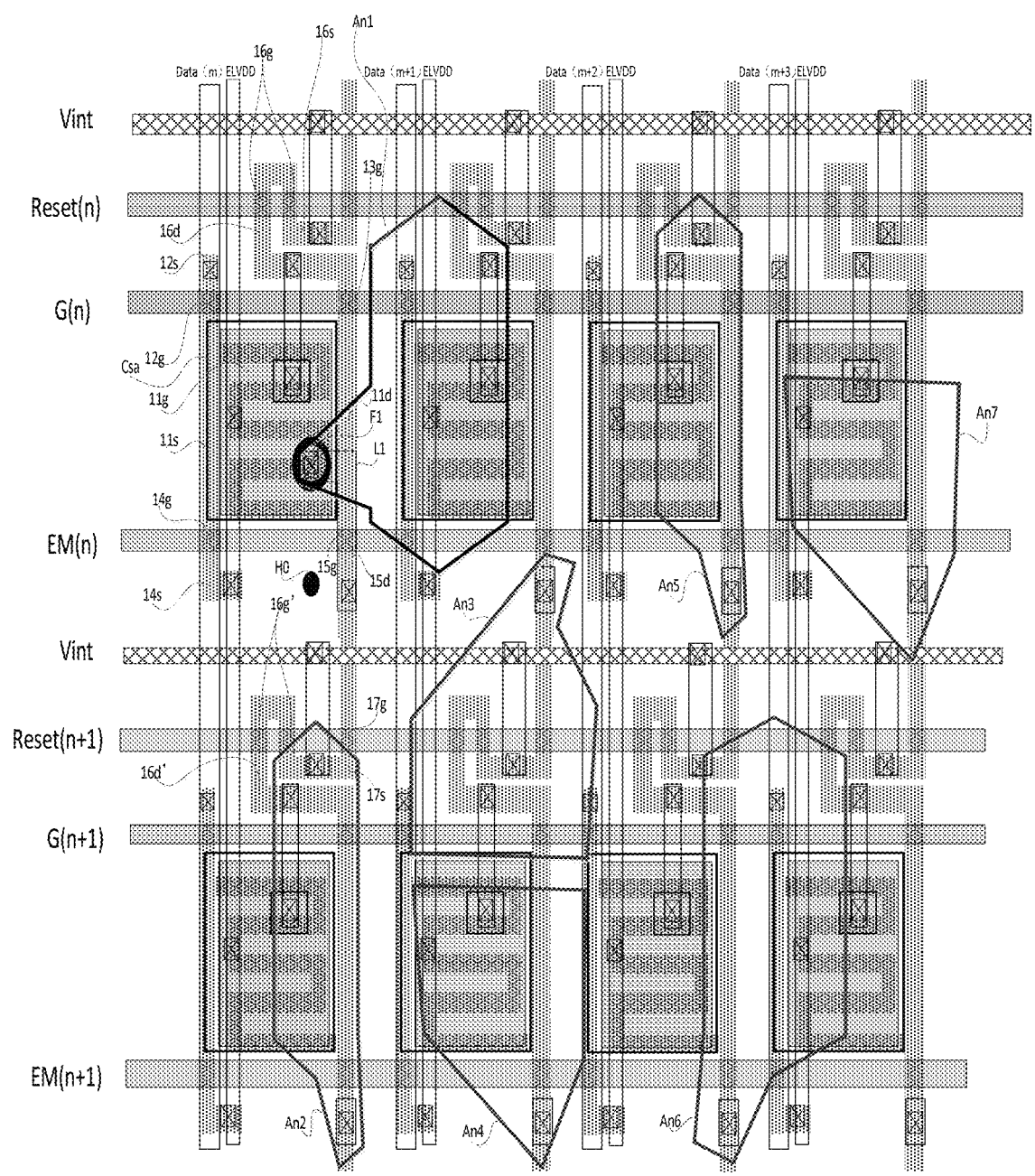
FIG. 28 is a layout diagram of a display panel according to an embodiment of the present disclosure.

The transistors adopted in FIG. 25 and FIG. 28 can be triodes, thin film transistors, field effect transistors or other devices with the same characteristics. In the embodiment of the present disclosure, in order to distinguish two electrodes of the transistor except the control electrode, one of the two electrodes is called the first electrode and the other one is called the second electrode.

For example, when the transistor is a triode, the control electrode may be a base electrode, the first electrode may be a collector electrode, and the second electrode may be an emitter electrode. Alternatively, the control electrode may be a base electrode, the first electrode may be an emitter electrode, and the second electrode may be a collector electrode.

For example, when the transistor is a thin film transistor or a field effect transistor, the control electrode may be a gate electrode, the first electrode may be a drain electrode, and the second electrode may be a source electrode. Alternatively, the control electrode may be a gate electrode, the first electrode may be a source electrode, and the second electrode may be a drain electrode.

The display panel shown in FIG. 28 includes an array layer located on the base substrate and a light-shielding layer at a side of the array layer away from the base substrate; a plurality of imaging holes is formed in the light-shielding layer, and a first orthographic projection of the imaging hole on the base substrate has no overlap with a second orthographic projection of an active layer pattern of a switching transistor in the array layer on the base substrate. The switching transistor is a transistor connected to a gate electrode of a driving transistor in the array layer.

According to the display panel disclosed by the embodiment of the present disclosure, the imaging holes formed in the light-shielding layer are configured not to correspond to the active layer pattern of the switching transistor in the array layer, so that light rays passing through the imaging holes do not affect the active layer pattern of the switching transistor, thereby avoiding photo-induced leakage current of the switching transistor in an off state due to an irradiation of the light rays, and further avoiding affecting a potential of the gate electrode of the driving transistor and avoiding the problem of inaccurate display gray scales.

For example, the first orthographic projection having no overlap with the second orthographic projection means that, there is no overlapped part between the first orthographic projection and the second orthographic projection, without limiting the embodiment of the present disclosure thereto.

For example, the array layer may be a thin film transistor array layer, but is not limited thereto.

For example, the thin film transistor array layer may include an array layer and a second source-drain metal layer, and the second source-drain metal layer is reused as a light-shielding layer, without limiting the embodiment of the present disclosure thereto.

For example, an orthographic projection of a channel area in the active layer pattern of the controlling transistor in the array layer on the base substrate is a third orthographic projection, and an orthographic projection of a channel area in an active layer pattern of a driving transistor on the base substrate is a fourth orthographic projection.

An orthographic projection of the channel area in the active layer pattern of the switching transistor on the base substrate is a fifth orthographic projection.

For example, the shortest distance between an edge of the first orthographic projection and the fifth orthographic projection is greater than a distance between the edge of the first orthographic projection and the third orthographic projection.

For example, the shortest distance between the edge of the first orthographic projection and the fifth orthographic projection is greater than a distance between the edge of the first orthographic projection and the fourth orthographic projection.

For example, the controlling transistor is a transistor in the array layer other than the switching transistor and the driving transistor.

For example, the shortest distance between the edge of the first orthographic projection and the fifth orthographic projection is greater than the distance between the edge of the first orthographic projection and the third orthographic projection; the shortest distance between the edge of the first orthographic projection and the fifth orthographic projection is greater than the distance between the edge of the first orthographic projection and the fourth orthographic projection; and an imaging pinhole is far away from the channel area of the active layer pattern of the switching transistor; in this way, it prevents the channel area of the active layer pattern of the switching transistor from being irradiated by the light passing through the imaging pinhole.

For example, the display panel may include a first pixel area provided with an imaging pinhole, and a second pixel area not provided with an imaging pinhole. For example, the area of the first pixel area is larger than that of the second pixel area.

For example, a width-length ratio of the switching transistor in the first pixel area may be smaller than that of the switching transistor in the second pixel area, so as to reduce a current value of the photo-induced leakage current and further improve the accuracy of displaying gray scale, without limiting the embodiment of the present disclosure thereto.

For example, the first orthographic projection has no overlap with an orthographic projection of a metal pattern included in the array layer on the base substrate.

Furthermore, the imaging pinhole should not be blocked by the metal pattern, so as to improve the accuracy of fingerprint recognition based on pinhole imaging.

For example, a diameter of the imaging pinhole may be greater than or equal to 2 µm and less than or equal to 20 µm, without limiting the embodiment of the present disclosure thereto.

For example, the diameter of the imaging pinhole may be greater than or equal to 4 µm but less than or equal to 7 µm, without limiting the embodiment of the present disclosure thereto.

For example, the density of imaging holes can be flexibly adjusted according to the actual situations, and one imaging hole may be arranged in N pixel areas, where N is a positive integer.

For example, N may be greater than or equal to 3 and less than or equal to 10, without limiting the embodiment of the present disclosure thereto.

For example, the array layer may include an active layer, a gate insulating layer, a first gate metal layer, a first insulating layer, a second gate metal layer, an interlayer dielectric layer, a first source-drain metal layer and a second insulating layer, which are sequentially arranged between the base substrate and the light-shielding layer. The display panel also includes a planarization layer and an anode layer which are sequentially arranged on one side of the light-shielding layer away from the second insulating layer.

For example, the light-shielding layer includes a light-shielding pattern and a connecting pattern; the light-shielding pattern has an imaging pinhole.

For example, the first source-drain metal layer is electrically connected with the anode layer through a first via hole penetrating the second insulating layer, through the connecting pattern and through a second via hole penetrating the planarization layer. There is a light leakage gap arranged between the connecting pattern and the light-shielding pattern.

An orthographic projection of the light leakage gap on the base substrate is covered by the orthographic projection of the metal electrode included in the thin film transistor array layer on the base substrate.

For example, the light-shielding pattern and the connecting pattern are separated from each other, and the light-shielding pattern and the connecting pattern are insulated from each other.

For example, the display panel may be provided with a base substrate, an array layer, a light-shielding layer, a planarization layer and an anode layer, from bottom to top.

For example, the array layer may include an active layer, a gate insulating layer, a first gate metal layer, a first insulating layer, a second gate metal layer, an interlayer dielectric layer, a first source-drain metal layer and a second insulating layer which are arranged from bottom to top.

For example, the anode layer needs to be electrically connected with the first source-drain metal layer, so that the first source-drain metal layer is electrically connected with the anode layer through the first via hole penetrating the second insulating layer, through the connecting pattern and through the second via hole penetrating the planarization layer, by providing the connecting pattern separated from the light-shielding pattern in the light-shielding layer.

Because the light-shielding pattern is insulated from the connecting pattern, a light leakage gap through which light may be escaped is existed between the light-shielding pattern and the connecting pattern. Therefore, it can be configured such that the orthographic projection of the light leakage gap on the base substrate is covered by the orthographic projection of the metal electrode included in the array layer on the base substrate, so as to prevent the light escaped through the light leakage gap from affecting the fingerprint recognition based on pinhole imaging.

The metal electrode can be, for example, an upper plate of a storage capacitor, but is not limited thereto.

FIG. 25 is a circuit diagram of a pixel driving circuit in a pixel of a display panel according to an embodiment of the present disclosure.

As shown in FIG. 25, the pixel driving circuit may include a driving transistor T1, a first switching transistor T3, a second switching transistor T6, a first controlling transistor T2, a second controlling transistor T4, a third controlling transistor T5, a fourth controlling transistor T7 and a storage capacitor Cst.

A source electrode T3s of the first switching transistor T3 is electrically connected to a gate electrode T1g of the driving transistor T1, and a drain electrode T3d of the first switching transistor T3 is electrically connected to a drain electrode T1d of the driving transistor T1.

A gate electrode T3g of the first switching transistor T3 is electrically connected to the $n_{th}$ row of gate line G(n).

A gate electrode Tog of the second switching transistor T6 is electrically connected to the nt row of reset line Reset (n), a drain electrode Tod of the second switching transistor T6 is electrically connected to the gate electrode T1g of the driving transistor T1, and a source electrode T6s of the second switching transistor T6 is electrically connected to an initial voltage line Vint.

A gate electrode T2g of the first controlling transistor T2 is electrically connected to the nu row of gate line G(n), a source electrode T2s of the first controlling transistor T2 is electrically connected to the $m_{th}$ column of data line D(m), and a drain electrode T2d of the first controlling transistor T2 is electrically connected to a source electrode T1s of the driving transistor T1.

A gate electrode T4g of the second controlling transistor T4 is electrically connected to the $n_{th}$ row of light emission control line EM(n), a source electrode T4s of the second controlling transistor T4 is electrically connected to the first power line ELVDD, and a drain electrode T4d of the second controlling transistor T4 is electrically connected to the source electrode T1s of the driving transistor T1.

A gate electrode T5g of the third controlling transistor T5 is electrically connected to the $n_{th}$ row of light emission control line EM(n), a source electrode T5s of the third controlling transistor T5 is electrically connected to the drain electrode T1d of the driving transistor T1, a drain electrode T5d of the third controlling transistor T5 is electrically connected to an anode of the organic light emitting diode OLED, and a cathode of the organic light emitting diode OLED is electrically connected to the second power line ELVSS.

A gate electrode T7g of the fourth controlling transistor T7 is electrically connected to the $n+1_{th}$ row of reset line Reset (n+1), a drain electrode T7d of the fourth controlling transistor T7 is electrically connected to the anode of the organic light emitting diode OLED, and a source electrode T7s of the fourth controlling transistor T7 is electrically connected to the initial voltage line Vint.

The first plate Csa of the storage capacitor Cst is electrically connected to the first power line ELVDD, and the gate electrode T1g of the driving transistor T1 can be reused as the second plate Csb of the storage capacitor Cst.

For example, n is a positive integer and m is a positive integer.

The pixel driving circuit shown in FIG. 25 may be a pixel driving circuit in the pixel area of the $n_{th}$ row and the $m_{th}$ column, but is not limited thereto.

In the pixel driving circuit shown in FIG. 25, all the transistors are p-type thin film transistors, but are not limited to this.

In FIG. 25, a first node N1 is a node electrically connected to the gate electrode of the driving transistor T1.

The pixel driving circuit shown in FIG. 25 is only one embodiment of the pixel driving circuit in the pixel, without limiting the structure of the pixel driving circuit thereto.

For example, the second switching transistor T6 can be a double-gate transistor to reduce its leakage current and well maintain the potential of the gate electrode of the driving transistor T1, without limiting the embodiment of the present disclosure thereto.

Figure 26:
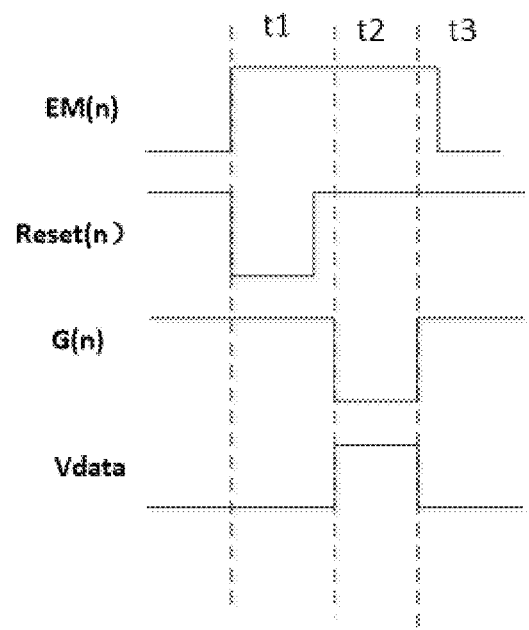
FIG. 26 is a working sequence diagram of the pixel driving circuit shown in FIG. 25.

FIG. 26 is a working sequence diagram of the pixel driving circuit shown in FIG. 25. In the figure, t1 is a first stage, t2 is a second stage, t3 is a third stage, and a data voltage supplied for the data line D (n) is labeled with Vdata.

As shown in FIG. 26, the description of the pixel driving circuit shown in FIG. 26 in operation is as follows.

In the first stage t1 (i.e., the reset stage), Reset (n) is input with low level, G(n) is input with high level, EM(n) is input with high level, the second switching transistor T6 is turned on, and the potential of the gate electrode of the driving transistor T1 is reset to the initial voltage.

In the second stage t2 (i.e., data writing and threshold voltage compensating stage), Reset (n) is input with high level, G(n) is input with low level, Data (m) is input with data voltage Vdata, EM(n) is input with high level; the second switching transistor T6 is turned off; the second controlling transistor T4 and the third controlling transistor T5 are turned off; the first controlling transistor T2, the first switching transistor T3, the driving transistor T1 and the fourth controlling transistor T7 are turned on; Cst is charged by Vdata through the first controlling transistor T2, the driving transistor T1 and the first switching transistor T3 to raise the potential of the gate electrode of the driving transistor T1 until the potential of the gate electrode of the driving transistor T1 becomes Vdata+Vth (Vth is the threshold voltage of the driving transistor T1); the first switching transistor T3 is turned off; the potential of N1 is stored by Cst; and the fourth controlling transistor T7 is turned on, so as to reset the potential of the anode of OLED to the initial voltage.

In the third stage t3 (i.e., light-emitting stage), Reset (n) is input with high level, G(n) is input with high level, EM(n) is input with low level; the driving transistor T1, the first controlling transistor T2, the first switching transistor T3, the second switching transistor T6 and the fourth controlling transistor T7 are turned off; the second controlling transistor T4 and the third controlling transistor T5 are turned on; the OLED emits light, and the driving transistor T1 drives OLED to emit light with a driving current $I=(1/2)K(Vdata-Vdd)^2$, wherein k is a current coefficient, and Vdd is a voltage value of the power supply input by ELVDD.

In the pixel driving circuit shown in FIG. 25, the source electrode T3s of the first switching transistor T3 is electrically connected with the gate electrode T1g of the driving transistor T1, and the drain electrode T6d of the second switching transistor T6 is electrically connected with the gate electrode T1g of the driving transistor T1. If light is irradiated on the first switching transistor T3 and the second switching transistor T6, there may be a photo-induced leakage current in the first switching transistor T3 and the second switching transistor T6 even when they are turned off, thus affecting the potential of the gate electrode T1g of the driving transistor t1 and causing inaccurate display gray scales. According to the display panel with integrated pinhole imaging function provided by the embodiment of the disclosure, the setting position and mode of the imaging pinhole are adjusted, so that the accuracy of fingerprint identification based on pinhole imaging is ensured, and the influence on the display quality and display accuracy caused by the imaging pinhole is reduced.

For example, a specific fingerprint recognition area can be separately provided on the display panel, or the whole screen can be a fingerprint recognition area.

In an embodiment of the present disclosure, the display panel may include a base substrate, a buffer layer, an array layer, a second source-drain metal layer, a planarization layer, an anode layer, a pixel defining layer, a light emitting layer and a cathode layer arranged from bottom to top. The array layer includes an active layer, a gate insulating layer, a first gate metal layer, a first insulating layer, a second gate metal layer, an interlayer dielectric layer, a first source-drain metal layer and a second insulating layer which are sequentially arranged from bottom to top.

The first gate metal layer is configured to form the gate line, the light emission control line, and the gate electrode of the transistor in the pixel driving circuit.

The second gate metal layer is configured to form the electrode plate of the storage capacitor and the initial voltage line.

The first source-drain metal layer is configured to form the data line, the first power line, the source electrode of the transistor in the pixel driving circuit, the drain electrode of the transistor in the pixel driving circuit, and the like.

The second source-drain metal layer is reused as the light-shielding layer, and the imaging pinhole is formed in the light-shielding layer.

For example, because the anode layer needs to be electrically connected with the first source-drain metal layer to complete the circuit structure, it is necessary to configure that, the second source-drain metal layer (i.e., the light-shielding layer) further includes a connecting pattern, and the first source-drain metal layer is electrically connected with the anode layer through a first via hole penetrating the second insulating layer, through the connecting pattern and through a second via hole penetrating the planarization layer.

For example, the active layer pattern may include a channel area, a source area, and a drain area. The channel area may not be doped with impurities, and hence has semiconductor characteristics. The source area is disposed on a first side of the channel area, and the drain area is disposed on a second side of the channel area. The first side and the second side are opposite sides, and are doped with impurities and hence have conductive characteristics. Impurities may vary depending on whether the transistor is an n-type transistor or a p-type transistor.

For example, the doped source area may correspond to the source electrode of the transistor, and the doped drain area may correspond to the drain electrode of the transistor.

Figure 27:
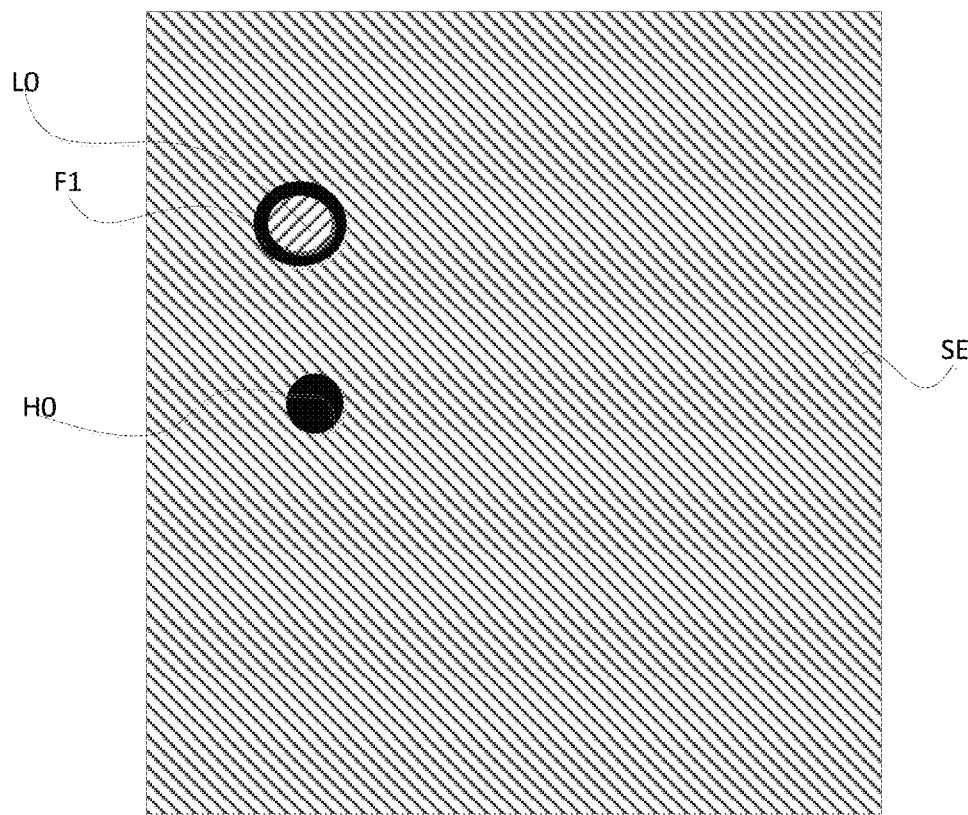
FIG. 27 is a schematic diagram of a second source-drain metal layer in a display panel according to an embodiment of the present disclosure.

FIG. 27 is a schematic diagram of a second source-drain metal layer in a display panel according to an embodiment of the present disclosure. In FIG. 27, the reference sign L0 indicates the connecting pattern included in the second source-drain metal layer; the reference sign SE indicates the light-shielding pattern included in the second source-drain metal layer; the reference sign H0 indicates the imaging pinhole; and the reference sign F1 indicates the light leakage gap. A connecting pattern L1 included in the first source-drain metal layer is used for electrical connection between the drain electrode of the third controlling transistor T5 and the connecting pattern L0 included in the second source-drain metal layer. The connecting pattern L0 included in the second source-drain metal layer is used for electrical connection between the connecting pattern L1 included in the first source-drain metal layer and the anode layer.

FIG. 28 is a layout diagram of a display panel according to an embodiment of the present disclosure. In FIG. 28, the reference sign Data (m) indicates the $m_{th}$ column of data line, the reference sign Data (m+1) indicates the $m+1_{th}$ column of data line, the reference sign ELVDD indicates the first power line, the reference sign Vint indicates the initial voltage line, the reference sign Reset (n) indicates the nu row of reset line, the reference sign Reset (n+1) indicates the $n+1_{th}$ row of reset line, the reference sign EM(n) indicates the nu row of light emission control line, the reference sign EM(n+1) indicates the $n+1_{th}$ row of light emission control line, the reference sign G(n) indicates the $n_{th}$ row of gate line, and the reference sign G(n+1) indicates the $n+1_{th}$ row of gate line.

In FIG. 28, the reference sign 16g indicates the channel area of the active layer pattern of the second switching transistor T6; the reference sign 16s indicates the source area of the active layer pattern of the second switching transistor T6; the reference sign 16d indicates the drain area of the active layer pattern of the second switching transistor T6; the reference sign 13g indicates the channel area of the active layer pattern of the first switching transistor T3; the reference sign 11g indicates the channel area of the active layer pattern of the driving transistor T1, the reference sign 11d indicates the drain area of the active layer pattern of the driving transistor T1, the reference sign 11s indicates the source area of the active layer pattern of the driving transistor T1; the reference sign 12g indicates the channel area of the active layer pattern of the first controlling transistor T2, the reference sign 12s indicates the source area of the active layer pattern of the first controlling transistor T2; the reference sign 14g indicates the channel area of the active layer pattern of the second controlling transistor T4, the reference sign 14s indicates the source area of the active layer pattern of the second controlling transistor T4; the reference sign 15g indicates the channel area of the active layer pattern of the third controlling transistor T4, the reference sign 15d indicates the drain area of the active layer pattern of the third controlling transistor T5; the reference sign 17g indicates the channel area of the active layer pattern of the fourth controlling transistor T7, the reference sign 17s indicates the source area of the active layer pattern of the fourth controlling transistor T7; the reference sign Csa indicates the first plate of the storage capacitor Cst; the reference sign 16g' indicates the channel area of the active layer pattern of the second switching transistor in the pixel area of the $n+1_{th}$ row and the $m_{th}$ column, and the reference sign 16d' indicates the drain area of the active layer pattern of the second switching transistor in the pixel area of the $n+1_{th}$ row and $m_{th}$ column.

In FIG. 28, the reference sign H0 indicates an imaging pinhole, the orthographic projection of H0 on the base substrate has no overlap with the orthographic projection of the active layer pattern of the first switching transistor T3, has no overlap with the orthographic projection of the active layer pattern of the second switching transistor T6, and has no overlap with the orthographic projection of the active layer pattern of the second switching transistor in the pixel area of the $(n+1)_{th}$ row and the $m_{th}$ column. Therefore, the active layer patterns of the first switching transistor T3, of the second switching transistor T6 and of the second switching transistor in the pixel area of the $(n+1)_{th}$ row and the $m_{th}$ column are not irradiated by the light passing through the imaging pinhole H0, so as to avoid the photo-induced leakage current of each switching transistor in the off state caused by the irradiation of the light, thereby avoiding affecting the potential of the gate electrode of the driving transistor T1 and avoiding the problem of inaccurate display gray scales.

In FIG. 28, a distance d1 between the edge of the orthographic projection of H0 on the base substrate and 16g' is larger than a distance d2 between the edge of the orthographic projection of H0 on the base substrate and 15g.

In FIG. 28, the shortest distance between the edge of the orthographic projection of H0 on the base substrate and the active layer of the first switching transistor T3 is larger than the distance between the edge of the orthographic projection of H0 on the base substrate and the active layer of any transistor except the first switching transistor T3 and the second switching transistor T6; the shortest distance between the edge of the orthographic projection of H0 on the base substrate and the active layer of the second switching transistor T6 is larger than the distance between the edge of the orthographic projection of H0 on the base substrate and the active layer of any transistor except the first switching transistor T3 and the second switching transistor T6.

Further, in the display panel shown in FIG. 28, 11d is connected with the source area of the active layer pattern of the third controlling transistor T5; 15d is connected with the drain area of the active layer pattern of the fourth controlling transistor T7; 16d is connected with the source area of the active layer pattern of the first switching transistor T3; 11s is connected with the drain area of the active layer pattern of the second controlling transistor T4; 11d is connected with the drain area of the active layer pattern of the third controlling transistor T5; and 11s is connected with the drain area of the active layer pattern of the first controlling transistor T2.

For example, the reference sign Tog' indicates the gate electrode of the second switching transistor in the pixel area of the $(n+1)_{th}$ row and the $(m)_{th}$ column.

In FIGS. 25 and 28, the reference sign T1g indicates the gate electrode of the driving transistor T1, the reference sign T2g indicates the gate electrode of the first controlling transistor T2, the reference sign T3g indicates the gate electrode of the first switching transistor T3, the reference sign T4g indicates the gate electrode of the second controlling transistor T4, the reference sign T5g indicates the gate electrode of the third controlling transistor T5, the reference sign T6g indicates the gate electrode of the second switching transistor T6, and the reference sign T7g indicates the gate electrode of the fourth controlling transistor T7.

In FIG. 25 and FIG. 28, the cross mark enclosed by the squared box indicates the via hole.

In FIG. 28, the vertical line in the longitudinal direction, except the data line and the first power line, is the connecting line.

The display panel provided by the embodiment of the disclosure shown in FIG. 28 designs the position of the imaging pinhole, which reduces the influence of the pinhole imaging system on the display quality, especially the display accuracy, and improves the display quality while maintaining the identification accuracy of the pinhole imaging.

As shown in FIG. 28, the reference sign An1 indicates the first anode included in the anode layer, the reference sign An2 indicates the second anode included in the anode layer, the reference sign An3 indicates the third anode included in the anode layer, and the reference sign An4 indicates the fourth anode included in the anode layer.

The first anode An1 included in the anode layer is electrically connected with the drain electrode of the third controlling transistor T5 through the connecting pattern L0 included in the second source-drain metal layer and through the connecting pattern L1 included in the first source-drain metal layer.

FIG. 28 shows the $m+2_{th}$ column of data line Date (m+2), the $m+3_{th}$ column of data line Date (m+3), and two columns of first power lines, and also shows the fifth anode An5, the sixth anode An6 and the seventh anode An7 included in the anode layer.

In FIG. 28, An1 may be the anode of a blue organic light emitting diode, An5 may be the anode of a red organic light emitting diode, and An7 may be the anode of a green organic light emitting diode, without limiting the embodiment of the present disclosure thereto.

In FIG. 28, an imaging pinhole H0 is provided in a pixel area surrounded by Reset (n), Reset (n+1), D(m) and D(m+1), but is not limited thereto.

For example, there needs to be a certain distance between the imaging pinhole H0 and the connecting pattern L0, and the orthographic projection of the light leakage gap F1 between the connecting pattern L0 and the light-shielding pattern SE on the base substrate needs to be covered by the orthographic projection of the metal electrode (such as the electrode plate of the storage capacitor) included in the array layer on the base substrate. However, due to the limitation of manufacturing accuracy, the width of the light leakage gap F1 cannot be made infinitely narrow. The radius of the imaging pinhole H0, the size of the connecting pattern L0 and the distance between the imaging pinhole H0 and the connecting pattern L0 are also limited by the manufacturing accuracy and cannot be made infinitely small. Therefore, the area of each pattern in the pixel area provided with the imaging pinhole can be appropriately enlarged as compared with the area of each pattern in the pixel area without the imaging pinhole, so as to ensure that the orthographic projection of the light leakage gap F1 between the connecting pattern L0 and the light-shielding pattern SE on the base substrate is covered by the orthographic projection of the metal electrode (e.g., the electrode plate of the storage capacitor) included in the array layer on the base substrate.

The manufacturing method of the display panel provided by the embodiment of the present disclosure shown in FIG. 28 may include: forming an array layer on a base substrate; forming a light-shielding layer on one side of the array layer away from the base substrate; and forming a plurality of imaging holes in the light-shielding layer. The first orthographic projection of the imaging pinhole on the base substrate has no overlap with the second orthographic projection of the active layer pattern of the switching transistor in the array layer on the base substrate. The switching transistor is a transistor connected to the gate electrode of the driving transistor in the array layer.

In the display panel provided by another embodiment of the present disclosure, both of the light-shielding layer and the imaging pinhole in the light-shielding layer may not be provided. The structure of the display panel provided by the embodiment of the present disclosure is not limited to that shown in FIG. 28.

Figure 29:
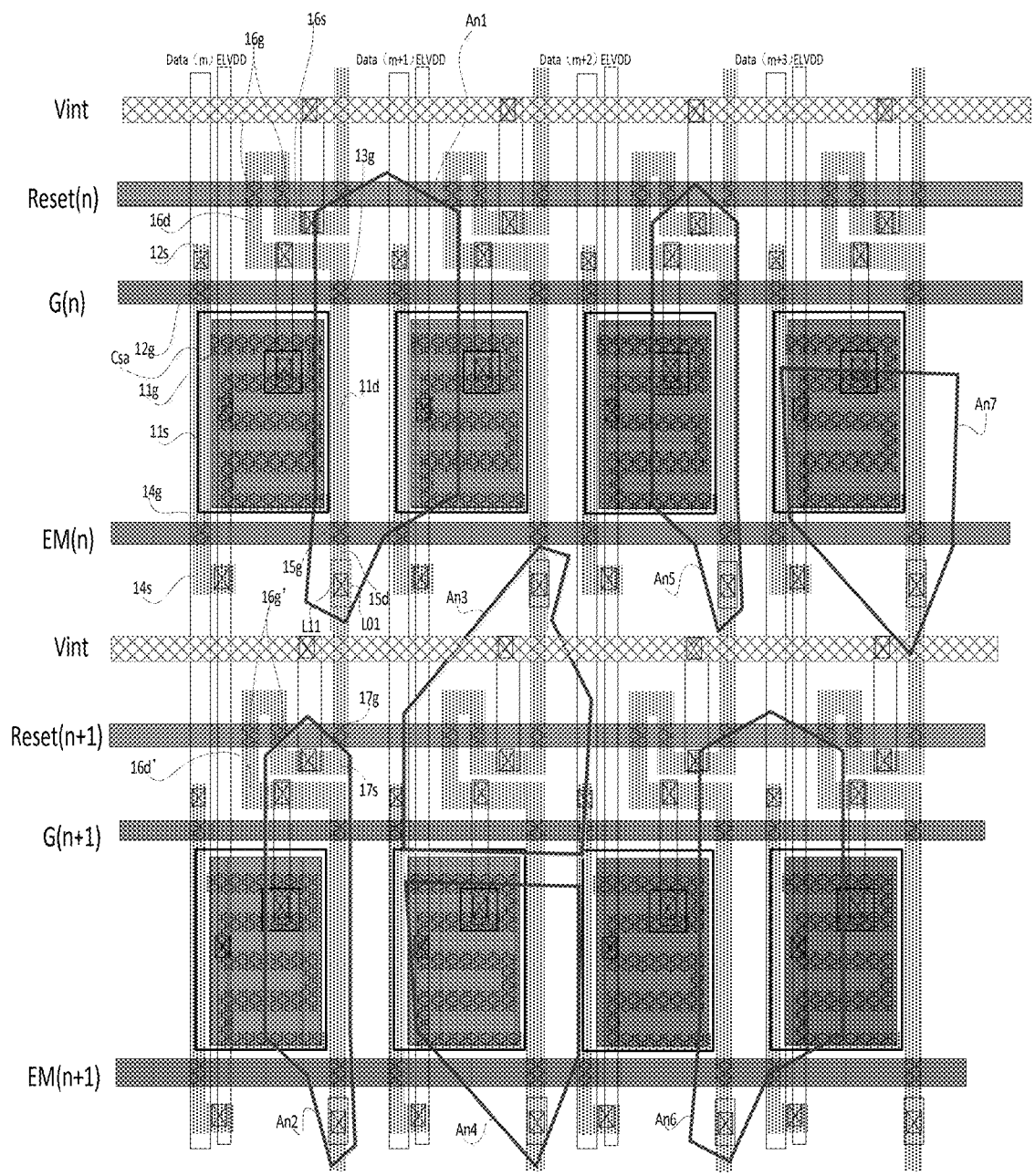
FIG. 29 is a layout diagram of a display panel according to an embodiment of the present disclosure.

FIG. 29 is a layout diagram of a display panel according to another embodiment of the present disclosure. Compared with the display panel shown in FIG. 28, the display panel shown in FIG. 29 has no imaging pinhole. The first anode An1 is electrically connected to the drain electrode of the third controlling transistor T5 through the connecting pattern L01 included in the second source-drain metal layer and through the connecting pattern L11 included in the first source-drain metal layer. Or, the second source-drain metal layer may not be provided, and the first anode An1 is electrically connected to the drain electrode of the third controlling transistor T5 through the connecting pattern L11 included in the first source-drain metal layer. Of course, other suitable settings can also be adopted.

Figure 30:
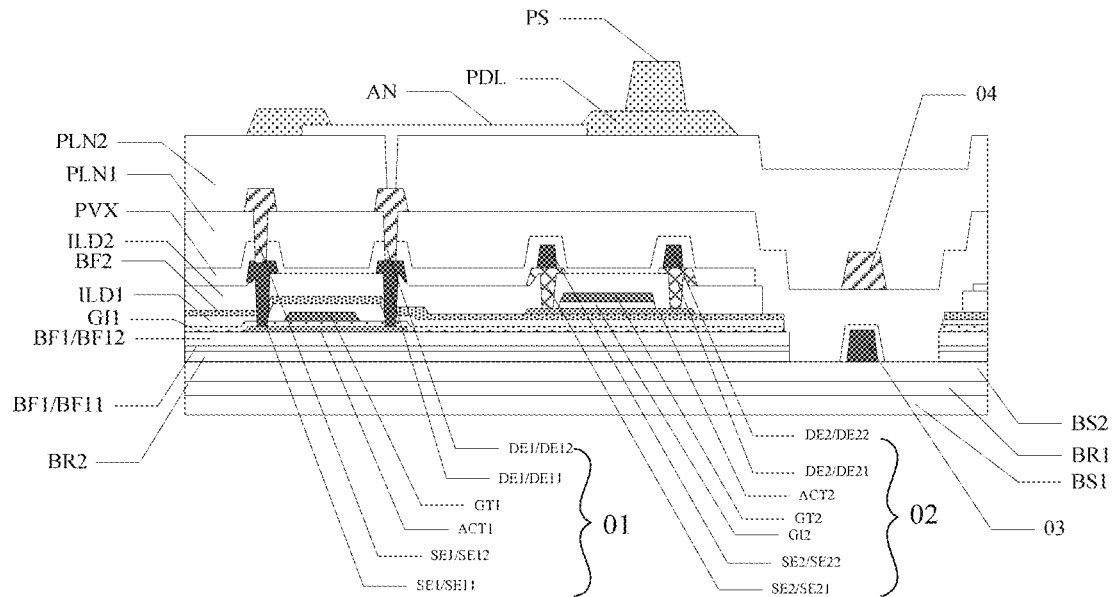
FIG. 30 is a sectional view of a display panel provided by an embodiment of the present disclosure.

FIG. 30 is a sectional view of a display panel provided by an embodiment of the present disclosure. As shown in FIG. 30, the display panel includes a first base substrate BS1, a first barrier layer BR1, and a second base substrate BS2. A first transistor 01 and a second transistor 02 are provided on the second substrate BS2. The first transistor 01 is connected to an anode AN.

As shown in FIG. 30, the first transistor 01 includes an active layer ACT1, a first gate insulating layer GI1, a first gate electrode GT1, a first source electrode SE1 and a first drain electrode DE1. The first source electrode SE1 includes two layers: a source electrode SE11 and a source electrode SE12. The first drain electrode DE1 includes two layers: a drain electrode DE11 and a drain electrode DE12.

As shown in FIG. 30, the second transistor 02 includes an active layer ACT2, a second gate insulating layer GI2, a second gate electrode GT2, a second source electrode SE2 and a second drain electrode DE2. The second source electrode SE2 includes two layers: a source electrode SE21 and a source electrode SE22. The second drain electrode DE2 includes two layers: a drain electrode DE21 and a drain electrode DE22.

As shown in FIG. 30, the display panel further includes a first interlayer dielectric layer ILD1, a second buffer layer BF2, a second interlayer dielectric layer ILD2, a passivation layer PVX, a first planarization layer PLN1, a second planarization layer PLN2, a pixel defining layer PDL and a supporting layer PS. The pixel defining layer PDL and the supporting layer PS can be formed from the same film layer by the same patterning process, without limiting the embodiment of the present disclosure thereto.

For example, referring to FIGS. 30 and 29, the drain electrode DE11 and the drain electrode DE12 in FIG. 30 may be the connecting pattern L11 and the connecting pattern L01 in FIG. 29, respectively.

For example, the first active layer ACT1 is a polysilicon semiconductor layer, the second active layer ACT2 is an oxide semiconductor layer, and the polysilicon semiconductor layer is closer to the base substrate. For example, the base substrate adopts a flexible substrate, and both the first base substrate BS1 and the second base substrate BS2 are flexible base substrates, for example, polyimide can be used, without limiting the embodiment of the present disclosure thereto. For example, the material of the first barrier layer BR1 may be SiOx, SiNx or a lamination thereof, and the thickness of the first barrier layer BR1 is between 400 nm and 800 nm. For example, other flexible plastic substrates can also be used as the base substrate. For example, the base substrate can also be made of glass or quartz material.

For example, a second barrier layer BR2 and a first buffer layer BF1 are further disposed between the second base substrate BS2 and the first transistor 01. The second barrier layer BR2 may adopt silicon oxide, but is not limited thereto. The first buffer layer BF1 may include a buffer layer BF11 and a buffer layer BF12. The buffer layer BF11 may adopt SiNx, and the buffer layer BF12 may adopt SiOx. The first buffer layer BF1 has a thickness of 600 nm-1000 nm. The thickness of the buffer layer BF11 is between 400 nm and 600 nm. The first buffer layer BF1 may also adopt a single layer instead of a lamination. The function of the buffer layer BF11 (SiNx) is to prevent impurity particles in the base substrate from entering the semiconductor area and affecting the characteristics of the transistor. At least one of the buffer layer BF11, the buffer layer BF12, the first barrier layer BR1 and the second barrier layer BR2 may be the barrier layer described above.

For example, the thickness of the first active layer ACT1 is 30 nm-70 nm, and a polysilicon semiconductor layer can be used as a channel of a driving transistor. For example, a light-shielding layer can be formed before the polysilicon is formed, and the polysilicon is formed after SiOx is formed on the light-shielding layer.

For example, the first gate insulating layer GI may adopt SiOx and may have a thickness of 80 nm-180 nm.

For example, the first gate electrode GT1 may adopt Mo, Ti, Cu or alloys thereof, and may have a thickness of 15 nm-350 nm.

For example, at the same time when the first gate electrode is formed, a conductive pattern is formed in the same layer as the oxide semiconductor area, and the conductive pattern can be used as a shielding layer for subsequent oxides to prevent from the characteristic degradation caused by light irradiation on the oxide semiconductor layer.

For example, the first interlayer insulating layer ILD1 can adopt a three-layered structure of SiOx, SiNx and SiOx. For example, the thickness of the first interlayer insulating layer ILD1 is 100 nm-350 nm, SiOx is close to the oxide semiconductor layer and has a thickness greater than that of SiNx so as to ensure oxide characteristics.

For example, the second buffer layer BF2 may adopt SiOx.

For example, the second active layer ACT2 has a thickness of 30 nm-60 nm and may adopt IGZO, but is not limited to this.

For example, the second gate insulating layer GI2 may adopt SiOx and may have a thickness of 100 nm-300 nm.

For example, the second gate electrode GT2 may adopt Mo, Ti, Cu or alloys thereof, and may have a thickness of 15 nm-350 nm.

For example, the first interlayer dielectric layer ILD1 and the second interlayer dielectric layer ILD2 may adopt at least one of SiOx and SiNx. For example, the first interlayer dielectric layer ILD1 may adopt a lamination of two layers of SiNx/SiOx, and the second interlayer dielectric layer ILD2 may adopt SiOx.

For example, the first gate insulating layer GI1 and the second gate insulating layer GI2 may adopt at least one of SiOx and SiNx.

For example, the passivation layer PVX may adopt SiOx, and may have a thickness of 200 nm-500 nm.

For example, the first planarization layer PLN1, the second planarization layer PLN2, the pixel defining layer PDL, and the supporting layer PS can all adopt polyimide, but are not limited to this.

As shown in FIG. 30, the arrangement of the source electrode SE21 and the source electrode SE22 can protect the second active layer ACT2, thereby improving the stability of the second transistor 02.

Organic functional layers and cathodes are formed on the structure shown in FIG. 30, and then encapsulated to form an OLED display device. A touch structure can also be formed on an encapsulation layer, and the touch structure can adopt a metal mesh, without limiting the embodiment of the present disclosure thereto.

FIG. 30 also shows a conductive member 03 and a conductive member 04. The conductive member 03 and the conductive member 04 may be the conductive members CL provided by the embodiment of the present disclosure, respectively. As shown in FIG. 30, the conductive member 03, the source electrode SE21, the drain electrode DE22, the source electrode SE11 and the drain electrode DE12 are formed from the same film layer by the same patterning process. As shown in FIG. 30, the conductive member 04, the source electrode SE12 and the drain electrode DE12 are formed from the same film layer by the same patterning process. For example, both the source electrode and the drain electrode are formed of metal or alloy materials.

Figure 31:
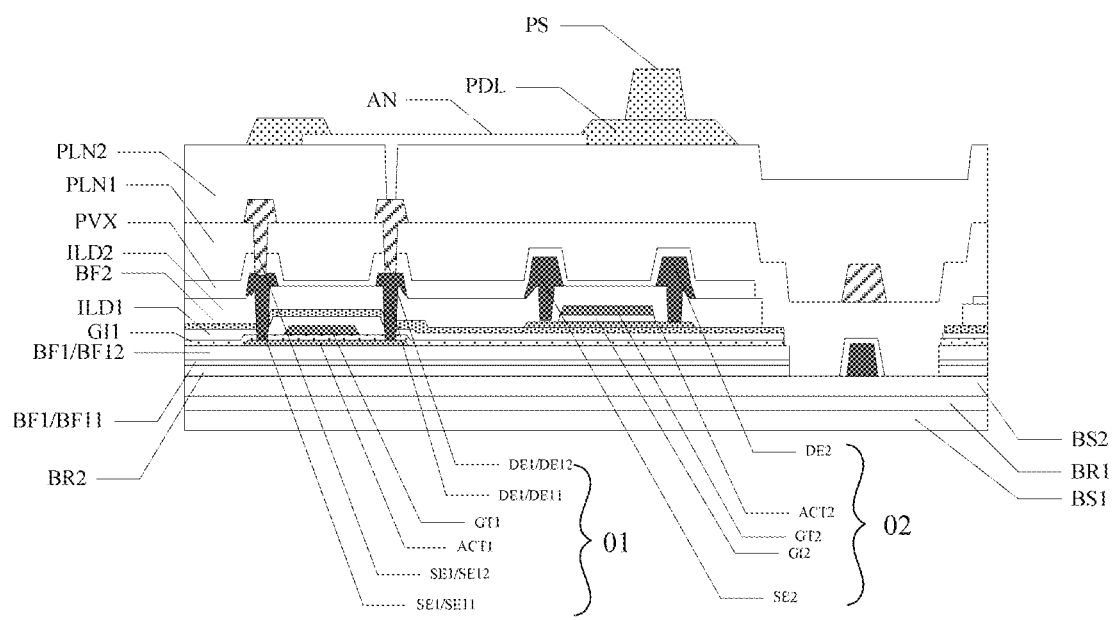
FIG. 31 is a sectional view of a display panel provided by another embodiment of the present disclosure.

FIG. 31 is a sectional view of a display panel according to another embodiment of the present disclosure. Compared with the display panel shown in FIG. 30, the display panel shown in FIG. 31 is not provided with the source electrode SE21 and the source electrode SE22.

The first conductive member CL1 and the second conductive member CL2 in the display panel provided by the embodiment of the present disclosure may be located in an area where the static electricity is highly generated, for example, a pad area. In order to ensure reducing the resistance, the third conductive sub-layer may not protrude from the second surface, i.e., a common conductive member is provided, in the area with little static electricity, for example, a pixel area. For example, the conductive member with the third conductive sub-layer protruding from the second surface has a boundary with the common conductive member, and the boundary is located outside the display area so as to prevent the static electricity from affecting the pixel area. The pad area includes at least one of a pad area for external connection with an external circuit, a pad area for array test and a pad area for bonding with a touch circuit, without limiting the embodiment of the present disclosure thereto.

It should be noted that, although the first conductive sub-layer 101, the second conductive sub-layer 102, and the third conductive sub-layer 103 in the illustration form a planar structure which is exactly parallel to the base substrate 100, the embodiments of the present disclosure are not limited thereto. According to the shape characteristic of the film beneath the conductive member, it can be naturally formed on an uneven surface and hence also has a surface which is not perfectly flat. In such an example, the above-described angle can also be understood as conforming to the corresponding angle formed by the surface of the conductive sub-layers, without limiting the embodiment of the present disclosure thereto.

Figure 33:
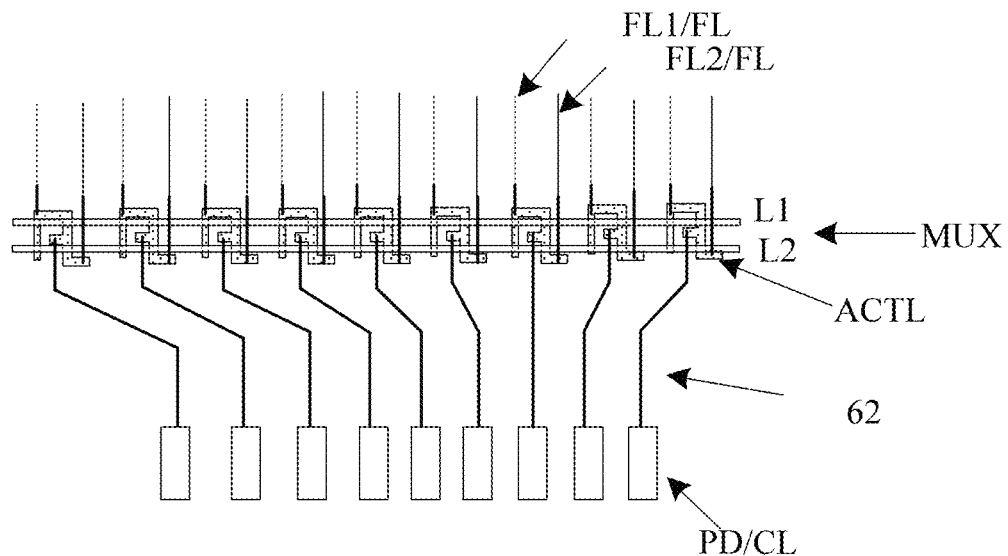
FIG. 33 is an enlarged schematic diagram of the data selector in FIG. 32.

FIG. 32 is a partial plan view of a display panel provided by an embodiment of the present disclosure. FIG. 33 is an enlarged schematic diagram of the data selector in FIG. 32. A display panel will be described below with reference to FIGS. 32 and 33.

For example, as shown in FIG. 32, the conductive member CL is electrically connected with the first conductive part 61; and the display panel shown in FIG. 32 is explained with reference to the case where the first conductive part 61 is the data line DL, and the conductive member CL is the pad PD, by way of example. The data line DL supplies a data voltage for each pixel unit SP. The pad PD is configured to be connected with an external circuit. The external circuit includes, but is not limited to, an integrated circuit (IC). The conductive member CL and the first conductive part 61 are formed from the same film layer by the same patterning process. For example, the conductive member CL and the first conductive part 61 are located in the first source-drain metal layer LY3.

For example, the insulating layer between adjacent conductive members includes a first organic material (e.g., epoxy resin); and the insulating layer between adjacent first conductive parts includes a second organic material (e.g., polyimide) or an inorganic material (e.g., SiOx or silicon oxide or a lamination thereof) which is different from the first organic material. For example, the dielectric constant of the first organic material is smaller than that of the second organic material or inorganic material.

For example, as shown in FIG. 32 and FIG. 33, the display panel further includes a second conductive part 62; the second conductive part 62 and the conductive member CL are arranged in different layers. For example, the second conductive part 62 and the conductive member CL are located in the same layer, but the embodiment of the present disclosure is not limited thereto.

For example, as shown in FIGS. 32 and 33, a plurality of first conductive parts 61 and a plurality of second conductive parts 62 are provided, with a first interval IN1 between adjacent conductive members CL and a second interval IN2 between adjacent first conductive parts 61; the first interval IN1 is different from the second interval IN2. For example, the first interval IN1 is smaller than the second interval IN2.

For example, as shown in FIG. 33, the length of the conductive member CL is smaller than the length of the first conductive part 61. In the embodiment of the present disclosure, the length of an element refers to the dimension along the extending direction of the element.

As shown in FIG. 32, the conductive member CL is connected to an expanding line FL, and the expanding line FL is connected to the data line DL. The expanding line FL is connected with the data line DL through a via hole penetrating through the insulating layer. The expanding line FL includes an expanding line FL1 and an expanding line FL2, for example, one of the expanding lines FL1 and FL2 is located in the first gate metal layer LY1, and the other one of the expanding lines FL1 and FL2 is located in the second gate metal layer LY2.

FIG. 32 also shows a first power line PL1 and a second power line PL2; a plurality of second power lines PL2 is connected to a bus 311; and the first power line PL1 and the second power line PL2 are also located in the first source-drain metal layer LY3.

FIG. 32 also shows a plurality of gate lines GL and a plurality of pixel units SP. The gate lines GL extend along the first direction DR1, and the data lines DL extend along the second direction DR2. The plurality of gate lines GL and the plurality of data lines DL are insulated from each other and cross each other to define a plurality of pixel units SP. The first power line PL1 is configured to supply a first power voltage to the pixel unit SP, and the second power line PL2 is configured to supply a second power voltage to the pixel unit SP. For example, the first power line PL1 is a VDD line, and the second power line PL2 is a VSS line. For example, the second power line PL2 is connected to the cathode of the light emitting diode.

As shown in FIG. 32, each pad PD is respectively connected to two expanding lines FL1 through a data selector MUX, and then electrically connected to two data lines DL. For example, after the data signal arrives at the data selector MUX, the first signal line L1 and the second signal line L2 are respectively controlled to open in different periods, so that the data signal is transmitted to the two data lines DL respectively connected with the data selector MUX. The setting mode of the data selector MUX can refer to the usual design. The data selector MUX is not limited to be connected with two data lines DL, and the number of the data lines DL connected to the data selector MUX may be determined as required.

Referring to FIGS. 32 and 33, each data selector MUX includes an active layer ACTL, a part of the active layer ACTL covered by the first signal line L1 and the second signal line L2 is a channel area, and a part of the active layer ACTL not covered by the first signal line L1 and the second signal line L2 is a conductor. A first end of the active layer ACTL is connected to one data line DL, a second end of the active layer ACTL is connected to another data line DL, and a third end of the active layer ACTL is connected to the pad PD through the second conductive part 62. The first end, the second end and the third end of the active layer ACTL are all located at the conductor part of the active layer ACTL, and can be connected with the active layer ACTL through an adapter (which can be located at the first source-drain metal layer).

The first conductive part 61 is not limited to the data line. For example, each pixel unit includes a pixel circuit layer disposed on the barrier layer, an organic electroluminescent element electrically connected with the pixel circuit layer, and a touch electrode disposed on a light exiting side of the organic electroluminescent element. The first conductive part 61 is any one of the pixel circuit layer, the organic electroluminescent element and the touch electrode.

Figure 34A:
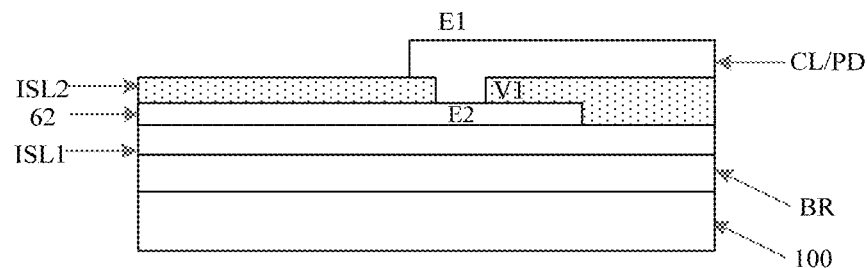
FIG. 34A is a partial cross-sectional view of a display panel according to an embodiment of the present disclosure.

FIG. 34A is a partial cross-sectional view of a display panel according to an embodiment of the present disclosure. FIG. 34A is a partial sectional view at the dashed circle B1 in FIG. 32. As shown in FIG. 34A, the base substrate 100 is provided with a barrier layer BR and an insulating layer ISL1, and the second conductive part 62 is located on the insulating layer ISL1. The conductive member CL has a first end E1, the second conductive part 62 has a second end E2, an insulating layer ISL2 is arranged between the first end E1 and the second end E2, the insulating layer ISL2 has a first via hole V1 exposing the second end E2, and the conductive member CL is connected with the second conductive part 62 through the first via hole V1. When the conductive member CL is located below the second conductive portion 62, the insulating layer ISL2 has a first via hole exposing the first end E1. In other embodiments, the second conductive part 62 may be located between the barrier layer BR and the insulating layer ISL1, so that the first via hole V1 penetrates the insulating layer ISL1 and the insulating layer ISL2.

Figure 34B:
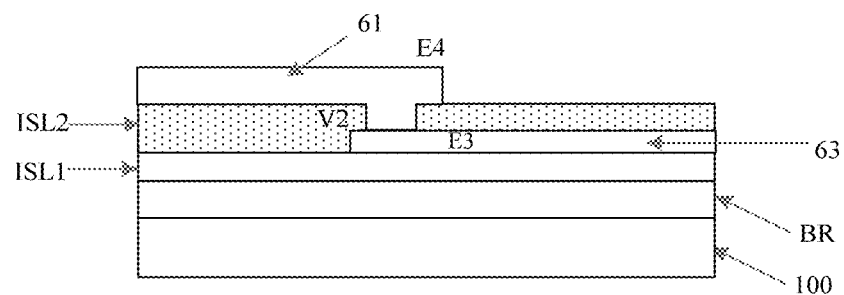
FIG. 34B is a partial sectional view of a display panel provided by an embodiment of the present disclosure.

FIG. 34B is a partial cross-sectional view of a display panel according to an embodiment of the present disclosure. FIG. 34B is a partial sectional view at the dashed circle B2 in FIG. 32. As shown in FIG. 32 and FIG. 34B, the display panel further includes a third conductive part 63, the conductive member CL is electrically connected with the third conductive part 63, the third conductive part 63 has a third end E3, the first conductive part 61 has a fourth end E4, an insulating layer ISL2 is provided between the third end E3 and the fourth end E4, the insulating layer ISL2 has a second via hole V2 exposing the third end E3, the first conductive part 61 is electrically connected with the third conductive part 63 through the second via hole V2. When the conductive member CL is located below the third conductive portion 63, the insulating layer ISL2 has a second via hole V2 exposing the fourth end. In other embodiments, the third conductive part 63 may be located between the barrier layer BR and the insulating layer ISL1, so that the first via hole V1 penetrates the insulating layer ISL1 and the insulating layer ISL2.

Figure 35:
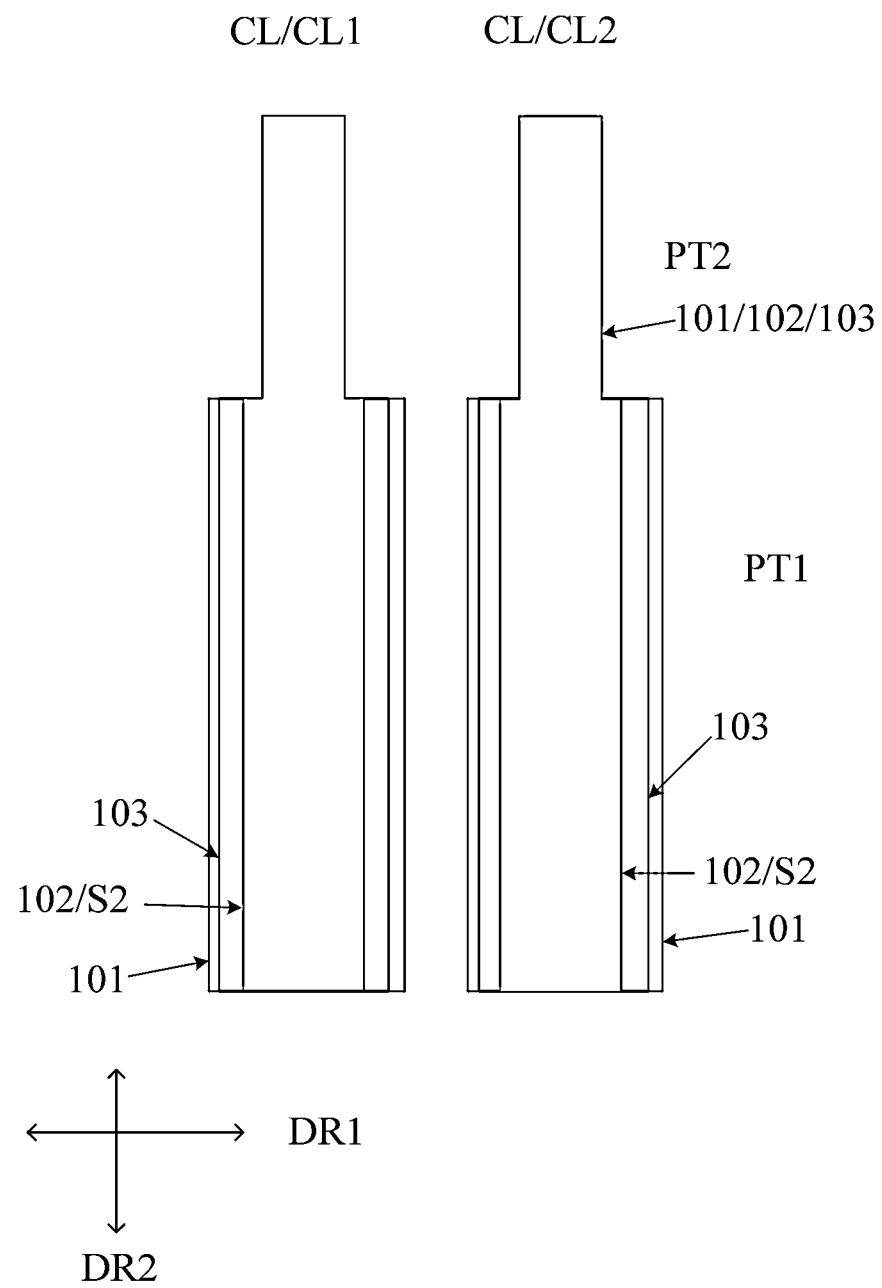
FIG. 35 is a partial top view of a display panel according to an embodiment of the present disclosure.

FIG. 35 is a partial top view of a display panel according to an embodiment of the present disclosure. For example, as shown in FIG. 35, the conductive member CL includes a first part PT1 and a second part PT2, the first part PT1 has a width larger than that of the second part PT2; the third conductive sub-layer 103 of the first part PT1 protrudes from the second surface S2 along the width direction of the conductive member CL; and the third conductive sub-layer 103 of the second part PT2 is flush with the second surface S2 along the width direction of the conductive member CL. Of course, in other embodiments, the third conductive sub-layers 103 of the first part PT1 and of the second part PT2 may both protrude from the second surface S2 along the width direction of the conductive member CL; and the width of the third conductive sub-layer 103 of the first part PT1 protruding from the second surface S2 along the width direction of the conductive member CL is larger than the width of the third conductive sub-layer 103 of the second part PT2 protruding from the second surface S2 along the width direction of the conductive member CL.

For example, in the embodiment of the present disclosure, the conductive member having a structure in which the third conductive sub-layer protrudes from the second surface of the second conductive sub-layer in the width direction of the conductive member is not covered by the planarization layer. For example, as shown in FIG. 32, the first conductive part 61 disposed in the same layer as the conductive member CL is covered by the planarization layer, but the conductive member CL is not covered by the planarization layer.

At least one embodiment of the present disclosure provides a display device including any of the display panels described above.

For example, the display device can be a liquid crystal display, an electronic paper, an Organic Light-Emitting Diode (OLED) display and other display devices, as well as any products or components with display functions including these display devices, for example, televisions, digital cameras, mobile phones, watches, tablet computers, notebook computers and navigators.

For example, in an embodiment of the present disclosure, the conductive member may be part of a conductive structure or may be the entire conductive structure; and the conductive member may be a pattern formed by a continuous metal structure or may be a stacked structure of a plurality of metal conductive patterns.

It should be noted that, for the sake of clarity, the thicknesses of layers or areas are exaggerated in the drawings for describing the embodiments of the present disclosure. It can be understood that, when an element such as a layer, a film, an area or a substrate is referred to be located "above" or "below" another element, the element may be "directly" located "above" or "below" another element, or there may be intermediate elements.

In the embodiments of the present disclosure, the shapes of various elements are only schematically described and are not limited to those shown in the drawings, but can be determined as required.

The features in the same embodiment and different embodiments of the present disclosure can be combined with each other without conflict.

The above are merely specific embodiments of the present disclosure, and the scope of protection of the present disclosure are not limited thereto. Any modifications or substitutions that can be easily made by those skilled who are familiar with the prior art without departing from the technical scope revealed in the present disclosure belong to the scope of protection sought to be protected by the present disclosure. Therefore, the scope of protection of the present disclosure should be defined by the appended claims.

What is claimed is:

1. A display panel, comprising:
    a display area having a plurality of pixel units;
    a peripheral area located at at least one side of the display area;
    a barrier layer located on a base substrate;
    a conductive member arranged at one side of the barrier layer facing away from the base substrate; a length of the conductive member in an extending direction of the conductive member being larger than a width of the conductive member in a direction intersecting with the extending direction; the conductive member comprising a first conductive sub-layer, a second conductive sub-layer and a third conductive sub-layer stacked in sequence; the first conductive sub-layer being closer to the base substrate than the third conductive sub-layer; and
    a first conductive part, the first conductive part and the conductive member being arranged in a same layer and made of a same material,
    wherein a conductivity of the first conductive sub-layer is smaller than that of the second conductive sub-layer, a thickness of the first conductive sub-layer is smaller than that of the second conductive sub-layer, and a melting point of the third conductive sub-layer is larger than that of the second conductive sub-layer,
    wherein the second conductive sub-layer comprises a first surface close to the first conductive sub-layer and a second surface close to the third conductive sub-layer; the first surface and the second surface are arranged opposite to each other; the third conductive sub-layer protrudes from the second surface along a width direction of the conductive member; and the width direction intersects with the extending direction of the conductive member, and
    wherein the first conductive part is located in the display area, and the conductive member is located in the peripheral area and is electrically connected to the first conductive part.

2. The display panel according to claim 1, wherein the third conductive sub-layer is not in contact with the first conductive sub-layer.

3. The display panel according to claim 1, wherein the second conductive sub-layer further comprises a side surface connecting a side edge of the first surface and a side edge of the second surface located at a same side of the second conductive sub-layer; in a cross section taken along a direction perpendicular to the extending direction of the conductive member, an intersection point between the side surface and the first conductive sub-layer is a first intersection point, an intersection point between the side surface and the third conductive sub-layer is a second intersection point, and at least part of the side surface is located at one side of a connecting line between the first intersection point and the second intersection point close to the second conductive sub-layer.

4. The display panel according to claim 3, wherein the side surface comprises at least two side sub-surfaces, which comprise a first side sub-surface close to the first conductive sub-layer and a second side sub-surface close to the third conductive sub-layer, and an angle formed by the first side sub-surface and the first conductive sub-layer is smaller than an angle formed by the second side sub-surface and the first conductive sub-layer.

5. The display panel according to claim 4, wherein in the cross section taken along the direction perpendicular to the extending direction of the conductive member, a distance from, an intersection point between an extension line of the second side sub-surface and the first conductive sub-layer, to, an intersection point between the first side sub-surface and the first conductive sub-layer, is d1; and a distance of the first conductive sub-layer extending beyond the first surface is $\Delta w1$, wherein $d1 < \Delta w1$, and
    a distance of the third conductive sub-layer extending beyond the second surface is $\Delta w2$, wherein $d1 < \Delta w2$.

6. The display panel according to claim 3, wherein the side surface comprises three side sub-surfaces arranged in sequence, comprising a first side sub-surface, a second side sub-surface and a third side sub-surface; the first side sub-surface is closer to the first conductive sub-layer than the third side sub-surface; an angle formed by the first side sub-surface and the first conductive sub-layer is a first angle; an angle formed by the second side sub-surface and the first conductive sub-layer is a second angle; an angle formed by the third side sub-surface and the first conductive sub-layer is a third angle; the third angle is larger than the second angle, and the second angle is larger than the first angle, or, the second conductive sub-layer comprises two side surfaces, which are arranged opposite to each other and are symmetrically arranged along a thickness direction of the conductive member.

7. The display panel according to claim 3, wherein at least one of the first surface, the second surface and the side surface of the second conductive sub-layer contains at least one of N element, S element, P element and Cl element.

8. The display panel according to claim 1, wherein a width of the first surface is smaller than that of the first conductive sub-layer, a width of the second surface is smaller than that of the third conductive sub-layer, and a width difference between the third conductive sub-layer and the second surface is larger than a thickness of the third conductive sub-layer.

9. The display panel according to claim 1, wherein two adjacent conductive members are provided, the two adjacent conductive members are insulated from each other and located in a same layer; the two adjacent conductive members comprise a first conductive member and a second conductive member; and a distance between the third conductive sub-layer of the first conductive member and the third conductive sub-layer of the second conductive member is smaller than a distance between the second surface of the second conductive sub-layer of the first conductive member and the second surface of the second conductive sub-layer of the second conductive member.

10. The display panel according to claim 9, wherein the second surface of the first conductive member and the second surface of the second conductive member have different distances at different positions.

11. The display panel according to claim 9, wherein w1 is a maximum width of the first conductive member in a cross section thereof along a width direction thereof, w2 is a maximum width of the second conductive member in a cross section thereof along a width direction thereof, $\Delta w11$ is a distance of the third conductive sub-layer extending beyond the second surface in the first conductive member, $\Delta w12$ is a distance of the third conductive sub-layer extending beyond the second surface in the second conductive member, dmin is a minimum distance between the first conductive member and the second conductive member; and a relational expression as below is satisfied:

$$\frac{\Delta w11}{w1} + \frac{\Delta w12}{w2} < \frac{\Delta w11 + \Delta w12}{d\min}.$$

12. The display panel according to claim 1, wherein two conductive members are provided, the two conductive members are insulated from each other and have different distances from the base substrate; the two conductive members comprise a first conductive member with a thickness of T3 and a second conductive member with a thickness of T4, wherein T4 is larger than T3; a distance of the third conductive sub-layer extending beyond the second surface in the first conductive member is $\Delta w3$, a distance of the third conductive sub-layer extending beyond the second surface in the second conductive member is $\Delta w4$; and a relational expression as below is satisfied:

$$\frac{\Delta w3}{T3} > \frac{\Delta w4}{T4}.$$

13. The display panel according to claim 1, wherein two conductive members are provided and are insulated from each other; the two conductive members comprise a first conductive member and a second conductive member, the first conductive member is closer to the display area than the second conductive member, and the third conductive sub-layer in the first conductive member protrudes from the second surface by a size larger than that of the third conductive sub-layer in the second conductive member.

14. The display panel according to claim 1, further comprising a second conductive part, wherein the second conductive part and the conductive member are arranged in different layers, the conductive member has a first end, the second conductive part has a second end, an insulating layer is arranged between the first end and the second end, the insulating layer has a first via hole exposing the first end or the second end, and the conductive member is connected with the second conductive part through the first via hole.

15. The display panel according to claim 1, further comprising a second conductive part, wherein the second conductive part and the conductive member are located in a same layer.

16. The display panel according to claim 1, further comprising a third conductive part, wherein the first conductive part is electrically connected to the third conductive part, the third conductive part has a third end, the first conductive part has a fourth end, an insulating layer is arranged between the third end and the fourth end, the insulating layer has a second via hole exposing the third end or the fourth end, and the first conductive part is connected with the third conductive part through the second via hole.

17. The display panel according to claim 1, wherein the conductive member comprises a first part and a second part, a width of the first part is larger than that of the second part, the third conductive sub-layer of the first part protrudes from the second surface along a width direction of the conductive member, the third conductive sub-layer of the second part is flush with the second surface along the width direction of the conductive member, or the third conductive sub-layers of the first part and of the second part both protrude from the second surface along the width direction of the conductive member, and a protruded portion of the first part has a width larger than that of the second part.

18. The display panel according to claim 1, wherein the conductive member is electrically connected with the first conductive part, a plurality of first conductive parts is provided, a first interval is provided between adjacent conductive members and a second interval is provided between adjacent first conductive parts, the first interval is different from the second interval.

19. A display panel, comprising:
a display area having a plurality of pixel units, comprising a foldable area as well as a first display area and a second display area located at opposite sides of the foldable area;
a peripheral area located at at least one side of the display area;
a barrier layer located on a base substrate;
a conductive member arranged at one side of the barrier layer facing away from the base substrate, a length of the conductive member in an extending direction of the conductive member being larger than a width of the conductive member in a direction intersecting with the extending direction; the conductive member comprising a first conductive sub-layer, a second conductive sub-layer and a third conductive sub-layer stacked in sequence; the first conductive sub-layer being closer to the base substrate than the third conductive sub-layer; and a first conductive part, the first conductive part and the conductive member being arranged in a same layer and made of a same material, wherein a conductivity of the first conductive sub-layer is smaller than that of the second conductive sub-layer, a thickness of the first conductive sub-layer is smaller than that of the second conductive sub-layer, and a melting point of the third conductive sub-layer is larger than that of the second conductive sub-layer, wherein the second conductive sub-layer comprises a first surface close to the first conductive sub-layer and a second surface close to the third conductive sub-layer, the first surface and the second surface are arranged opposite to each other, the third conductive sub-layer protrudes from the second surface along a width direction of the conductive member, and the width direction intersects with the extending direction of the conductive member, and wherein the first conductive part is located in the display area, and the conductive member is located in the peripheral area and is electrically connected to the first conductive part.

20. A display panel, comprising:

a display area having a plurality of pixel units;

a peripheral area located at at least one side of the display area;

a transparent area, located at one side of the peripheral area away from the display area or surrounded by the display area;

a barrier layer located on a base substrate;

a conductive member arranged at one side of the barrier layer facing away from the base substrate, the length of the conductive member in its extending direction is larger than the width of the conductive member in the direction intersecting with the extending direction, and the conductive member includes a first conductive sub-layer, a second conductive sub-layer and a third conductive sub-layer stacked in sequence, wherein the first conductive sub-layer is closer to the base substrate than the third conductive sub-layer; and a first conductive part, the first conductive part and the conductive member being arranged in a same layer and made of a same material, wherein a conductivity of the first conductive sub-layer is smaller than that of the second conductive sub-layer, a thickness of the first conductive sub-layer is smaller than that of the second conductive sub-layer, and a melting point of the third conductive sub-layer is larger than that of the second conductive sub-layer, wherein the second conductive sub-layer comprises a first surface close to the first conductive sub-layer and a second surface close to the third conductive sub-layer; the first surface and the second surface are arranged opposite to each other; the third conductive sub-layer protrudes from the second surface along a width direction of the conductive member; and the width direction intersects with the extending direction of the conductive member, and wherein the first conductive part is located in the display area, and the conductive member is located in the peripheral area and is electrically connected to the first conductive part.

* * * * *